US009863605B2

(12) United States Patent
Haitz et al.

(10) Patent No.: US 9,863,605 B2
(45) Date of Patent: Jan. 9, 2018

(54) LIGHT-EMITTING DEVICES PROVIDING ASYMMETRICAL PROPAGATION OF LIGHT

(71) Applicant: Quarkstar LLC, Las Vegas, NV (US)

(72) Inventors: Roland H. Haitz, Portola Valley, CA (US); George E. Smith, Sunnyvale, CA (US); Robert C. Gardner, Atherton, CA (US); Louis Lerman, Las Vegas, NV (US)

(73) Assignee: Quarkstar LLC, Las Vegas, NV (US)

( * ) Notice: Subject to any disclaimer, the term of this patent is extended or adjusted under 35 U.S.C. 154(b) by 511 days.

(21) Appl. No.: 14/360,046

(22) PCT Filed: Nov. 23, 2012

(86) PCT No.: PCT/US2012/066463
§ 371 (c)(1),
(2) Date: May 22, 2014

(87) PCT Pub. No.: WO2013/078463
PCT Pub. Date: May 30, 2013

(65) Prior Publication Data
US 2015/0003059 A1      Jan. 1, 2015

Related U.S. Application Data

(60) Provisional application No. 61/563,513, filed on Nov. 23, 2011, provisional application No. 61/595,663,
(Continued)

(51) Int. Cl.
*F21V 3/02*      (2006.01)
*F21V 13/02*     (2006.01)
(Continued)

(52) U.S. Cl.
CPC ............... *F21V 13/02* (2013.01); *F21K 9/60* (2016.08); *G02B 5/0236* (2013.01);
(Continued)

(58) Field of Classification Search
CPC ......... F21K 9/60; F21V 13/02; G02B 5/0236; G02B 5/0278; G02B 19/0028;
(Continued)

(56) References Cited

U.S. PATENT DOCUMENTS 3,960,579 A    6/1976   Broemer
4,038,448 A    7/1977   Boyd
(Continued)

FOREIGN PATENT DOCUMENTS

CN    101099245    1/2008
CN    101101910    1/2008
(Continued)

OTHER PUBLICATIONS

International Application No. PCT/US2015/062749, Notification of Transmittal of the International Search Report and the Written Opinion of the International Searching Authority, mailed Feb. 19, 2016, 12 pages.
(Continued)

Primary Examiner — Stephen F Husar
(74) Attorney, Agent, or Firm — Fish & Richardson P.C.

(57) ABSTRACT

A variety of light-emitting devices for general illumination utilizing solid state light sources (e.g., light emitting diodes) are disclosed. In general, the devices include a scattering element in combination with an extractor element. The scattering element, which may include elastic and/or inelastic scattering centers, is spaced apart from the light source element. Opposite sides of the scattering element have asymmetric optical interfaces, there being a larger refractive index mismatch at the interface facing the light emitting
(Continued)

element than the interface between the scattering element and the extractor element. Such a structure favors forward scattering of light from the scattering element. In other words, the system favors scattering out of the scattering element into the extractor element over backscattering light towards the light source element. The extractor element, in turn, is sized and shaped to reduce reflection of light exiting the light-emitting device at the devices interface with the ambient environment.

25 Claims, 44 Drawing Sheets

Related U.S. Application Data filed on Feb. 6, 2012, provisional application No. 61/639,683, filed on Apr. 27, 2012, provisional application No. 61/700,724, filed on Sep. 13, 2012.

(51) Int. Cl.
G02B 19/00 (2006.01)
G02B 5/02 (2006.01)
F21K 9/60 (2016.01)
H01L 33/58 (2010.01)

(52) U.S. Cl.
CPC ....... *G02B 5/0278* (2013.01); *G02B 19/0028* (2013.01); *G02B 19/0061* (2013.01); *G02B 19/0066* (2013.01); *H01L 33/58* (2013.01); *H01L 2933/0091* (2013.01)

(58) Field of Classification Search
CPC . G02B 19/0061; G02B 19/0066; H01L 33/58; H01L 2933/0091
See application file for complete search history.

(56) References Cited

U.S. PATENT DOCUMENTS

| | | | |
|---|---|---|---|
| 4,240,692 A | 12/1980 | Winston | |
| 4,301,461 A | 11/1981 | Asano | |
| 4,374,749 A | 2/1983 | Cusano | |
| 4,389,118 A | 6/1983 | Yuasa | |
| 4,797,609 A | 1/1989 | Yang | |
| 4,907,044 A | 3/1990 | Schellhorn | |
| 5,001,609 A | 3/1991 | Gardner | |
| 5,055,892 A | 10/1991 | Gardner | |
| 5,268,635 A | 12/1993 | Bortolini | |
| 5,282,088 A | 1/1994 | Davidson | |
| 5,335,152 A | 8/1994 | Winston | |
| 5,424,855 A | 6/1995 | Nakamura | |
| 5,727,108 A | 3/1998 | Hed | |
| 5,856,727 A | 1/1999 | Schroeder | |
| 6,066,861 A | 5/2000 | Hohn et al. | |
| 6,095,655 A | 8/2000 | Bigliati | |
| 6,111,367 A | 8/2000 | Asano | |
| 6,155,699 A | 12/2000 | Miller | |
| 6,236,331 B1 | 5/2001 | Dussureault | |
| 6,479,942 B2 | 11/2002 | Kimura | |
| 6,495,964 B1 | 12/2002 | Muthu | |
| 6,527,411 B1 | 3/2003 | Sayers | |
| 6,617,560 B2 | 9/2003 | Forke | |
| 6,642,618 B2 | 11/2003 | Yagi | |
| 6,819,505 B1 | 11/2004 | Cassarly | |
| 7,015,514 B2 | 3/2006 | Baur | |
| 7,091,653 B2 | 8/2006 | Ouderkirk | |
| 7,151,283 B2 | 12/2006 | Reeh | |
| 7,286,296 B2 | 10/2007 | Chaves | |
| 7,306,960 B2 | 12/2007 | Bogner | |
| 7,329,907 B2 | 2/2008 | Pang | |
| 7,329,998 B2 | 2/2008 | Jungwirth | |
| 7,344,902 B2 | 3/2008 | Basin | |
| 7,355,284 B2 | 4/2008 | Negley | |
| 7,514,867 B2 | 4/2009 | Yano | |
| 7,522,802 B2 | 4/2009 | Shiau | |
| 7,828,453 B2 | 11/2010 | Tran | |
| 7,859,190 B2 | 12/2010 | Shi | |
| 7,889,421 B2 | 2/2011 | Narendran | |
| 8,007,118 B2 | 8/2011 | O Neill | |
| 8,083,364 B2 | 12/2011 | Allen | |
| 8,168,998 B2 | 5/2012 | David | |
| 8,314,537 B2 | 11/2012 | Gielen | |
| 8,362,695 B2 | 1/2013 | Aanegola | |
| 8,436,380 B2 | 5/2013 | Aanegola | |
| 9,683,710 B2 * | 6/2017 | Schinagl | ............... F21K 9/64 |
| 2003/0117087 A1 | 6/2003 | Barth | |
| 2003/0235050 A1 | 12/2003 | West | |
| 2004/0051111 A1 | 3/2004 | Ota et al. | |
| 2004/0052076 A1 | 3/2004 | Mueller | |
| 2004/0120155 A1 | 6/2004 | Suenaga | |
| 2004/0150991 A1 | 8/2004 | Ouderkirk | |
| 2004/0223315 A1 | 11/2004 | Suehiro et al. | |
| 2005/0023545 A1 | 2/2005 | Camras | |
| 2005/0075234 A1 | 4/2005 | Wolff | |
| 2005/0127833 A1 | 6/2005 | Tieszen | |
| 2005/0185416 A1 | 8/2005 | Lee | |
| 2005/0243570 A1 | 11/2005 | Chaves | |
| 2005/0269582 A1 | 12/2005 | Mueller | |
| 2006/0097245 A1 | 5/2006 | Aanegola et al. | |
| 2006/0126343 A1 | 6/2006 | Hsieh et al. | |
| 2006/0152140 A1 | 7/2006 | Brandes | |
| 2006/0152931 A1 | 7/2006 | Holman | |
| 2006/0255353 A1 | 11/2006 | Taskar | |
| 2007/0018102 A1 | 1/2007 | Braune et al. | |
| 2007/0170447 A1 | 7/2007 | Negley et al. | |
| 2007/0256453 A1 | 11/2007 | Barnes | |
| 2007/0257267 A1 | 11/2007 | Leatherdale | |
| 2007/0273282 A1 | 11/2007 | Radkov et al. | |
| 2008/0054280 A1 | 3/2008 | Reginelli | |
| 2008/0079910 A1 | 4/2008 | Rutherford | |
| 2008/0080166 A1 | 4/2008 | Duong | |
| 2008/0101754 A1 | 5/2008 | Parker | |
| 2008/0112183 A1 | 5/2008 | Negley | |
| 2008/0297027 A1 | 12/2008 | Miller | |
| 2009/0008662 A1 | 1/2009 | Ashdown et al. | |
| 2009/0050919 A1 | 2/2009 | Weijers | |
| 2009/0200939 A1 | 8/2009 | Lenk | |
| 2009/0201677 A1 | 8/2009 | Hoelen | |
| 2009/0272996 A1 | 11/2009 | Chakraborty | |
| 2009/0296407 A1 | 12/2009 | Bailey | |
| 2009/0310352 A1 | 12/2009 | Chang | |
| 2010/0066236 A1 | 3/2010 | Xu | |
| 2010/0073927 A1 | 3/2010 | Lewin | |
| 2010/0097821 A1 | 4/2010 | Huang | |
| 2010/0123386 A1 | 5/2010 | Chen | |
| 2010/0134016 A1 | 6/2010 | York | |
| 2010/0148151 A1 | 6/2010 | Camras | |
| 2010/0172120 A1 | 7/2010 | Wegh | |
| 2010/0232134 A1 | 9/2010 | Tran | |
| 2010/0263723 A1 | 10/2010 | Allen | |
| 2010/0264432 A1 | 10/2010 | Liu | |
| 2010/0290226 A1 | 11/2010 | Harbers | |
| 2010/0301367 A1 | 12/2010 | Nakamura | |
| 2010/0301727 A1 | 12/2010 | Lenk et al. | |
| 2010/0308354 A1 | 12/2010 | David | |
| 2010/0308356 A1 | 12/2010 | Wirth | |
| 2011/0080108 A1 | 4/2011 | Chiang | |
| 2011/0089817 A1 | 4/2011 | Lyons | |
| 2011/0176091 A1 | 7/2011 | Boonekamp | |
| 2011/0182065 A1 | 7/2011 | Negley | |
| 2011/0227037 A1 | 9/2011 | Su | |
| 2011/0267800 A1 | 11/2011 | Tong | |
| 2011/0267801 A1 | 11/2011 | Tong | |
| 2011/0273882 A1 | 11/2011 | Pickard | |
| 2011/0291130 A1 | 12/2011 | Diana | |
| 2011/0298371 A1 | 12/2011 | Brandes | |
| 2012/0033403 A1 | 2/2012 | Lamvik | |
| 2012/0039073 A1 | 2/2012 | Tong | |
| 2012/0068205 A1 | 3/2012 | Galvez | |
| 2012/0112219 A1 | 5/2012 | Jang et al. | |
| 2012/0112661 A1 | 5/2012 | van de Ven et al. | |

(56) References Cited

U.S. PATENT DOCUMENTS

| | | | |
|---|---|---|---|
| 2012/0119221 | A1 | 5/2012 | Negley |
| 2012/0127694 | A1 | 5/2012 | Richardson |
| 2012/0140436 | A1 | 6/2012 | Yang |
| 2012/0147296 | A1 | 6/2012 | Montgomery |
| 2012/0181565 | A1 | 7/2012 | David |
| 2012/0187441 | A1 | 7/2012 | Li |
| 2012/0287602 | A1 | 11/2012 | Urano |
| 2012/0327656 | A1 | 12/2012 | Ramer |
| 2013/0021776 | A1 | 1/2013 | Veerasamy |
| 2013/0201715 | A1 | 8/2013 | Dau |
| 2015/0241029 | A1* | 8/2015 | York ............ F21V 7/0033 362/297 |

FOREIGN PATENT DOCUMENTS

| | | |
|---|---|---|
| CN | 101675288 | 3/2010 |
| EP | PCT/IB2011/052874 | 6/2011 |
| EP | 2293354 A4 | 1/2015 |
| JP | 2006352030 A1 | 12/2006 |
| JP | 2007049019 A1 | 2/2007 |
| JP | 2007158009 A | 6/2007 |
| JP | 2009177095 A1 | 8/2009 |
| WO | WO0107828 A1 | 2/2001 |
| WO | WO0127962 A3 | 1/2002 |
| WO | WO03017729 A1 | 2/2003 |
| WO | WO2004076916 A1 | 9/2004 |
| WO | 2007037662 A1 | 4/2007 |
| WO | WO2007081812 A3 | 4/2009 |
| WO | 2011112914 A1 | 9/2011 |
| WO | WO2013078463 A1 | 5/2013 |

OTHER PUBLICATIONS

Authorized Officer Blaine R. Copenheaver, Notification of Transmittal of the International Search Report and Written Opinion, International Application No. PCT/US2014/021778, mailed Jun. 23, 2014, 11 pages.
Allen, et al. "A nearly ideal phosphor-converted white light-emitting diode", Applied Physics Letters, vol. 92 (2008) 3 pages.
Allen, et al. "ELiXIR—Solid-State Luminaire With Enhanced Light Extraction by Internal Reflection", Journal of Display Technology, vol. 3, No. 2, Jun. 2007 pp. 155-159.
Allen, et al., "Highly Efficient light-emitting composite material for solid-state illumination devices, lasers, and luminescent collectors", U.S. Appl. No. 60/961,185, filed Jul. 19, 2007, 38 pages.
Carclo Technical Plastics "Luxeon®I 20 & 26.5mm Range", downloaded from the internet at: http://docs-europe.electrocomponents.com/webdocs/0dcb/0900766b80dcbbeb.pdf on Oct. 30, 2012, 31 pages.
Intematix, "Design Considerations for ChromaLit™ Ellipse, Candle, and Dome Remote Phosphor Light Sources", Jan. 11, 2012, downloaded from the internet at: http://www.intematix.com/uploads/files/imx-design-considerations-ecd-app-note.pdf , on Oct. 30, 2012, 23 pages.
Intematix, "Mixing Chamber Design Considerations for ChromaLit™ Remote Phosphor Light Sources", Aug. 29, 2012, downloaded from the internet at: http://www.intematix.com/uploads/files/intematix_mixing_chamber_design_for_chromalit.pdf on Oct. 30, 2012, 12 pages.
International Bureau of WIPO, International Preliminary Report on Patentability, PCT/US2008/070621, Jan. 19, 2010, 6 pages.
International Searching Authority, The International Search Report and Written Opinion of the International Searching Authority, PCT/US2008/070621, Sep. 26, 2008, 9 pages.
International Searching Authority, The International Search Report and Written Opinion of the International Searching Authority, PCT/US2012/66463, Apr. 2, 2013, 18 pages.
Liu, et al. "Effects of Phosphor's Location on LED Packaging Performance", 2008 International Conference on Electronic Packaging Technology & High Density Packaging (ICEPT-HDP 2008), 7 pages.
Liu, et al. "Effects of Phosphor's Thickness and Concentration on Performance of White LEDs", 2008 International Conference on Electronic Packaging Technology & High Density Packaging (ICEPT-HDP 2008), 6 pages.
Mims III, Forrest, "Sun Photometer with Light-Emitting Diodes as Spectrally Selective Detectors", Applied Optics 31, 6965-6967, 1992.
Carr et al., "One-Watt GaAs p-n Junction Infrared Source", Applied Physics Letters, vol. 3, No. 10, Nov. 15, 1963, pp. 173-175.
W. N. Carr, "Photometric Figures of Merit for Semiconductor Luminescent Sources Operating in Spontaneous Mode", Infrared Physics, 1966, vol. 6, pp. 1-19.
Authorized Officer Blaine R. Copenheaver, Notification of Transmittal of the International Search Report and Written Opinion, International Application No. PCT/US2013/059511, mailed Feb. 14, 2014, 7 pages.
Authorized Officer Blaine R. Copenheaver, Notification of Transmittal of the International Search Report and Written Opinion, International Application No. PCT/US2013/059545, mailed Feb. 14, 2014, 15 pages.
Authorized Officer Blaine R. Copenheaver, Notification of Transmittal of the International Search Report and Written Opinion, International Application No. PCT/US2013/059544, mailed Feb. 14, 2014, 9 pages.
Authorized Officer Blaine R. Copenheaver, Notification of Transmittal of the International Search Report and Written Opinion, International Application No. PCT/US2013/059525, mailed Feb. 19, 2014, 9 pages.
Japanese Application No. 2014-543597, Decision of Rejection, dated Apr. 24, 2017, 130 pages.

* cited by examiner

LIGHT-EMITTING DEVICES PROVIDING ASYMMETRICAL PROPAGATION OF LIGHT

CROSS-REFERENCE TO RELATED APPLICATIONS

This application is a U.S. National Stage of PCT/US2012/066463 filed on Nov. 23, 2012, which claims benefit of the following provisional applications: Provisional Application No. 61/563,513, filed on Nov. 23, 2011; Provisional Application No. 61/595,663, filed on Feb. 6, 2012; Provisional Application No. 61/639,683, filed on Apr. 27, 2012; and Provisional Application No. 61/700,724, filed on Sep. 13, 2012. The entire contents of each of these priority applications are hereby incorporated by reference.

BACKGROUND

The present technology relates generally to light-emitting devices and, in particular, to light-emitting devices that feature a solid state light-emitting element and a scattering element and an extractor element remote from a light-emitting element.

Light-emitting elements are ubiquitous in the modern world, being used in applications ranging from general illumination (e.g., light bulbs) to lighting electronic information displays (e.g., backlights and front-lights for LCDs) to medical devices and therapeutics. Solid state light emitting devices, which include light emitting diodes (LEDs), are increasingly being adopted in a variety of fields, promising low power consumption, high luminous efficacy and longevity, particularly in comparison to incandescent and other conventional light sources.

One example of a SSL device increasingly being used for in luminaires is a so-called "white LED." Conventional white LEDs typically include an LED that emits blue or ultraviolet light and a phosphor or other luminescent material. The device generates white light via down-conversion of blue or UV light from the LED (referred to as "pump light") by the phosphor. Such devices are also referred to as phosphor-based LEDs (PLEDs). Although subject to losses due to light-conversion, various aspects of PLEDs promise reduced complexity, better cost efficiency and durability of PLED-based luminaires in comparison to other types of luminaires.

While new types of phosphors are being actively investigated and developed, configuration of PLED-based light-emitting devices, however, provides further challenges due to the properties of available luminescent materials. Challenges include light-energy losses from photon conversion, phosphor self-heating from Stokes loss, dependence of photon conversion properties on operating temperature, degradation due to permanent changes of the chemical and physical composition of phosphors in effect of overheating or other damage, dependence of the conversion properties on intensity of light, propagation of light in undesired directions in effect of the random emission of converted light that is emitted from the phosphor, undesired chemical properties of phosphors, and controlled deposition of phosphors in light-emitting devices, for example.

SUMMARY

A variety of light-emitting devices for general illumination utilizing solid state light sources (e.g., light emitting diodes) are disclosed. In general, the devices include a scattering element in combination with an extractor element. The scattering element, which may include elastic and/or inelastic scattering centers, is spaced apart from the light source element. Opposite sides of the scattering element have asymmetric optical interfaces, there being a larger refractive index mismatch at the interface facing the light emitting element than the interface between the scattering element and the extractor element. It is believed that such a structure favors forward scattering of light from the scattering element. In other words, the system favors scattering out of the scattering element into the extractor element over backscattering light towards the light source element. Such a configuration is referred to herein as an Asymmetric Scattering Light Valve ("ASLV"). The extractor element, in turn, is sized and shaped to reduce reflection of light exiting the light-emitting device at the devices interface with the ambient environment. Accordingly, the light-emitting devices may deliver light in a highly efficient, highly homogenized manner.

It is known that light from a point source propagating radially outward will be normally incident on a spherical surface centered on the point source. Where the transmission and reflection of the light at the surface is governed by Snell's law, reflection of light at the surface is a function of the refractive indexes of the media at the surface and is generally minimized because of the normal incident angle. Accordingly, one can apply this principle to the design of a light bulb that includes an extractor element having a spherical exit surface by making the light source within the extractor element sufficiently small and/or making the extractor element sufficiently large so that the light source approximates a point source relative to the exit surface. As a practical matter, however, a source element and a scattering element have a finite size. Moreover, increasing the size of an extractor element relative to a scattering element of fixed size can increase the weight, volume, and/or material cost of a light emitting device. Accordingly, for light-emitting devices that feature a scattering element and an extractor element, there exists a tradeoff between optimizing extraction efficiency from the extractor element with the device's size and/or cost.

The inventors have recognized that there exists a range of relative sizes of the extractor element and scattering element for which high extraction efficiency is achieved with a relatively small extractor element relative to the scattering element. For example, the extractor element and scattering element can be sized relatively so that no light from the scattering optic that directly impinges on the exit surface of the extractor element experiences total internal reflection at the exit surface. For example, the exit surface of the extractor element can be shaped as a spherical dome or shell with a radius $R_1$ in which the scattering element is contained within an area defined by a respective notional sphere that is concentric with the exit surface and has a radius $R_{OW}=R_1/n$, where n is the refractive index of the extractor element. Such a configuration may be referred to as Weierstrass geometry or Weierstrass configuration. In certain embodiments, all or part of the interface between the scattering element and the extractor element can correspond to the notional surface at $R_W$. It is believed that such configurations may provide the benefits of the Weierstrass geometry while reducing (e.g., minimizing) the volume of the extractor element. However, while the Weierstrass geometry avoids TIR, light incident on the exit surface will still experience Fresnel reflections, reducing transmission at the exit surface from 100%.

In certain embodiments, the exit surface is shaped such that an angle of incidence on the exit surface of the scattered light that directly impinges on the exit surface is less than the Brewster angle. The Brewster angle (also known as the polarization angle) is an angle of incidence at which light with a particular polarization is perfectly transmitted through a transparent dielectric surface, with no reflection. It is believed that such extractor elements not only reduce polarization effects that may be associated with some extractor elements, but also avoid certain polarization-dependent losses that may be associated with, for example, a Weierstrass configuration. For a spherical exit surface, the Brewster condition may be satisfied for light from a scattering element that lies within a corresponding notional spherical or cylindrical surface, referred to as the Brewster radius, $R_{OB}$. It is believed that sizing the extractor element and scattering element so that the scattering element lies entirely within a notional surface of 1.1 $R_{OB}$ or less (e.g., in a range from 0.5 $R_{OB}$ to 1.1 $R_{OB}$) can provide a reasonable tradeoff between cost/mass and performance.

The light-emitting devices include a recovery enclosure for recycling backscattered light from the scattering element. A variety of forms of recovery enclosures are possible. In some embodiments, the recovery enclosure includes a reflective surface, such as a mirror. This surface can be planar or non-planar. Examples of non-planar reflective surfaces include conical reflectors and parabolic reflectors. In certain embodiments, the recovery enclosure corresponds to an enclosure substantially surrounded by a shell-like scattering element. Such embodiments may recycle backscattered light with high efficiency because a large fraction, e.g., most, backscattered photons re-enter the scattering element without reflecting from an intermediate surface, which can cause further losses.

Generally, the light emitting devices can include a single light-emitting element (e.g., a single LED) or multiple light-emitting elements. Embodiments that feature multiple light-emitting elements can include elements with the same or different chromaticity. For example, embodiments can feature multiple similar light-emitting elements to provide a more powerful and/or larger light-emitting device. In some embodiments, the light-emitting device can include light-emitting elements having different chromaticity. Emission intensity from the different light-emitting elements can be varied in order to vary the chromaticity of the light-emitting device. For example, the white point of a white light-emitting device can be varied by increasing or decreasing the contribution from one light-emitting element relative to another.

The inventors have also recognized that it is possible to tailor the light emission profile of a light-emitted device by appropriate configuration of the scattering element and/or extractor element. Accordingly, embodiments are disclosed that provide for enhanced emission in certain directions and reduced emission in others. Conversely, in certain embodiments, the shape of the scattering element and/or extractor element are chosen to provide substantially isotropic emission into a range of solid angles.

In some embodiments, the exit surface and optical interface between the scattering element and extractor element have the same shape. For example, the exit surface and the optical interface can both be spherical (e.g., concentric spheres of different radius). Alternatively, the exit surface and the optical interface can have different shapes. For example, the exit surface is spherical and the optical interface is ellipsoidal and is entirely contained in a notional Brewster sphere. In general, the shapes of these surfaces can be chosen to provide tailored intensity distributions.

In some embodiments, the extractor element can be shaped to introduce anisotropy into the emitted light distribution. For example, the extractor element can include more than one exit surface facets, arranged so that the extractor element has a square or rectangular footprint. Such extractors may be advantageous for illumination of square or rectangular spaces as their light emission patterns will more closely match the space than isotropic emission.

In some embodiments, the light emitting devices can include a compound extractor element. Such extractor elements can provide multimodal light distribution, directing light into multiple discrete solid angle ranges. Such extractor elements can be used for light emitting devices that have more than one function (e.g., a ceiling light that provides downlight and directs light towards the ceiling, or a wall light that provides light into a room and along with wall-lighting).

An issue with certain solid state light-emitting devices is that their properties change over their lifetime. For example, the white point of a white LED can vary as the device ages. Accordingly, in some embodiments, light emitting devices can include intra-device feedback that enables a device to self-compensate for aging effects. For example, in certain embodiments, light emitting devices include a sensor housed within the device that monitors the intensity of light generated by the device. The device can include feedback electronics (e.g., within the base of the device) that modify the potential applied to the light emitting element(s) in response to variations in the detected intensity.

In general, the light emitting devices can be provided in a variety of form factors. In some embodiments, light emitting devices can be provided in the form of standard light bulbs, such as the shape of A-type light bulbs or fluorescent tubes.

Various aspects of the invention are summarized below.

In general, one innovative aspect of the subject matter described in this specification can be embodied in a light-emitting device that includes multiple light-emitting elements including a first light-emitting element configured to provide light that has a first spectral power distribution during operation, and a second light-emitting element configured to provide light that has a second spectral power distribution different from the first spectral power distribution during operation; a first optical element that has a first surface spaced apart from the first and second light-emitting elements and is positioned to receive light from the first and second light-emitting elements, where the first optical element includes elastic scattering centers arranged to substantially isotropically scatter the light from the first and second light-emitting elements and provide mixed light including light from the first and second light-emitting elements that has a mixed spectral power distribution; and a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the mixed light through the optical interface; where: the device includes a medium adjacent the first surface of the first optical element that has a refractive index $n_0$, and the first optical element includes a material that has a first refractive index $n_1$, where $n_0<n_1$; the transparent material has a refractive index $n_2$, where $n_0<n_2$; the exit surface is a transparent surface that is shaped such that an angle of incidence on the exit surface of the mixed light provided by the first optical element that directly impinges on the exit surface is less than the critical angle for total internal reflection; and the light-emitting device outputs mixed light through the exit surface.

The foregoing and other embodiments can each optionally include one or more of the following features, alone or in combination. In some implementations, the light-emitting device can further include a third light-emitting element configured to provide light that has a third spectral power distribution different from the first and second chromaticities during operation; and a fourth light-emitting element configured to provide light that has a fourth spectral power distribution different from the first, second, and third chromaticities during operation; where: the elastic scattering centers further isotropically scatter the light from the third and fourth light-emitting elements; and the mixed light further includes the scattered light from the third and fourth light-emitting elements. In some implementations, a first chromaticity defined by the first spectral power distribution can be different from a second chromaticity defined by the second spectral power distribution.

In some implementations, the first optical element can be a shell that defines an enclosure into which light from the light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material that can be positioned between the light-emitting elements and the first surface to receive light from the light-emitting elements and provide light to the first surface. The third element can be separated from the first surface by a gap.

In some implementations, the light-emitting device can further include a sensor arranged to receive a fraction of the portion of the mixed light prior to being output through the exit surface, where the sensor can be configured to provide a sensor signal based on the fraction of the portion of the mixed light; and a control circuit in communication with the sensor that can be configured to control power provided to the first and second light-emitting elements in response to the sensor signal. The sensor signal can be configured to indicate estimates of one or more of intensity and spectral density distribution of the fraction of the portion of the mixed light. The control circuit can control amounts of power provided to each of the light-emitting elements to reduce variations in the light emitted by the light-emitting device as the light-emitting device ages. The control circuit can control amounts of power provided to the light-emitting elements to reduce variations in the light emitted by the light-emitting device as the light-emitting device changes operating temperature. The control circuit can adjust amounts of power provided to the light-emitting elements to control variations in the light emitted by the light-emitting device based on an input signal provided by a user during operation of the light-emitting device.

In some implementations, the second optical element can include a first portion and a light guide, where the first portion can have the exit surface and can be arranged to receive a first portion of the mixed light from the optical interface, and the light guide can be arranged to receive a second portion of the mixed light from the optical interface and can have a guiding surface configured to guide the received second portion of the mixed light away from the optical interface by reflecting at least some of the received second portion of the mixed light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the mixed light that directly impinges on the exit surface is less than the Brewster angle.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p) = R(p) * (1 - k/n_2)$$

The value k can be a positive real number such that $k < n_2$. In some implementations, $k/n_2$ can be less than 0.8. In some implementations, k can be less than 1. In some implementations, the value k can be:

$$k < \frac{n_2}{\sqrt{(1+n_2^2)}}$$

In some implementations, each point on the optical interface can be the distance d(p) from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface can be a spherical or cylindrical surface.

In some implementations, the medium can be a gas. The gas can be air. In some implementations, the light-emitting elements can include a light-emitting diode. In some implementations, the first optical element can include the elastic scattering centers dispersed within the material that have a refractive index $n_1$. In some implementations, the transparent material can be a plastic or a glass.

In general, another innovative aspect of the subject matter described in this specification can be embodied in a light-emitting device that includes multiple light-emitting elements including a first light-emitting element configured to provide light that has a first spectral power distribution during operation, and a second light-emitting element configured to provide light that has a second spectral power distribution different from the first spectral power distribution during operation; a first optical element that has a first surface spaced apart from the first and second light-emitting elements and positioned to receive light from the first and second light-emitting elements, where the first optical element includes inelastic scattering centers arranged to convert the light from the first light-emitting element into converted light that is substantially isotropically scattered, and elastic scattering centers arranged to substantially isotropically scatter the light from the second light-emitting element, and provide mixed light that includes the scattered light from the second light-emitting element and the converted light, where the mixed light has a mixed spectral power distribution; and a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the mixed light through the optical interface; where: the device includes a medium adjacent the first surface of the first optical element that has a refractive index $n_0$, and the first optical element includes a material that has a first refractive index $n_1$, where $n_0 < n_1$; the transparent material has a refractive index, $n_2$, where $n_0 < n_2$; the exit surface is a transparent surface that is shaped such that an angle of incidence on the exit surface of the mixed light provided by the first optical element that directly impinges on the exit surface is less than the critical angle for total internal reflection; and the light-emitting device outputs a predetermined portion of the mixed light through the exit surface.

The foregoing and other embodiments can each optionally include one or more of the following features, alone or in combination. In some implementations, the first optical element can be a shell that defines an enclosure into which light from the light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material positioned between the light-emitting elements and the first surface to receive light from the light-emitting elements and provide light to the first surface. The third element can be separated from the first surface by a gap.

In some implementations, the light-emitting device can further include a sensor arranged to receive a fraction of the portion of the mixed light prior to being output through the exit surface, where the sensor can be configured to provide a sensor signal based on the fraction of the portion of the mixed light; and a control circuit in communication with the sensor that can be configured to control power provided to the light-emitting elements in response to the sensor signal. The sensor signal can be configured to indicate estimates of one or more of intensity and spectral density distribution of the fraction of the portion of the mixed light. The control circuit can control amounts of power provided to the light-emitting elements to reduce variations in the light emitted by the light-emitting device as the light-emitting device ages or changes operating temperature, or based on an input signal provided by a user during operation of the light-emitting device.

In some implementations, the second optical element can include a first portion and a light guide, where the first portion can have the exit surface and can be arranged to receive a first portion of the mixed light from the optical interface, and the light guide can be arranged to receive a second portion of the mixed light from the optical interface and can have a guiding surface configured to guide the received second portion of the mixed light away from the optical interface by reflecting at least some of the received second portion of the mixed light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the mixed light that directly impinges on the exit surface is less than the Brewster angle.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p)=R(p)*(1-k/n_2)$$

The value k can be a positive real number such that $k<n_2$. In some implementations, $k/n_2$ can be less than 0.8. In some implementations, k can be less than 1. In some implementations, the value k can be:

$$k < \frac{n_2}{\sqrt{(1+n_2^2)}}$$

In some implementations, each point on the optical interface can be the distance d(p) from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface can be a spherical or cylindrical surface.

In some implementations, the medium can be a gas. The gas can be air. In some implementations, the light-emitting elements can include a light emitting diode. In some implementations, the light emitted by the first light-emitting element can include blue light or ultraviolet light. In some implementations, the converted light can be yellow light. In some implementations, the inelastic scattering centers can include a light-conversion material. The light-conversion material can include a phosphor. The light-conversion material can include a quantum dot phosphor. In some implementations, the transparent material can be a plastic or a glass. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the scattered light through the optical interface; a sensor arranged to receive a fraction of the portion of the scattered light prior to being output through the exit surface, where the sensor is configured to provide a sensor signal based on the fraction of the portion of the scattered light; and a control circuit in communication with the sensor configured to control power applied to the one or more light-emitting elements in response to the sensor signal; where: the device includes a medium adjacent the first surface of the first optical element that has a refractive index $n_0$, and the first optical element includes a material that has a first refractive index $n_1$, where $n_0<n_1$; the transparent material has a refractive index $n_2$, where $n_0<n_2$; the exit surface is a transparent surface that is shaped such that an angle of incidence on the exit surface of the scattered light that directly impinges on the exit surface is less than the critical angle for total internal reflection; and the light-emitting device outputs scattered light through the exit surface.

The foregoing and other embodiments can each optionally include one or more of the following features, alone or in combination. In some implementations, the fraction of the portion of the scattered light received by the sensor can correspond with light reflected in the second optical element at the exit surface. The sensor can be arranged such that the light reflected in the second optical element at the exit surface received by the sensor originates from a large portion of the optical interface.

In some implementations, the first optical element can be a shell that defines an enclosure into which light from the one or more light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material that can be positioned between the one or more light-emitting elements and the first surface to receive light from the one or more light-emitting elements and provide light to the first surface. The third element can be separated from the first surface by a gap.

In some implementations, the sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the second optical element can include a first portion and a light guide, where the first portion can have the exit surface and can be arranged to receive a first portion of the scattered light from the optical interface, and the light guide can be arranged to receive a second portion of the scattered light from the optical interface and can have a guiding surface configured to guide the received second portion of the scattered light away from the optical interface by reflecting at least some of the received second portion of the scattered light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the scattered light that directly impinges on the exit surface is less than the Brewster angle.

In some implementations, for a cross-section, each point, p, on the exit surface can have a corresponding radius of curvature, $R(p)$, and the first and second optical elements can be arranged so that each point on the optical interface is at least a corresponding distance, $d(p)$, from the exit surface, where:

$$d(p)=R(p)*(1-k/n_2)$$

The value k can be a positive real number such that $k<n_2$. In some implementations, $k/n_2$ can be less than 0.8. In some implementations, k can be less than 1. In some implementations, the value k can be:

$$k < \frac{n_2}{\sqrt{(1+n_2^2)}}$$

In some implementations, each point on the optical interface can be the distance $d(p)$ from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface can be a spherical or cylindrical surface.

In some implementations, the medium can be a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. The converted light can be yellow light. The inelastic scattering centers can include a light-conversion material. The light-conversion material can include a phosphor. The light-conversion material can include a quantum dot phosphor.

In some implementations, the transparent material can be a plastic or a glass. In some implementations, the light-emitting device can include multiple light-emitting elements and the multiple light-emitting elements emit light of different colors. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; and a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the scattered light through the optical interface; where: the device includes a medium adjacent the first surface of the first optical element that has a refractive index $n_0$, and the first optical element includes a material that has a first refractive index $n_1$, where $n_0<n_1$; the transparent material has a refractive index $n_2$, where $n_0<n_2$; the exit surface is a transparent surface that is shaped such that an angle of incidence on the exit surface of the scattered light that directly impinges on the exit surface is less than the critical angle for total internal reflection; and a combination of a shape of the exit surface of the second optical element and a non-spherical, non-planar shape of the optical interface is configured to output scattered light through the exit surface, where the combination is configured to control the intensity distribution of the output light.

The foregoing and other embodiments can each optionally include one or more of the following features, alone or in combination. In some implementations, the intensity distribution can be shaped to match an input requirement of a secondary optical system. The combination can be configured to control directions of peak intensities of the intensity distribution. The first optical element can have three different orthogonal dimensions. The first optical element can have two equal orthogonal dimensions. The first optical element can have three equal orthogonal dimensions.

In some implementations, the first optical element can be a shell that defines an enclosure into which light from the one or more light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material positioned between the one or more light-emitting elements and the first surface to receive light from the one or more light-emitting elements and provide light to the first surface. The third element can be separated from the first surface by a gap.

In some implementations, the light-emitting device can further include a sensor arranged to receive a fraction of the portion of the scattered light prior to being output through the exit surface, where the sensor can be configured to provide a sensor signal based on the fraction of the portion of the scattered light; and a control circuit in communication with the sensor that can be configured to control power provided to the one or more light-emitting elements in response to the sensor signal. The sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the second optical element can include a first portion and a light guide, where the first portion can have the exit surface and can be arranged to receive a first portion of the scattered light from the optical interface, and the light guide can be arranged to receive a second portion of the scattered light from the optical interface and can have a guiding surface configured to guide the received second portion of the scattered light away from the optical interface by reflecting at least some of the received second portion of the scattered light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the scattered light that directly impinges on the exit surface is less than the Brewster angle.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p)=R(p)*(1-k/n_2)$$

The value k can be a positive real number such that $k < n_2$. In some implementations, $k/n_2$ can be less than 0.8. In some implementations, k can be less than <1. In some implementations, the value k can be:

$$k < \frac{n_2}{\sqrt{(1+n_2^2)}}$$

In some implementations, each point on the optical interface can be the distance d(p) from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface is a spherical or cylindrical surface.

In some implementations, the medium can be a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. In some implementations, the converted light can be yellow light. In some implementations, the inelastic scattering centers can include a light-conversion material. The light-conversion material can include a phosphor, or a quantum dot phosphor.

In some implementations, the transparent material can be a plastic or a glass. In some implementations, the light-emitting device can include multiple light-emitting elements and the multiple light-emitting elements can emit light of different colors. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; and a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the scattered light through the optical interface; where: the device includes a medium adjacent the first surface of the first optical element that has a refractive index $n_0$, and the first optical element includes a material that has a first refractive index $n_1$, where $n_0<n_1$; the transparent material has a refractive index $n_2$, where $n_0<n_2$; the exit surface is a transparent surface that includes multiple portions, where each portion is joined to another portion at an edge, and the exit surface is shaped such that an angle of incidence at the exit surface of the scattered light that directly impinges on the exit surface is less than the critical angle for total internal reflection; and
a combination of a shape of the exit surface of the second optical element and a shape of the optical interface is configured to output scattered light through the exit surface, where the combination is configured to control the intensity distribution of the output light.

The foregoing and other embodiments can each optionally include one or more of the following features, alone or in combination. In some implementations, the intensity distribution can be shaped to match an input requirement of a secondary optical system. The combination can be configured to control directions of peak intensities of the intensity distribution. The first optical element can have three different orthogonal dimensions. The first optical element can have two equal orthogonal dimensions. The first optical element can have three equal orthogonal dimensions.

In some implementations, the first optical element can be a shell that defines an enclosure into which light from the one or more light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the light-emitting device can further include a third element formed from a transparent material positioned between the one or more light-emitting elements and the first surface to receive light from the one or more light-emitting elements and provide light to the first surface. The third element can be separated from the first surface by a gap.

In some implementations, the light-emitting device can further include a sensor arranged to receive a fraction of the portion of the scattered light prior to being output through the exit surface, where the sensor can be configured to provide a sensor signal based on the fraction of the portion of the scattered light; and a control circuit in communication with the sensor can be configured to control power provided to the one or more light-emitting elements in response to the sensor signal. The sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the second optical element can include a first portion and a light guide, where the first portion can have the exit surface and can be arranged to receive a first portion of the scattered light from the optical interface, and the light guide can be arranged to receive a second portion of the scattered light from the optical interface and can have a guiding surface configured to guide the received second portion of the scattered light away from the optical interface by reflecting at least some of the received second portion of the scattered light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the scattered light that directly impinges on the exit surface is less than the Brewster angle.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p)=R(p)*(1-k/n_2)$$

The value k can be a positive real number such that $k<n_2$. In some implementations, $k/n_2$ can be less than 0.8. In some implementations, k can be less than <1. In some implementations, the value k can be:

$$k < \frac{n_2}{\sqrt{(1+n_2^2)}}$$

In some implementations, each point on the optical interface can be the distance d(p) from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface is a spherical or cylindrical surface.

In some implementations, the medium can be a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. The converted light can be yellow light. The inelastic scattering centers can include a light-conversion material. The light-conversion material can include a phosphor, or a quantum dot phosphor.

In some implementations, the transparent material can be a plastic or a glass. In some implementations, the light-emitting device can include multiple light-emitting elements and the multiple light-emitting elements can emit light of different colors. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; and a second optical element formed from a transparent material that has an exit surface, where the second optical element is in contact with the first optical element, there being an optical interface between the first and second optical elements at the place of contact, where the optical interface is opposite the first surface of the first optical element, and the second optical element is arranged to receive a portion of the scattered light through the optical interface; where: the device includes a medium adjacent the first surface of the first optical element that has a refractive index $n_0$, and the first optical element includes a material that has a first refractive index $n_1$, where $n_0<n_1$; the transparent material has a refractive index $n_2$, where $n_0<n_2$; the exit surface is a transparent surface that is shaped such that an angle of incidence on the exit surface of the scattered light that directly impinges on the exit surface is less than the Brewster angle; and the light-emitting device outputs a fraction of the scattered light through the exit surface.

The foregoing and other embodiments can each optionally include one or more of the following features, alone or in combination. In some implementations, the intensity distribution can be shaped to match an input requirement of a secondary optical system. The combination can be configured to control directions of peak intensities of the intensity distribution. The first optical element can have three different orthogonal dimensions. The first optical element can have two equal orthogonal dimensions. The first optical element can have three equal orthogonal dimensions.

In some implementations, the first optical element can be a shell that defines an enclosure into which light from the one or more light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material positioned between the one or more light-emitting elements and the first surface to receive light from the one or more light-emitting elements and provide light to the first surface. The third element can be separated from the first surface by a gap.

In some implementations, the light-emitting device can further include a sensor arranged to receive a fraction of the portion of the scattered light prior to being output through the exit surface, where the sensor can be configured to provide a sensor signal based on the fraction of the portion of the scattered light; and a control circuit in communication with the sensor that can be configured to control power provided to the one or more light-emitting elements in response to the sensor signal. The sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the second optical element can include a first portion and a light guide, where the first portion can have the exit surface and can be arranged to receive a first portion of the scattered light from the optical interface, and the light guide can be arranged to receive a second portion of the scattered light from the optical interface and can have a guiding surface configured to guide the received second portion of the scattered light away from the optical interface by reflecting at least some of the received second portion of the scattered light.

In some implementations, the exit surface can include a first exit surface and a second exit surface, where the first and second exit surfaces can be at least partially transparent, and a step arranged between the first and second exit surfaces.

In some implementations, the first optical element can have a substantially uniform effective thickness. In some implementations, $n_1 \approx n_2$. In some implementations, $n_0 \approx 1$.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p)=R(p)*(1-k/n_2)$$

The value k can be a positive real number such that $k<n_2$. In some implementations, $k/n_2$ can be less than 0.8. In some implementations, k can be less than <1. In some implementations, the value k can be:

$$k < \frac{n_2}{\sqrt{(1+n_2^2)}}$$

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface is a spherical or cylindrical surface.

In some implementations, the medium can be a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. In some implementations, the converted light can be yellow light. In some implementations, the inelastic scattering centers can include a light-conversion material. The light-conversion material can include a phosphor, or a quantum dot phosphor.

In some implementations, the transparent material can be a plastic or a glass. In some implementations, the light-emitting device can include multiple light-emitting elements and the multiple light-emitting elements can emit light of different colors. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; a second optical element formed from a transparent material and in contact with the first optical element, there being an optical interface between the first and second optical elements at the place of contact, where the optical interface is opposite the first surface of the first optical element, the second optical element includes a first optic and a light guide, the first optic has an exit surface and is arranged to receive a first portion of the scattered light from the optical interface, and the exit surface is a transparent surface that is shaped such that an angle of incidence at the exit surface of the scattered light that directly impinges on the exit surface is less than the critical angle for total internal reflection, and the light guide is arranged to receive a second portion of the scattered light from the optical interface and has a guiding surface configured to guide the received second portion of the scattered light away from the optical interface by reflecting at least some of the received second portion of the scattered light; where: the device includes a medium adjacent the first surface of the first optical element that has a refractive index n0, and the first optical element includes a material that has a first refractive index n1, where n0<n1; and the transparent material has a refractive index n2, where n0<n2.

The foregoing and other embodiments can each optionally include one or more of the following features, alone or in combination. In some implementations, the light-emitting device can further include a reflective coating disposed on the guiding surface and configured to reflect the at least some of the received second portion of the scattered light. In some implementations, the light guide can be configured to reflect the at least some of the received second light via total internal reflection. In some implementations, the light guide can be configured to emit predetermined amounts of light at predetermined distances from the one or more light-emitting elements through the guiding surface. The guiding surface can have a surface texture configured to extract the predetermined amounts of light. The light guide can include centers configured to scatter light such that the predetermined amounts of light are emitted at the predetermined distances from the one or more light-emitting elements through the guiding surface. In some implementations, the light guide can have a distal surface configured to emit at least a fraction of the at least some of the received second portion of the scattered light.

In some implementations, the first optical element can be a shell that defines an enclosure into which light from the one or more light-emitting elements can be emitted, where the shell can be shaped such that at least some light from the first surface directly propagates through the enclosure to the first surface. The shell has a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements is emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the exit surface can include multiple portions, where each portion can be joined to another portion at an edge. The exit surface can have four portions. The exit surface can correspond with a circumscribing surface of an intersection of two orthogonal half cylinders.

In some implementations, the light-emitting device can further include a third element formed from a transparent material positioned between the one or more light-emitting elements and the first surface to receive light from the one or more light-emitting elements and provide light to the first surface. The third element is separated from the first surface by a gap.

In some implementations, the light-emitting device can further include a sensor arranged to receive a fraction of the portion of the scattered light prior to being output from the light-emitting device, where the sensor can be configured to provide a sensor signal based on the fraction of the portion of the scattered light; and a control circuit in communication with the sensor that can be configured to control power provided to the one or more light-emitting elements in response to the sensor signal. The sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the scattered light that directly impinges on the exit surface is less than the Brewster angle.

In some implementations, for a cross-section, each point, p, on the exit surface can have a corresponding radius of curvature, R(p), and the first and second optical elements can be arranged so that each point on the optical interface is at least a corresponding distance, d(p), from the exit surface, where:

$$d(p)=R(p)*(1-k/n_2)$$

The value k can be a positive real number such that $k<n_2$. In some implementations, $k/n_2$ can be less than 0.8. In some implementations, k can be less than 1. In some implementations, the value k can be:

$$k < \frac{n_2}{\sqrt{(1+n_2^2)}}$$

In some implementations, each point on the optical interface can be the distance d(p) from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface can be a spherical or cylindrical surface.

In some implementations, the medium is a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. The converted light can be yellow light. The inelastic scattering centers can include a light-conversion material. The light-conversion material can include a phosphor, or a quantum dot phosphor.

In some implementations, the transparent material can be a plastic or a glass. In some implementations, the light-emitting device can include multiple light-emitting elements and the multiple light-emitting elements can emit light of different colors. In some implementations, the inelastic scattering centers can be one and the same as the elastic scattering centers.

In general, another innovative aspect of the subject matter described in this specification can be embodied in a light-emitting device that includes one or more light-emitting elements configured to emit light during operation; a first optical element that has a first surface spaced apart from the one or more light-emitting elements and positioned to receive light from the one or more light-emitting elements, where the first optical element includes scattering centers arranged to substantially isotropically scatter the light from the one or more light-emitting elements and to provide scattered light; and a second optical element formed from a transparent material, where the second optical element is in contact with the first optical element, there being an optical interface between the first and second optical elements at the place of contact, where the second optical element is arranged to receive a portion of the scattered light through the optical interface, and the second optical element includes an exit surface including a first exit surface and a second exit surface, where the first and second exit surfaces are at least partially transparent and shaped such that an angle of incidence at the first and second exit surfaces of at least some of the scattered light that directly impinges thereon is less than the critical angle for total internal reflection, and the second optical element further includes a step arranged between the first and second exit surfaces; where: the device includes a medium adjacent the first surface of the first optical element that has a refractive index n0, and the first optical element includes a material that has a first refractive index n1, where n0<n1; the transparent material has a refractive index n2, where n0<n2; and the light-emitting device outputs light through the first and second exit surfaces.

The foregoing and other embodiments can each optionally include one or more of the following features, alone or in combination. In some implementations, the first exit surface can intersect at least one optical axis of the one or more light-emitting elements and the step can be arranged such that the first exit surface is recessed relative to the second exit surface. In some implementations, the first exit surface can intersect at least one optical axis of the one or more light-emitting elements and the step can be arranged such that the second exit surface is recessed relative to the first exit surface. In some implementations, the step can include a reflective surface. In some implementations, the step can include a transparent surface. In some implementations, at least one of the first and second exit surfaces can be translucent.

In some implementations, the first optical element can be a shell that defines an enclosure into which light from the one or more light-emitting elements can be emitted, where the shell can be shaped such that at least some light from the first surface directly propagates through the enclosure to the first surface. The shell can have a concave shape with respect to the enclosure. The shell can have an ellipsoidal shape. The ellipsoidal shape can be prolate or oblate. The ellipsoidal shape can be triaxial. The shell can have one or more openings configured to receive the one or more light-emitting elements. In some implementations, the light-emitting device can further include one or more reflectors arranged within the one or more openings, where the one or more reflectors can have one or more reflective surfaces facing the enclosure and configured to enclose the enclosure.

In some implementations, the light-emitting device can further include a reflector that has a reflective surface, where the reflective surface and the first surface together can define an enclosure into which all light from the one or more light-emitting elements can be emitted. The reflective surface can be planar, or convex with respect to the enclosure. The first surface can be planar, or convex with respect to the enclosure. The reflective surface can include specular reflective portions, or diffuse reflective portions. The reflective surface can be configured to direct light from the one or more light-emitting elements towards the first surface.

In some implementations, the light-emitting device can further include a third element formed from a transparent material positioned between the one or more light-emitting elements and the first surface to receive light from the one or more light-emitting elements and provide light to the first surface. The third element can be separated from the first surface by a gap.

In some implementations, the light-emitting device can further include a sensor arranged to receive a fraction of the portion of the scattered light prior to being output from the light-emitting device, where the sensor can be configured to provide a sensor signal based on the fraction of the portion of the scattered light; and a control circuit in communication with the sensor that can be configured to control power provided to the one or more light-emitting elements in response to the sensor signal. The sensor signal can be configured to indicate estimates of one or more of intensity and spectral density distribution of the fraction of the portion of the scattered light. The control circuit can control power provided to the one or more light-emitting elements to reduce variations in the light emitted by the light-emitting device as the light-emitting device ages or changes operating temperature, or based on an input signal provided by a user during operation of the light-emitting device.

In some implementations, the first optical element can have a substantially uniform effective thickness. In some implementations, $n_1 \approx n_2$. In some implementations, $n_0 \approx 1$. In some implementations, the exit surface can be shaped such that an angle of incidence on the exit surface of the scattered light that directly impinges on the exit surface is less than the Brewster angle.

In some implementations, for a cross-section, each point, p, on the exit surface can have a corresponding radius of curvature, $R(p)$, and the first and second optical elements can be arranged so that each point on the optical interface is at least a corresponding distance, $d(p)$, from the exit surface, where:

$$d(p)=R(p)*(1-k/n_2)$$

The value k can be a positive real number such that $k<n_2$. In some implementations, $k/n_2$ can be less than 0.8. In some implementations, k can be less than 1. In some implementations, the value k can be:

$$k < \frac{n_2}{\sqrt{(1+n_2^2)}}$$

In some implementations, each point on the optical interface can be the distance $d(p)$ from the corresponding nearest point on the exit surface.

In some implementations, an axis of symmetry of the first optical element and an axis of symmetry of the second optical element can be collinear. The one or more light-emitting elements can be positioned symmetrically about the axis of symmetry of the first optical element. In some implementations, the first and second optical elements can extend along an axis and can have a cross-section that is substantially unchanged along the axis. In some implementations, the exit surface can be a spherical or cylindrical surface.

In some implementations, the medium can be a gas. The gas can be air. In some implementations, the one or more light-emitting elements can include a light emitting diode. In some implementations, the light emitted by the one or more light-emitting elements can include blue light or ultraviolet light. In some implementations, the scattering centers can include inelastic scattering centers configured to convert at least some light received from the one or more light-emitting elements to converted light having a longer wavelength. The converted light can be yellow light. The inelastic scattering centers can include a light-conversion material. The light-conversion material can include a phosphor, or a quantum dot phosphor.

In some implementations, the transparent material can be a plastic or a glass. In some implementations, the light-emitting device can include multiple light-emitting elements and the multiple light-emitting elements can emit light of different colors. In some implementations, the inelastic scattering centers can be one and the same as the elastic scattering centers.

Various references are incorporated herein by reference. In the event of conflict between the present disclosure and any incorporated disclosure, including definitions, the present specification controls. The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like elements in different figures are identified with the same reference numeral.

DETAILED DESCRIPTION

Figure 1A:
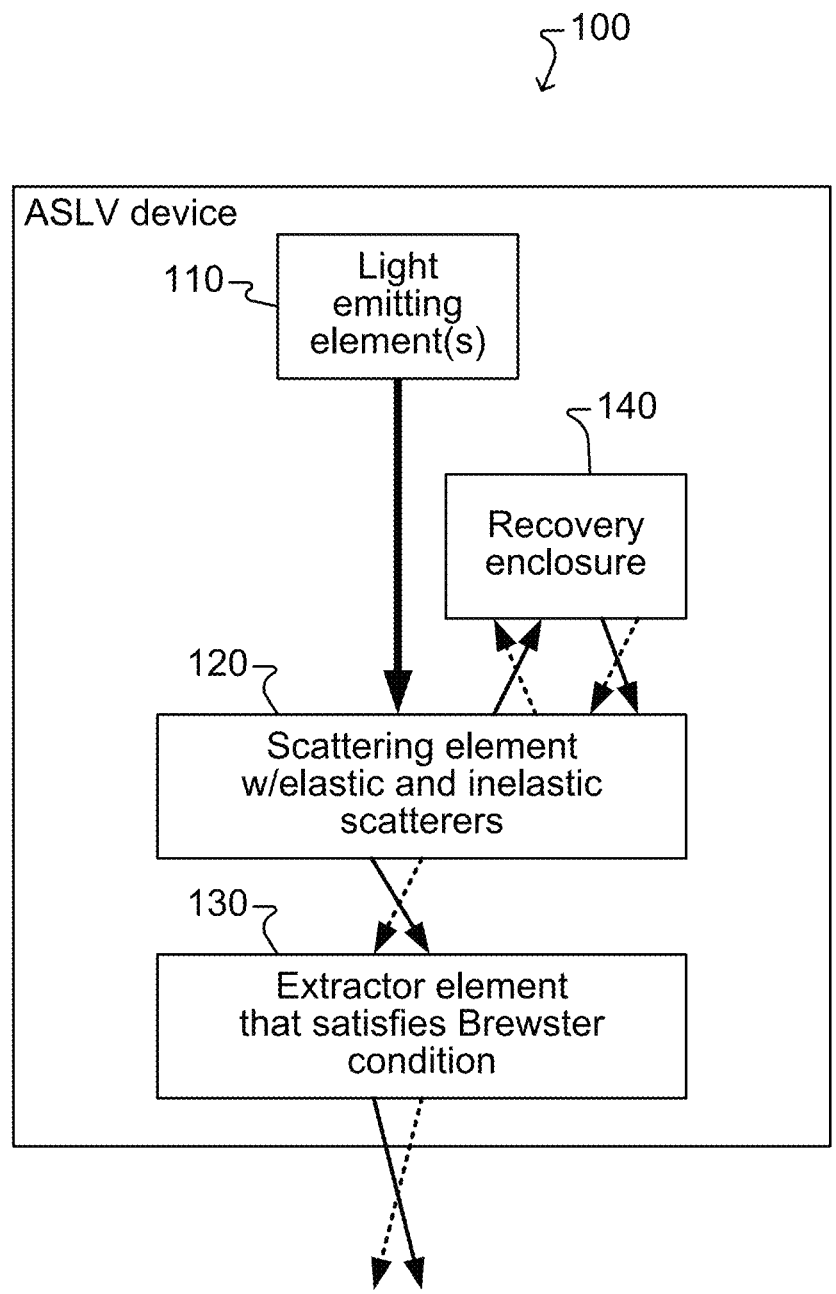
FIG. 1A is a schematic diagram of an example of an ASLV light-emitting device having an extractor element that satisfies Brewster's condition.

FIG. 1A shows a schematic diagram of an example of a light-emitting device 100 that includes a light-emitting element 110 (LEE), a scattering element 120 (also referred to as a first optical element), an extractor element 130 (also referred to as a second optical element), and a recovery enclosure 140. Light-emitting device 100 efficiently provides broadband, homogenized light to an ambient environment across a broad range of angles.

The light-emitting element 110 is configured to produce and emit light during operation. A spectral power distribution of light emitted by the light-emitting element 110 (also referred to as pump light) can be blue, for instance. The spectral power distribution for visible light is referred to as chromaticity. In general, the light-emitting element 110 is a device that emits radiation in a region or combination of regions of the electromagnetic spectrum for example, the visible region, infrared and/or ultraviolet region, when activated by applying a potential difference across it or passing a current through it, for example. The light-emitting element 110 can have monochromatic, quasi-monochromatic, polychromatic or broadband spectral emission characteristics.

Examples of light-emitting elements that are monochromatic or quasi-monochromatic include semiconductor, organic, polymer/polymeric light-emitting diodes (LEDs). In some implementations, the light-emitting element 110 can be a single specific device that emits the radiation, for example an LED die, or/and can be a combination of multiple instances of the specific device that emit the radiation together. Such light-emitting device 110 can include a housing or package within which the specific device or devices are placed. As another example, the light-emitting element 110 includes one or more lasers and more specifically semiconductor lasers, such as vertical cavity surface emitting lasers (VCSELs) and edge emitting lasers. In embodiment utilizing semiconductor lasers, the scattering element functions to reduce (e.g., eliminate) spatial and temporal coherence of the laser light, which may be advantageous where the light emitting device may be viewed directly by a person. Further examples of a light-emitting element 110 include superluminescent diodes and other superluminescent devices.

The scattering element 120 has a first surface (also referred to as a light-entry surface) spaced apart from the light-emitting element 110 and positioned to receive the light from the light-emitting element 110. The scattering element 120 includes scattering centers arranged to substantially isotropically scatter the light from the light-emitting element 110 and to provide scattered light. The scattered light includes elastically scattered pump light and inelastically scattered pump light. The elastically scattered pump light includes photons that have undergone elastic scattering at the scattering centers, and the inelastically scattered pump light includes photons that have undergone inelastic scattering at the scattering centers. For example, the spectral distribution of photons remains substantially unchanged due to elastic scattering or change in effect of inelastic scattering. Elastic scattering entails refraction of light at a scattering center, for example. As another example, inelastic scattering entails emission of light from a scattering center in effect of light that was previously absorbed by the scattering center. With respect to the technology described in this specification, inelastic scattering typically is associated with one visible or ultraviolet (UV) incoming photon and one visible outgoing photon. Scattering of light by a scattering center can result from effects such as light conversion, refraction, and/or other effect and/or combination thereof. The distribution of a plurality of outgoing photons that result from inelastic scattering at one scattering center is isotropic depending on, for example, the ability of the scattering centers to perform light conversion. The distribution of a plurality of outgoing photons that result from elastic scattering at multiple scattering centers is isotropic depending on, for example, shapes, arrangements and/or compositions of the scattering centers. A scattering center can include one or more portions that each scatter light in one or more ways, for example, by light conversion, refraction or other effect. Scattering centers include discontinuities in the composition or structure of matter. In order to achieve a predetermined degree of randomness in its propagation, light has to undergo multiple elastic scattering events. As such multiple scattering events are required to exceed a predetermined randomness, for example, when the light is scattered by interaction with scattering centers that scatter light merely by refraction. Scattering centers can include light-converting material (LCM) and/or non-light converting material, for example. Light conversion via LCM is a form of inelastic scattering.

LCM is a material which absorbs photons according to a first spectral distribution and emits photons according to a second spectral distribution, as described below in connection with FIG. 1B. The terms light conversion, wavelength conversion and/or color conversion are used interchangeably. Light-converting material is also referred to as photoluminescent or color-converting material, for example. Light-converting materials can include photoluminescent substances, fluorescent substances, phosphors, quantum dots, semiconductor-based optical converters, or the like. Light-converting materials also can include rare earth elements.

Figure 1B:
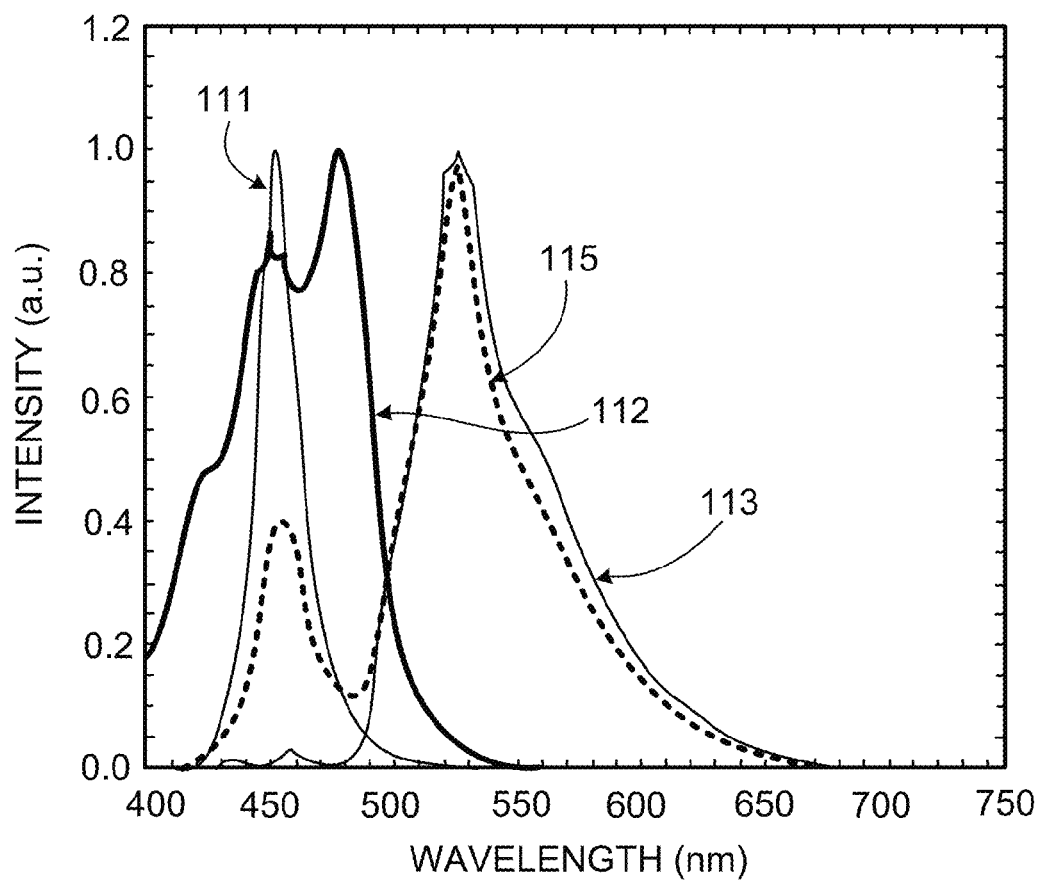
FIG. 1B shows an example of a spectrum of output light of an ASLV light-emitting device.

FIG. 1B shows an emission spectrum 111 for a blue LED. The blue LED can be used as the light-emitting element 110 in the light-emitting device 100. In addition, FIG. 1B shows an absorption spectrum 112 and an emission spectrum 113 of the scattering centers, along with a spectrum of the scattered light 115 (the latter is represented with a dotted-line.) Spectral power distribution of the elastically scattered light is the same as the spectral power distribution of the pump light (corresponding to the spectrum 111.) Moreover, the absorption spectrum of the scattering centers 112 overlaps the spectrum of the light emitted by the light-emitting element 111. Spectral power distribution of the inelastically scattered light is different from the pump light. For instance, inelastically scattered light will have a spectrum 113 that is shifted (e.g., Stokes shifted) to longer wavelengths than the pump light spectrum 111. For example, where the pump light is blue, e.g., corresponding to the spectrum 111, inelastically scattered light can be characterized by an overall yellow/amber color, e.g., corresponding to the spectrum 113. Moreover, the spectrum of the scattered light 115 is a combination of the spectrum 111 of the elastically scattered light and spectrum 113 of the inelastically scattered light.

In this manner, the scattering element 120 substantially randomizes the direction of propagation of light received from light-emitting element 110 by scattering substantially all light entering the scattering element 120, while allowing substantial portions of light to pass through the scattering element 120. The extractor element 130 is formed from a transparent material, such as a transparent glass or a transparent organic polymer, having an exit surface. The exit surface of the extractor element 130 is generally a curved, transparent surface. In other words, changes in the scattered light passing through the exit surface can generally be described by Snell's law of refraction, as opposed to, for example, an opaque or diffuse surface where further scattering of transmitted light occurs. The extractor element 130 is in contact with the scattering element 120, such that there is an optical interface between the scattering and extractor elements at the place of contact, and the optical interface is opposite the first surface of the scattering element. The scattering element 120 has substantially uniform thickness, such that a distance between the optical interface and the first surface of the scattering element 120 is constant for any point of the optical interface. Moreover, the extractor element 130 is arranged so that light scattered through the optical interface enters the extractor element 130. Light from the scattering element 120 that directly reaches the exit surface of the extractor element 130 is referred to as forward light.

Further, the light-emitting device 100 includes a medium, such as a gas (e.g., air), adjacent the first surface of the scattering element having a refractive index n0, and the scattering element 120 includes a material having a first refractive index n1, where n0<n1. Light from the scattering element 120 that reaches the first surface is referred to as backward light. Because n0<n1, the first surface allows only a fraction of the backward light to escape into the low-index medium. The transparent material of the extractor element 130 has a refractive index n2, where n0<n2. As such, the amount of transmitted forward light is greater than the amount of backward light transmitted into the low index medium, and the light emitting device 100 asymmetrically propagates scattered light. In such a case, depending on the degree of asymmetry between n0 and n2, the optical interface between the scattering element 120 and the extractor element 130 permits varying ratios of forward to backward light transmission. The maximum asymmetry in this ratio is reached if n2 is equal or larger than n1. Light emitting devices that feature asymmetric optical interfaces (i.e., different refractive index mismatches) on opposing sides of the scattering element are referred to as asymmetric scattering light valves (ASLV), or ASLV light-emitting devices. Hence, the light-emitting device 100 is an ASLV light-emitting device 100.

The exit surface of the extractor element 130 is a transparent surface on which the scattered light that directly impinges on the exit surface experiences little or no total internal reflection (TIR). In this manner, the exit surface transmits a large portion of light impinging thereon that directly propagates thereto from the scattering element and propagates in at least certain planes and outputs it into the ambient of the extractor element on first pass. The light output through the exit surface can be used for illumination or indication functions provided by the ASLV light-emitting device 100 or for further manipulation by another optical system that works in conjunction with the ASLV light-emitting device 100.

In some embodiments, the exit surface of the extractor element 130 is shaped as a spherical or a cylindrical dome or shell with a radius R1 in which the optical interface is disposed within an area defined by a respective notional sphere or cylinder that is concentric with the exit surface and has a radius $R_{OW}=R1/n$, wherein n is the refractive index of the extractor element 130. Such a configuration is referred to as Weierstrass geometry or Weierstrass configuration. It is noted that a spherical Weierstrass geometry can avoid TIR for rays passing through the area circumscribed by a corresponding notional R1/n sphere irrespective of the plane of propagation. A cylindrical Weierstrass geometry can exhibit TIR for light that propagates in planes that intersect the respective cylinder axis at shallow angles even if the light passes through an area circumscribed by a corresponding notional $R_{OW}=R1/n$ cylinder.

It is noted that other ALSV light-emitting devices described in this specification have exit surfaces with other shapes and/or other geometrical relations with respect to the optical interface. For instance, a non-spherical or non-cylindrical exit surface of the extractor element 130 can be employed to refract light and aid in shaping an output intensity distribution in ways different from those provided by a spherical or cylindrical exit surface. The definition of the Weierstrass geometry can be extended to include exit surfaces with non-circular sections by requiring that the optical interface falls within cones, also referred to as acceptance cones, subtended from points p of the exit surface whose axes correspond to respective surface normals at the points p and which have an apex of 2*Arcsin(k/n), wherein k is a positive number smaller than n. It is noted that the exit surface needs to be configured such that the plurality of all noted cones circumscribe a space with a non-zero volume. It is further noted that k is assumed to refer to a parameter that determines the amount of TIR at an uncoated exit surface that separates an optically dense medium, having n>1, on one side of the exit surface making up the extractor element 130 from a typical gas such as air with n~1.00 at standard temperature and pressure conditions, on the opposite side of the exit surface. Depending on the embodiment, k can be slightly larger than 1 but is preferably less than 1. If k>1, some TIR may occur at the exit surface inside the extractor element 130. In some embodiments, this results in the optical interface being at least R(p)*(1−k/n) away from the exit surface in a direction normal to the exit surface at a point p thereof. Here, R(p) is the local radius of curvature of the exit surface at the point p, and n is the refractive index of the extractor element 130. For a spherical or cylindrical exit surface with k=1, the boundaries circumscribed by the noted cones correspond with a spherical or cylindrical Weierstrass geometry, respectively. Some embodiments are configured to allow for some TIR by choosing k>1. In such cases, k/n is limited to k/n<0.8, for example.

In summary, an ASLV light-emitting device 100 is said to satisfy the Weierstrass configuration if a radius $R_O$ of the optical interface is less than or equal to $R_O < R_{OW} = R1/n$, where R1 and n respectively are the radius and index of refraction of the extractor element 130. Equivalently, the extractor element 130 of an ASLV light-emitting device 100 is said to satisfy the Weierstrass configuration if a radius $R_1$ of an extractor element 130, which has an index of refraction n, is equal to or larger than $R_1 \geq R_{1W} = nR_O$, where $R_O$ is the radius of the optical interface of the ASLV light-emitting device 100.

In some embodiments, the exit surface is shaped such that an angle of incidence on the exit surface of the scattered light that directly impinges on the exit surface is less than the Brewster angle. In this case, k is not just smaller than 1 to avoid TIR at the exit surface of the extractor element 130 for light propagating in at least one plane, but k is made so small that certain Fresnel reflections are additionally avoided. In such a case, k is chosen to be smaller than $n(1+n^2)^{-1/2}$. For example, with respect to light propagating in planes of symmetry of spherical or cylindrical Weierstrass geometries, rays that propagate through an area circumscribed by a concentric notional sphere or cylinder of radius $R0=R1(1+n^2)^{-1/2}$, will impinge on the exit surface at or below the Brewster angle. More generally, p-polarized light that impinges at a point p of the exit surface from within directions bound by a cone subtended from the point p with apex 2*Arctan(1/n) whose axis corresponds with the surface normal at the point p will not be reflected at the exit surface. Such a configuration is referred to as Brewster geometry (or Brewster configuration), or more specifically a Brewster sphere or a Brewster cylinder, for example. In such embodiments the distance between the exit surface and the optical interface is larger than $$R1(1-(1+n^2)^{-\frac{1}{2}}).$$

In summary, an ASLV light-emitting device 100 is said to satisfy the Brewster configuration if a radius $R_0$ of the optical interface is less than or equal to $R_O < R_{OB} = R1(1+n^2)^{-1/2}$, where $R_1$ and n are the radius and index of refraction of the extractor element 130. Note that for a given radius $R_1$ of the extractor element 130, an optical interface of the ASLV light-emitting device 100 that satisfies the Brewster condition has a maximum radius $R_{OB}$ that is smaller than a maximum radius $R_{OW}$ of an optical interface of the ASLV light-emitting device 100 that satisfies the Weierstrass condition. Equivalently, the extractor element 130 of index of refraction n is said to satisfy the Brewster configuration if a radius $R_1$ of the extractor element 130 is equal to or larger than $R_1 \geq R_{1B} = R_O(1+n^2)^{+1/2}$, where $R_O$ is the radius of the optical interface of the ASLV light-emitting device 100. Note that for a given radius $R_O$ of the optical interface of the ASLV light-emitting device 100, an extractor element 130 that satisfies the Brewster condition has a minimum radius $R_{1B}$ that is larger than a minimum radius $R_{1W}$ of an extractor element 130 that satisfies the Weierstrass condition.

In some implementations, the extractor element 130 has an elongated or non-elongated shape. As described below in this specification, the extractor element 130 can be shaped to partially or fully circumscribe the scattering element 120. Such an extractor element 130 provides one or more hollows or cavities and one or more openings or holes. Openings and holes form apertures to receive light from the light-emitting element 110 and direct the light at the first surface of the scattering element 120. Accordingly, the extractor element 130 is shaped as a shell or other shape with a certain thickness or thickness profile.

In some embodiments, the scattering element 120 is partially of fully surrounded by the extractor element 130 and the optical interface includes corresponding portions of the surface of the scattering element. In some embodiments, the extractor element 130 and the scattering element 120 are integrally formed. In an example of such an integral formation, the optical interface is a notional interface drawn between regions of a corresponding integrally formed object, such that the optical interface substantially includes interfaces formed by the scattering centers. This may be the case, when the scattering element 120 includes scattering centers inside a material that is the same as the material used to form the extractor element 130, for example. In this manner, the scattering element 120 can be shaped as a tile, disc, spherical or aspherical shell or dome, tubular, prismatic or other elongate shell, or other structure to provide a predetermined spatial profile of conversion properties to achieve a predetermined light-output profile including color and/or brightness homogeneity from the scattering element 120.

Furthermore, the recovery enclosure 140 encloses the medium adjacent the first surface of the scattering element. The recovery enclosure 140 is arranged and configured to recover a portion of the scattered light that propagates through the first surface into the medium. This means that the recovery enclosure 140 redirects at least a portion of the scattered light back towards the scattering element 120 so that at least some of this light exits the scattering element 120 into the extractor element 130. As explained in reference to embodiments below, the design of the recovery enclosure 140 can be selected to reduce the amount of scattered light that returns to the light-emitting element 110 (where it can be absorbed). For instance, the recovery enclosure 140 can be defined by the first surface of the scattering element 120 and/or one or more additional optical components that redirect such back-scattered light and/or via certain configuration of the scattering element as described below in this specification. For example, the recovery enclosure 140 can be formed by the first surface of the scattering element 120 and an optical coupler as described below in connection with FIG. 4. As another example, the recovery enclosure 140 can be formed by the first surface of a hollow extractor element 130 as described below in connection with FIG. 6. The backscattered light recovered from the recovery enclosure 140 further increases asymmetry in the propagation of light through the ASLV light-emitting device 100.

Additionally, the ASLV light-emitting device 100 outputs scattered light through the exit surface into the ambient environment. The spectrum 115 of the light output by the ASLV light-emitting device 100 is shown in FIG. 1B. Generally, the scattering element 120 can provide sufficient mixing of the elastically and inelastically scattered light so that the chromaticity of the light exiting the light-emitting device 100 is substantially uniform, e.g., isotropic, through a large range of angles. For example, light-emitting device 100 can provide white light with a white point that varies by 5% or less (e.g., 4% or less, 3% or less, 2% or less, 1% or less) across a range of solid angles such as, for example, 0.1 sr or more, 0.3 sr or more, 0.5 sr or more, 1 sr or more, 2 sr or more, $\pi$ sr or more, 4 sr or more, $2\pi$ sr or more, $3\pi$ sr or more.

In general, the shape, size, and composition of the recovery enclosure 140, scattering element 120, and extractor element 130 can vary. The characteristics of each component are selected based on the characteristics of the other components and the desired performance of the light-emitting device 100. This will be apparent from the discussion of specific embodiments of light-emitting devices described below.

An ASLV light-emitting device 100 can be used in applications such as general illumination. Additionally, the ASLV light-emitting device 100 can be used for display illumination, e.g., projection displays, backlit LCD's, signage, etc.

Moreover, an ASLV light-emitting device 100 can be fabricated using conventional extrusion and molding techniques and conventional assembly techniques, as described below in this specification for specific embodiments. Components of the ASLV light-emitting device 100 can include one or more organic or inorganic materials, for example acrylic, silicone, polypropylene (PP), polyethylene terephthalate (PET), polycarbonate, polyvinylidene fluoride such as Kynar™, lacquer, acrylic, rubber, polyphenylene sulfide (PPS) such as Ryton™, polysulfone, polyetherimide (PET), polyetheretherketone (PEEK), polyphenylene oxide (PPO) such as Noryl™, glass, quartz, silicate, adhesive, other polymers organic or inorganic glasses and/or other materials.

Figure 2A:
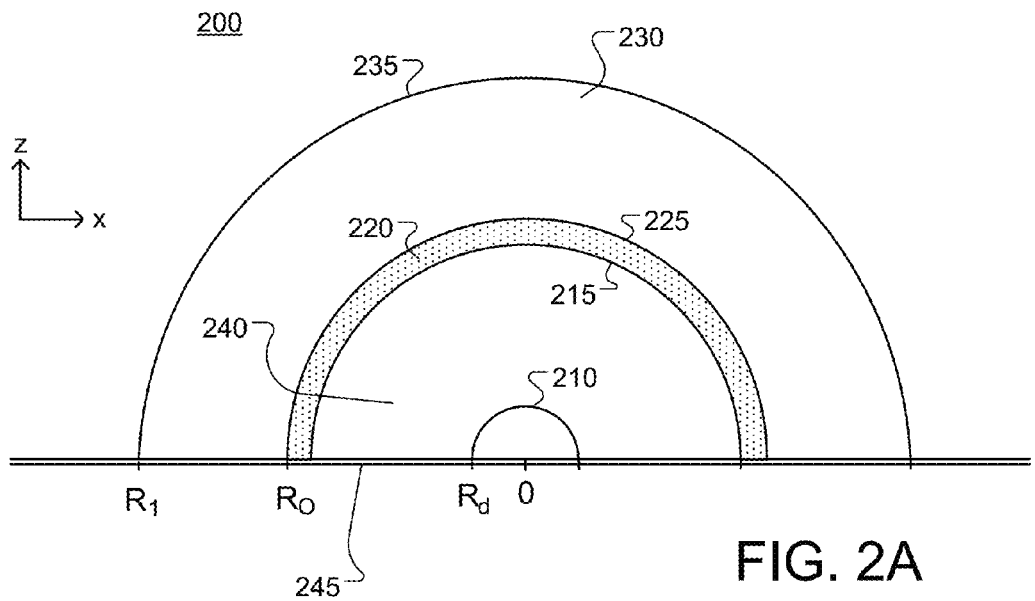
FIGS. 2A-2D show aspects of an example of a light-emitting device having a hemispherical scattering element.

FIG. 2A shows aspects of an example of an ASLV light-emitting device 200 having a hemispherical scattering element 220. The ASLV light-emitting device 200 includes a light-emitting element 210 (e.g., a blue pump LED), the scattering element 220, an extractor element 230, and a flat reflector 245 (e.g., a mirror.) The scattering element 120 has a first surface 215 spaced apart from the light-emitting element 210 and positioned to receive the light from the light-emitting element 210. The light-emitting element 210 is inserted into an opening (e.g., having a radius Rd) of the flat reflector 245. In some implementations, the reflector 245 extends to at least the first surface of the scattering element 220. In other implementations, the reflector 245 extends to at least an exit surface of the extractor element 230. The scattering element 220 is located on the inside of the extractor element 230 adjacent an air filled semispherical enclosure 240 of radius Ro of the extractor element 230 to form an optical interface 225. The enclosure 240 encloses the light-emitting element 210 and its surrounding reflector 245. In some implementations, the extractor element 230 has an exit surface 235 of radius R1 that is concentric with the optical interface 225, such that the extractor element 230 satisfies the Brewster configuration $R_1 \geq R_{1B}$. The Brewster radius is given by $R_{1B}=R_O(1+n1^2)^{+1/2}$, where $R_O$ is the radius of the optical interface 225 of the ASLV light-emitting device 200, and n1 denotes the index of refraction of the material of the extractor element 230. As the extractor element 230 satisfies the Brewster configuration, an angle of incidence on the exit surface 235 of the scattered light that directly impinges on the exit surface 235 is less than the Brewster angle, and as such, the scattered light that directly impinges on the exit surface 235 experiences little or no total internal reflection thereon.

In this example, light propagation asymmetry arises from the materials on the inside (index n0) and outside (index n1) of the scattering element 220 with index np being unequal. For instance, if np=1.5 and n0=1.0, that is n0<np, a large fraction (~75%) of the isotropically distributed photons impinging on the first surface 215 will be reflected by TIR back into the scattering element 220 and only a smaller fraction (~25%) will be transmitted backwards into the recovery enclosure 240 from where some may reach the light-emitting element 210. At the optical interface 225, the condition np≤n1 will guarantee that substantially all photons reaching the optical interface 225 will transition into the extractor element 230, and the Brewster condition will further guarantee that practically all these photons will transmit into air without TIR through the exit surface 235. Only a small fraction (down to about ~4% depending on incidence angle) will be returned by Fresnel reflection at the exit surface 235.

Figure 2B:
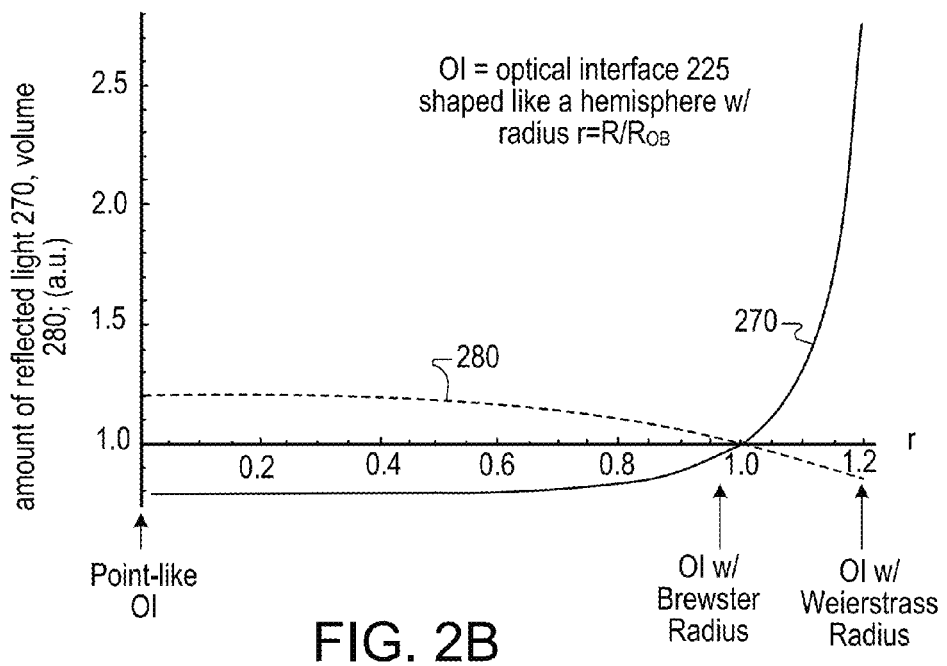

FIG. 2B illustrates how an amount 270 of Lambertian distributed light emitted from a point on the top of the spherical optical interface 225, that is reflected at the spherical exit surface 235 of radius R1, depends on a radial distance $r=R_O/R_{OB}$ of such a point from the center "O" of the spherical exit surface 235. FIG. 2B also illustrates how a volume of the extractor element 280 depends on the radial distance r, further assuming that the optical interface 225 is spherical and hence r is equal to a normalized radius of the optical interface 225. It is noted that the radial distance $r=R_O/R_{OB}$ is indicated in units of the Brewster Radius $R_{OB}=R1/sqrt(1+(n1)^2)$ for the optical interface 225, where $R_O$ is the (non-normalized) radius of the optical interface. The situation illustrated in FIG. 2B refers to an index of refraction ratio of n1=1.5. This represents an example of a plastic or glass to air interface (n0=1). The amount of reflected light 270 is indicated in units of the amount of light that is reflected at an exit surface 235 when the radius of the optical interface 225 is the Brewster Radius $R_O=R_{OB}$, or r=1. The volume 280 is indicated in units of the volume of an extractor element 230 of radius R1, when the radius of the optical interface 225 is the Brewster Radius $R_O=R_{OB}$, or r=1. The upper limit of r represented in FIG. 2B is r=1.2 and corresponds to the Weierstrass Radius $R_{OW}=R1/n1$. As shown in FIG. 2B, reducing r of the optical interface 225 from the Weierstrass Radius ($R_O=R_{OW}$, or r=1.2) to the Brewster Radius ($R_O=R_{OB}$, or r=1) reduces the amount of reflected light 270 to less than 50% while the volume 280 of the extractor element 280 increases by less 20%. For situations when the ASLV light-emitting device 200 satisfies the Brewster condition, r≤1, the maximum angles of incidence of the light impinging on the exit surface 235 are below the Brewster Angle, and thus approach normal incidence. Below the Brewster Limit, where r≤1, Fresnel reflection losses 270 are within about 20% of the value of the reflection coefficient for normal incidence, $((n1/n2-1)/(n1/n2+1))^2$. Normal incidence corresponds to a "point-like" optical interface, or r=0.

In this manner, the volume 280 of an extractor element 230 at the Brewster condition, r=1, is beneficially 20% less than the volume 280 of an extractor element 230 that experiences only Fresnel reflections, r=0, for a penalty increase in reflection losses of 20%. Meanwhile, the volume 280 of the extractor element 230 at the Brewster condition, r=1, suffers a 20% penalty increase compared to the volume 280 of an extractor element 230 at the Weierstrass condition, r=1.2, but benefits from a decrease in reflection losses of more than 50%. Accordingly, an ASLV light-emitting device 200 with an optical interface 225 with a radius $R_O$ about equal to the Brewster Radius, $R_{OB}$, provides a reasonable performance/cost ratio. In some implementations, the ASLV light-emitting device 200 can be fabricated to have an optical interface 225 with a radius $R_O$ about $0.9*R_{OB}$, $0.75*R_{OB}$ or $0.5*R_{OB}$. In some implementations, the ASLV light-emitting device 200 can be fabricated to have an optical interface 225 with a radius $R_O$ about $1.05*R_{OB}$, or $1.1*R_{OB}$.

The structure of the ASLV light-emitting device 200 shown in FIG. 2A reduces internal photon losses by (1) minimizing backscattering from the scattering element 220 into the recovery enclosure 240 towards the pump, (2) guaranteeing that most backscattered photons are returned to the scattering element 220 with one or less reflection events on the reflector 245, (3) reducing the average time a photon spends in the loss-prone scattering element 220 by providing a first pass transmission into the extractor 230 for any photon reaching the index matched optical interface 225 between scattering element 220 and extractor element 230. Compared with a symmetric structure (e.g., having an air gap between phosphor 220 and extractor 230 or very thin extractor shell 230), the ASLV light-emitting device 200 reduces photon losses in the photon recovery enclosure 240 between light-emitting element 210 and scattering element 220 or absorption losses within the scattering element 220 by approximately a factor of 3×.

Figure 2C:
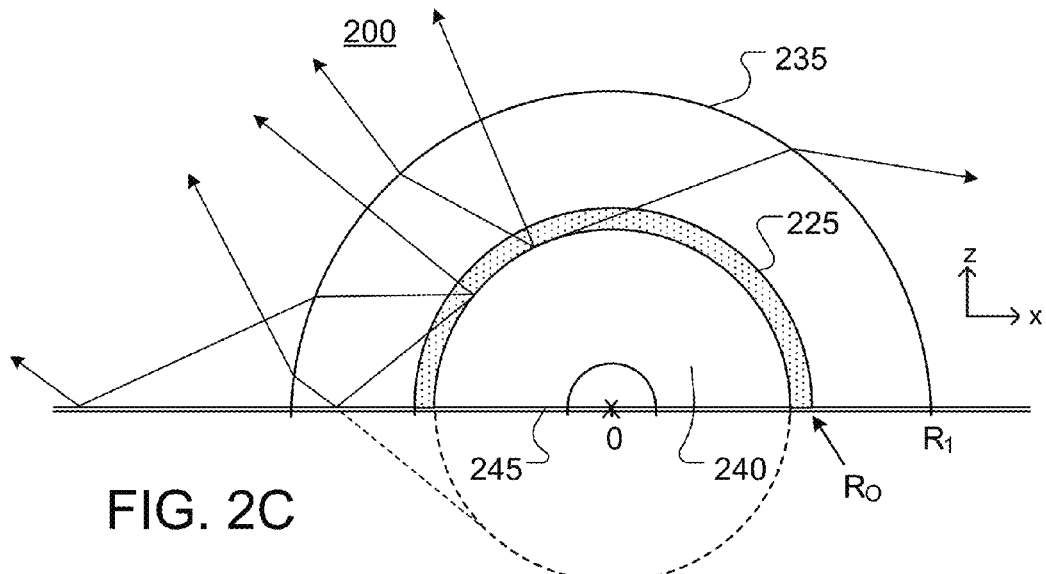
Figure 2D:
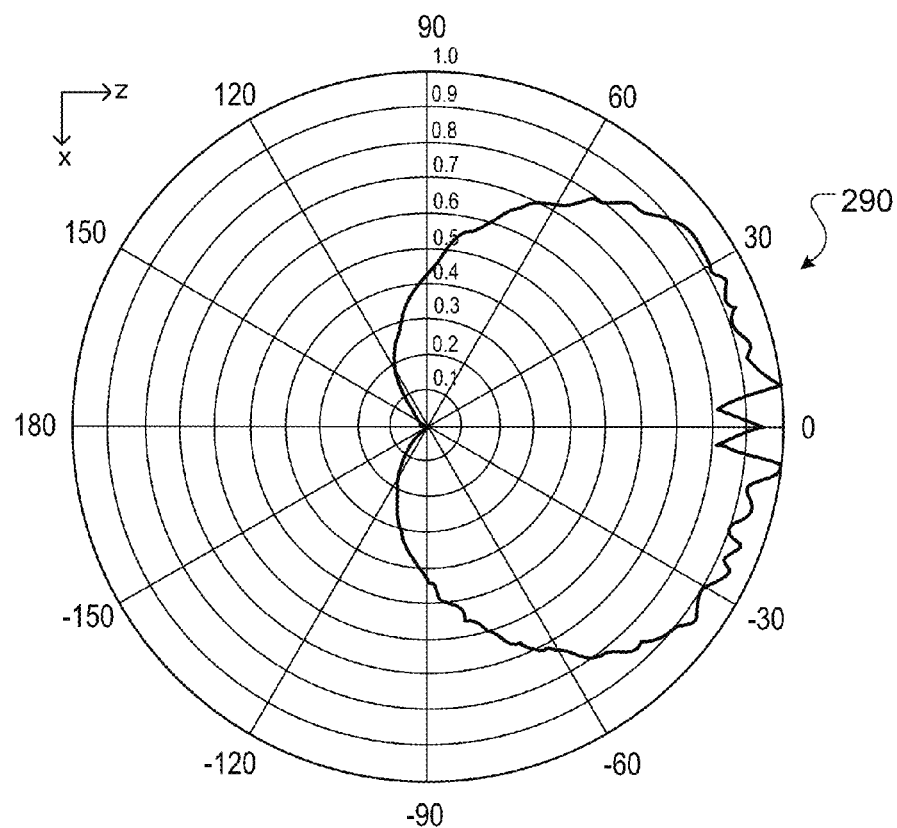

FIG. 2D shows an intensity distribution 290 output by an ASLV light-emitting device similar to the ASLV light-emitting device 200. In this example, the reflector 245 extends to the exit surface 235 of the extractor element 230, because it is desired that the ASLV light-emitting device 200 output some light into backward direction. In this manner, although the intensity distribution 290 has a forward bias, it covers a solid angle of >2π sr, since light originating from the upper part of the scattering element 220 and propagating towards the lower edges of the extractor 230 will be refracted into angles >90° from the optical z-axis.

The example of ASLV light-emitting device 200 illustrated in FIG. 2C, has a reflector 245 that extends beyond the edge of the exit surface 235 to turn most of the scattered light into a forward direction (e.g., the positive direction of the z-axis.) An intensity distribution of the light output by the ASLV light-emitting device shown in FIG. 2D also depends on the reflector shape outside of the exit surface 235. For instance, the reflector 245, which extends outside the exit surface 235, can be curved or bent upwards, e.g., in the +z direction, to narrow the output intensity distribution. For effective photon recovery in the recovery enclosure 240, it is important to fabricate the reflector 245 from a material with high reflectivity to return scattered light to the scattering element 220.

To first order, it is believed that specular and diffuse reflectors 245 having the same percentage reflectance offer comparable performance in the ASLV light-emitting device 200. At the intersection of the Brewster extractor element 235 with the reflector 245, some degree of diffusivity helps in suppressing wave-guided modes and converts these modes into "escape" modes (i.e. modes that leak, or escape, from the ASLV light-emitting device 200). The choice of diffusivity can vary. Some reflecting materials slightly decrease their reflectivity with increasing diffusivity. The choice of diffusivity can be determined by efficiency considerations as well as other lamp design parameters such as angular intensity distribution.

Specific examples of elongated embodiments of scattering elements are described below in this specification in connection with FIGS. 19-25. Additional examples of elongated embodiments of extractor elements are described below in this specification in connection with FIGS. 28 and 30-31.

Figure 3:
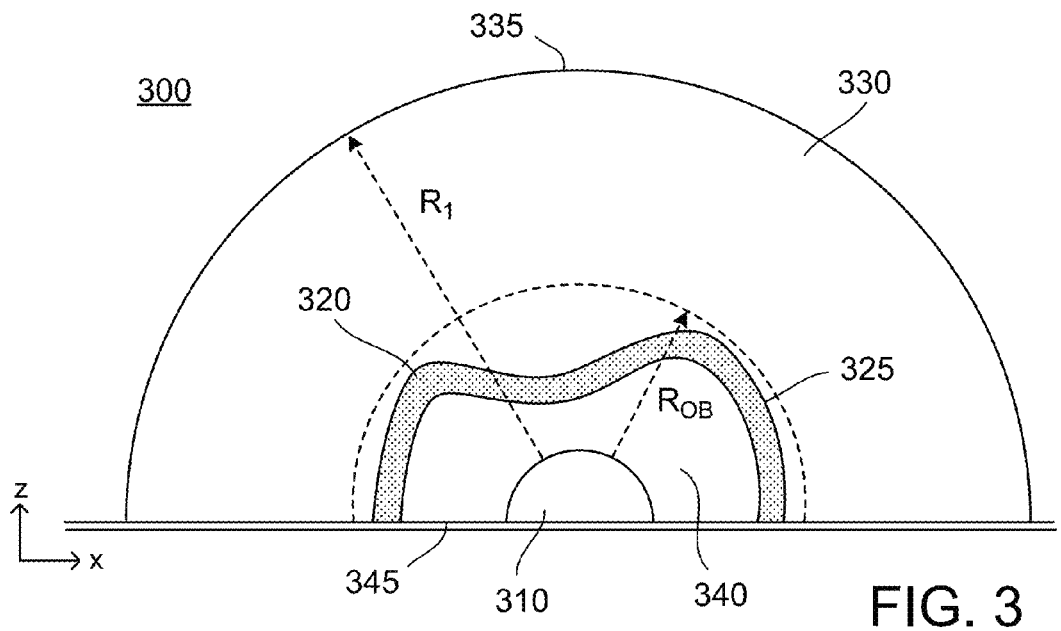
FIG. 3 shows an example of a light-emitting device having a concave scattering element.

While the foregoing embodiment includes a hemispherical scattering element, other concave shapes of the scattering element are also possible as described below in this specification. For example, FIG. 3 shows an ASLV light-emitting device 300 having a mostly concave scattering element 320. The light-emitting device 300 includes a light-emitting element 310 inserted into an opening of a reflector 345, a scattering element 320 deposited on the inside of an air filled recovery enclosure 340 of an extractor element 330 enclosing the pump 310 and its surrounding reflector 345. The scattering element 320 has uniform thickness and forms an optical interface 325 with the extractor element 330, such that the index n1 of the extractor element 330 is higher than or equal to the index np of the scattering element 320. The extractor element 330 has an exit surface 335 of radius R1 that satisfies the Brewster condition for most of the extent of the optical interface 325. Specifically in the example illustrated in FIG. 3, the optical interface 325 is contained within a nominal sphere of radius $R_{OB}$ that is concentric with the exit surface 335. Other examples of light-emitting devices having such concave scattering elements are described below.

Figure 4:
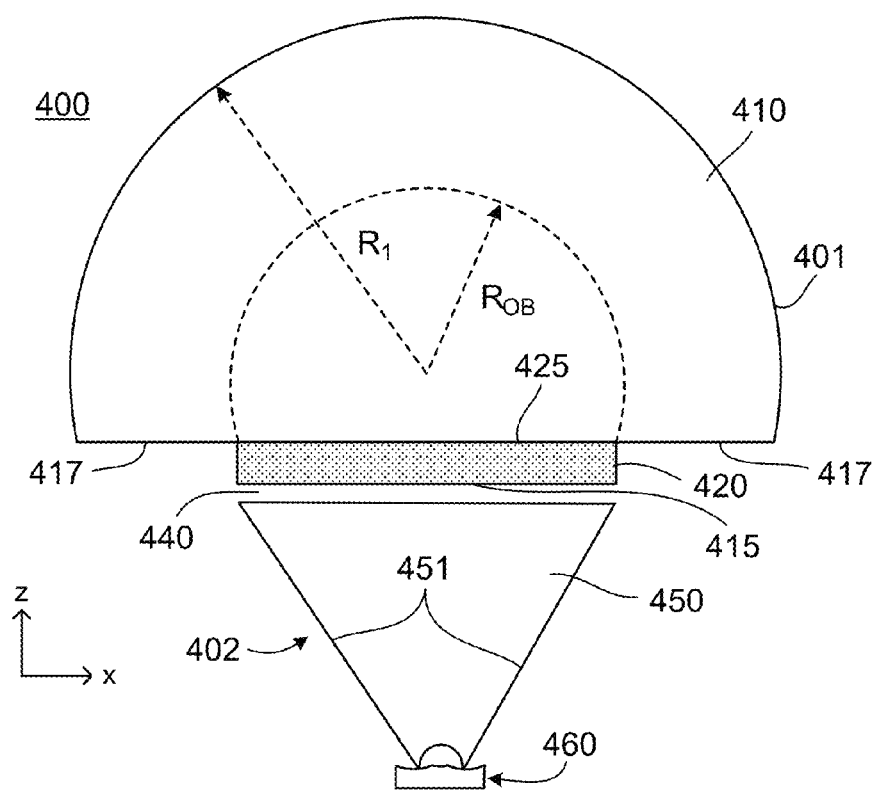
FIG. 4 shows an example of a light-emitting device having a flat scattering element.

FIG. 4 shows an example of ASLV light-emitting device 400, shown in cross-section, having a planar scattering element 420. In addition to scattering element 420, ASLV light-emitting device 400 includes an extractor element 410 and a primary optical sub-system 402. In this example, the ASLV light-emitting device 400 is configured as a light bulb. The primary optical sub-system 402 includes an LEE 460 and an optical coupler 450. The ASLV light-emitting device 400 is rotationally symmetric about an axis z that passes through the LEE 460.

During operation, light-emitting element 460 emits pump light, at least some of which propagates through optical coupler 450 towards a light-entry surface 415 of scattering element 420. The optical coupler 450 is configured to collimate light from light-emitting element 460 in order to maintain steep incidence angles of light from the LEEs 460. It is believed that maintaining steep incidence angles reduces the amount of Fresnel reflections at the light-entry surface 415, reduces the overall amount of back-reflected source light and therefore improves the overall efficiency of the ASLV light-emitting device 400. The optical coupler 450 can be configured to provide a specular, diffuse, TIR or otherwise reflective mantle 451. As such, the optical coupler 450 can be configured as a substantially solid object or an object with a cavity.

The optical coupler 450 has a conical cross section and is nominally rotationally symmetric about the z-axis. In general, other forms of optical couples can be used. For example, optical couplers can have a regular or irregular polygonal, or otherwise configured cross section. Depending on the embodiment, the optical coupler 450 is configured to redirect at least a portion of light that escapes from the scattering element 420 through the light-entry surface 415 towards the optical coupler 450 back to the light-entry surface 415. In this manner, the optical coupler 450 and the light-entry surface 415 of the scattering element 420 form a recovery enclosure for the ASLV light-emitting device 400.

The optical coupler 450 can use TIR and/or a reflective coating to direct light and accordingly configured as a solid or hollow object. The coupler 450 is used in combination with an additional optical element that provides a diffuse, specular or otherwise reflective cone-shaped opening having a white, metallic or other surface that is separated from the reflective mantle 451 by an air gap to further improve recovery of light received from a scattering element 420 including materials having refractive indices larger than one. The reflective surface of such an additional optical element reflects back and optionally diffuses light that escapes from the optical coupler 450 through the reflective mantle 451 and thereby improves chances for reentry of the escaped light into the optical coupler 450 in such directions that it will propagate towards the light-entry surface 415. The optical coupler can be configured as a compound parabolic concentrator, a conical or other element, for example.

In some implementations, the extractor element 410 is a solid spherical dome of radius R1 and the scattering element 420 as a circular disk. In some implementations, the extractor element can include a gel or a liquid. In this example, the scattering element 420 abuts the extractor element 410 to form an optical interface 425. The scattering element 420 includes active (e.g., inelastic) and passive (e.g., elastic) scattering centers. The optical elements 410 and 420, and primary optical sub-system 402 are held in place by a suitable support structure, which maintains a gap 440 between scattering element 420 and optical coupler 450. Gap 440 is used to provide diffused white light from blue pump light provided by the one or more LEEs 460.

The gap 440 can be filled by air, some other gas, or evacuated. While gap 440 is shown to have a substantially homogenous thickness, more generally, gap 440 can have a thickness that varies. In addition, gap 440 can be relatively narrow. For example, gap 440 can have a thickness of about 1 mm or less (e.g., 0.5 mm or less, 0.2 mm or less).

As described above, scattering element 420 is a planar element having a light-entry surface 415 facing light emitting element 460.

To mitigate the amount of light from the LEEs 460 that may escape transmission into the scattering element 420 via the outer perimeter of the air gap 440 and therefore may be lost or cause undesired chromaticity effects (e.g., unwanted blue light) a number of measures may be employed. Such measures include reducing the thickness of the air gap 440, widening of the scattering element 420, disposition of a non-transmissive ring with optional inside reflective surface around the perimeter of the air gap, and/or other measures, for example.

The extractor element 410 includes a transparent material with refractive index n. The scattering element 420 is disposed within a portion of space defined by a notional sphere of Brewster radius, $R_{OB}$. This means that light that is incident on exit surface 401 emanating from the optical interface 425 satisfies the Brewster condition, and is limited to angles of incidence at the exit surface greater than the Brewster angle. Light from the one or more LEEs 460 is guided by the optical coupler 450 via the air gap 440 to the light-entry surface 415 and into the scattering element 420. The transmission of the light from the air gap 440 into the scattering element 420 may be subject to some reflection depending on angle of incidence due to Fresnel losses but is not subject to total internal reflection as the scattering element 420 is optically denser. Light propagating within the scattering element 420 that impinges on the light-entry surface 415 at angles larger than the critical angle with respect to the interface normal, however, does undergo TIR.

A portion of light that enters the scattering element 420 is inelastically scattered by the scattering element 420 and thereby wavelength converted and randomized in its directions of propagation. The other portion is elastically scattered without wavelength conversion as it passes through the scattering element 420 and is thereby also randomized in its directions of propagation. Light may have to undergo multiple elastic scattering events to achieve a predetermined level of randomization in the directions of its propagation. Light that is backscattered or otherwise directed towards the light-entry surface 415 from within the scattering element 420 may be subject to TIR depending on its angle of incidence with respect to the light-entry surface 415. Like considerations apply for light impinging on the secondary surface 417. Consequently such light is preferably redirected back into the scattering element 420 and/or the extractor element 410.

Figure 5:
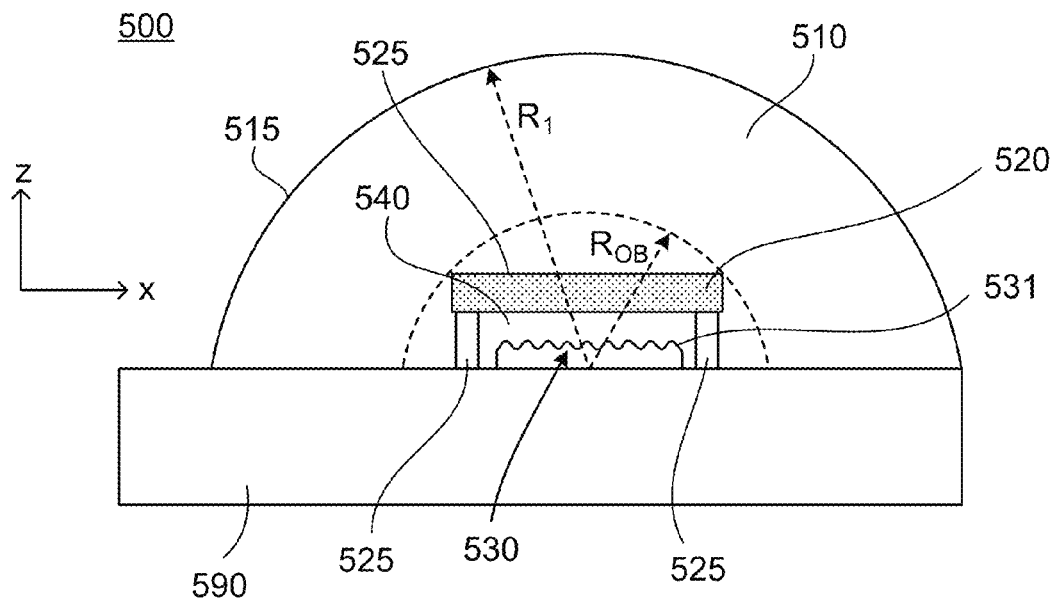
FIG. 5 shows an example of a light-emitting device having a flat scattering element and a recovery enclosure recessed inside an extractor.

FIG. 5 shows another example of ASLV light-emitting device 500 that includes a planar scattering element 520. The ASLV light-emitting device 500 includes a light-emitting element 530 (e.g., an LEE die) operatively disposed on a support member 590. The light-emitting element 530 is provided with electrical interconnections for providing electrical power to the light-emitting element 530. The light-emitting element 530 has a textured surface 531 configured to provide predetermined optical extraction of light from the light-emitting element 530. A scattering element 520 is operatively associated with the light-emitting element 530 from which it is separated by a low-index medium 540. The low-index medium 540 may be air or other material that provides a refractive index lower than the refractive index of the scattering element 520.

The width of the scattering element 520 and the distance thereof from the light-emitting element 530 is determined based on the light-emission pattern of the light-emitting element 530 in such a way that the scattering element 520 can capture a predetermined portion of the light emitted by the light-emitting element 530 under operating conditions. As the light-emission pattern of the light-emitting element 530 has a predetermined divergence, the scattering element 520 is wider than the light-emitting element 530. The divergence depends on the characteristics of the light-emitting element 530 and the properties of the optical boundary between the light-emitting element 530 and the low-index medium 540.

The scattering element 520 is supported by a peripheral enclosure 525 surrounding the light-emitting element 530. Depending on the embodiment, the peripheral enclosure 525 and the scattering element 520 may be formed of like or different materials. The peripheral enclosure 525 and the scattering element 520 may be integrally or otherwise formed. The peripheral enclosure 525 surrounds the light-emitting element 530 in order to block escape of pump light from the light-emitting element 530. As such the peripheral enclosure 525 may be configured to convert pump light into converted light and provide mixed light similar in properties to the light provided by the scattering element 520. The peripheral enclosure 525 may further be configured to provide good thermal contact between the scattering element 520 and the support member 590.

The extractor element 510 is formed from a transparent material with refractive index n and is configured as a rotationally symmetric dome, e.g., a segment of a sphere of radius R1. The scattering element 520 is configured as a rectangular plate. In the example illustrated in FIG. 5, the scattering element 520 and the extractor element 510 are configured in accordance with a Brewster condition. As such, the scattering element 520 is contained within a notional sphere of radius $R_{OB}$ concentric with an exit surface 515 of the dome sphere 510. The scattering element 520 includes elastic and inelastic scattering. The example LEE is used to provide diffused white light from blue pump light provided by the light-emitting element 530.

It is noted that a portion of the low-index medium that is proximate the light-emitting element 530 may be replaced with encapsulant (e.g., a silicone or organic encapsulant) that is optically denser than the low-index medium and forms a suitably light-transmissive optical interface with the remaining low-index medium. Such a configuration, albeit more complex and possibly resulting in a larger LEE package, may improve the efficacy of light extraction from the light-emitting element 530 into the low-index medium in comparison to the configuration of the example ASLV light-emitting device 500.

Figure 6:
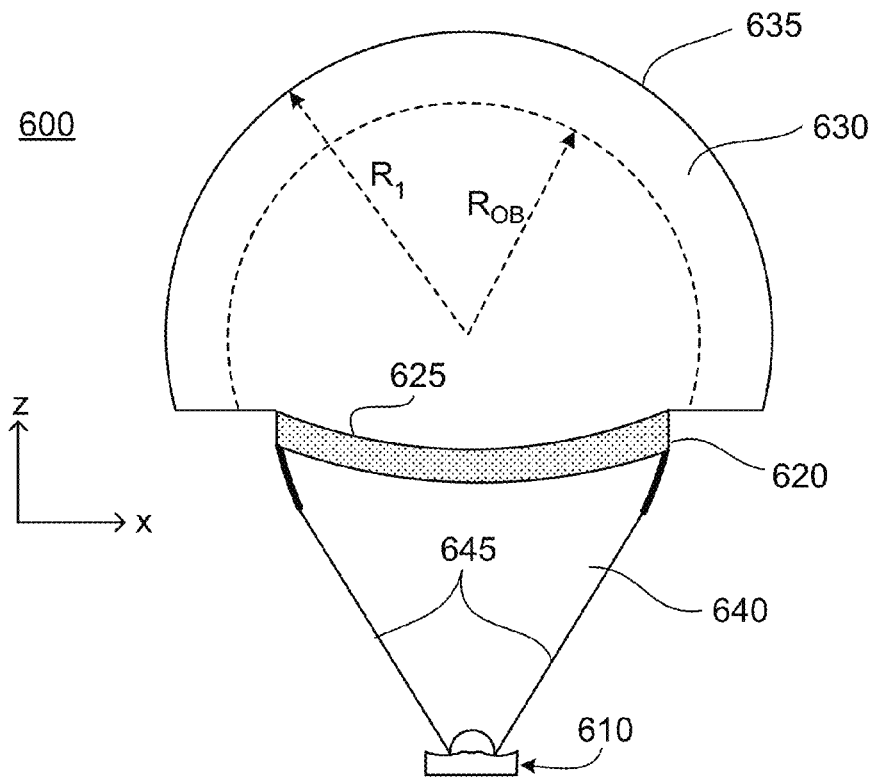
FIG. 6 shows an example of a light-emitting device having a convex scattering element.

While the foregoing embodiments feature planar scattering elements, in general, the shape of the scattering element is not so limited. FIG. 6 shows an example of ASLV light-emitting device 600 having a convex scattering element 620. The ASLV light-emitting device 600 further includes an extractor element 630 coupled to the scattering element 620 to form a convex optical interface 625. The index of refraction n1 of the extractor element 630 is equal to or larger than index of refraction of the scattering element 620. The extractor element 630 has an exit surface 635 shaped like a dome of radius R1.

The convex scattering element 620 is disposed within a portion of space defined by a notional sphere of Brewster radius, $R_{OB}$ concentric with the exit surface 635. This means that light that is incident on exit surface 635 emanating from the optical interface 625 satisfies the Brewster condition, and is limited to angles of incidence at the exit surface greater than the Brewster angle.

The ASLV light-emitting device 600 further includes an optical coupler 645 configured as a hollow reflector, for example. The optical coupler 645 is filled with a low-index medium, for example air or inert gas. In this configuration, a combination of the hollow reflector of the optical coupler 645 and a surface of the scattering element 620 facing the light-emitting element 610 forms a recovery enclosure 640 for the ASLV light-emitting device 600.

Although, the ASLV light-emitting device 600 has similar structure with the ASLV light-emitting device 400, the extractor element 630 of the former has higher power than the extractor element 610 of the latter. In this manner, the ASLV light-emitting device 600 has a stronger forward bias (along the +z axis) than the ASLV light-emitting device 400.

Figure 7:
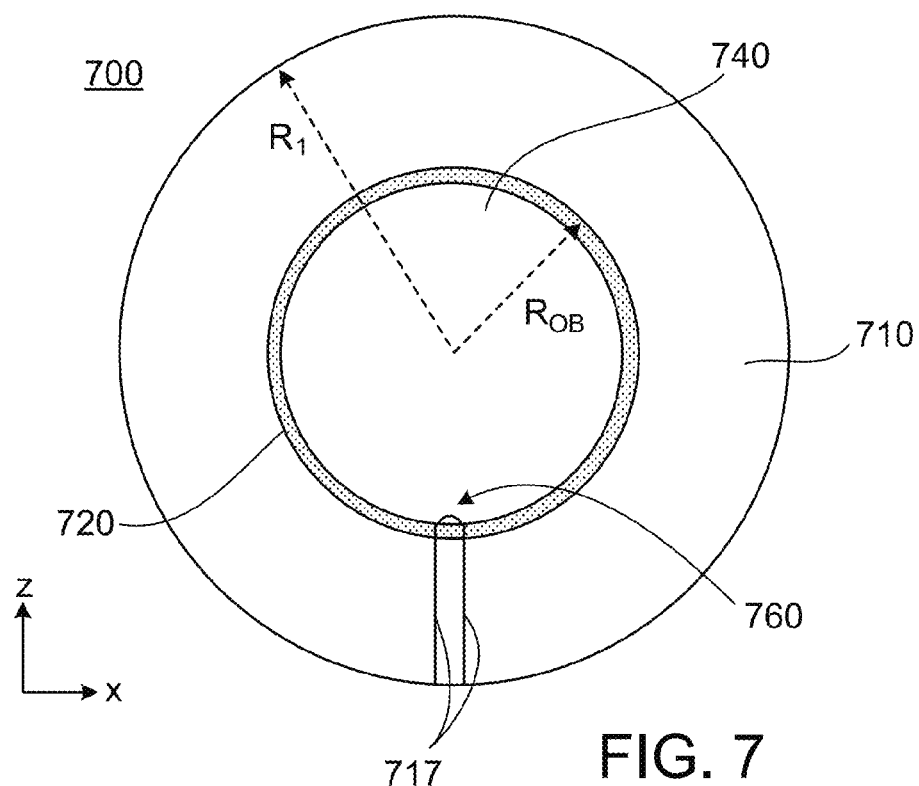
FIG. 7 shows an example of a light-emitting device having a spherical scattering element and a recovery enclosure encompassed by an extractor.

In the foregoing embodiments, ASLV light-emitting devices feature recovery enclosures that feature at least one reflective surface. However, in some embodiments, the recovery enclosure can be devoid of reflective surfaces. For example, FIG. 7 shows an example of a ASLV light-emitting device 700 that has a concave scattering element 720, and a recovery enclosure 740 encompassed by an extractor 710. The ASLV light-emitting device 700 has a rotationally symmetric generally spherical configuration and includes an extractor element 710, a scattering element 720 and a light-emitting device 760 configured to emit blue light under operating conditions. The scattering element 720 includes active and passive scattering centers and is configured to convert a portion of the blue light provided by the light-emitting device 760 to generate white light. The extractor element 710 and the scattering element 720 can be injection molded in a multi-shot process. The ASLV light-emitting device 700 may further include for example a socket for establishing an electromechanical connection to a source of power, drive electronics, electrical connections and cooling elements.

The extractor element 710 and the scattering element 720 include materials having refractive indices of about 1.5 to 1.7 or larger, for example. The extractor element 710 and the scattering element 720 are configured as nesting spherical shells. The scattering element 720 includes a cavity formed as a hollow recovery enclosure 740 that is filled with a low-index medium, for example air or inert gas. The scattering element 720 defines an aperture surrounded by walls 717 and substantially abuts sides of the light-emitting device 760 so that substantially all light from the light-emitting device 760 is emitted into the recovery enclosure 740 during operating conditions.

Depending on the size of the light-emitting device 760, the solid angle occupied by the scattering element 720 as subtended from the scattering element 720 itself and viewed through the recovery enclosure 740 may be close to $2\pi$, or otherwise referred to as $2\pi$ minus epsilon. Likewise, the solid angle occupied by the scattering element 720 as subtended from a point within the recovery enclosure 740 may be close to $4\pi$, or otherwise referred to as $4\pi$ minus epsilon. Like considerations apply to the total cumulative solid angle in embodiments with more than one light-emitting device 760. Corresponding light-emitting devices may be referred to accordingly. Consequently, the ratio of amounts of light that originate from the scattering element 720 and impinge on the light-emitting device 760 versus those which impinge on the scattering element 720, can be controlled, to some degree, via geometrical aspects of the ASLV light-emitting device 700.

An exit surface of the extractor element 710 is spherical and has a radius R1. The scattering element 720 is disposed concentric with the extractor element 710 within a portion of space defined by a notional sphere of Brewster radius, $R_{OB}$. In the example illustrated in FIG. 7, an optical interface formed between the scattering element 720 and the extractor element is substantially the Brewster sphere. This means that light that is incident on the exit surface of the extractor element 710 emanating from the scattering element 720 satisfies the Brewster condition, and is limited to angles of incidence at the exit surface greater than the Brewster angle.

Light that propagates from the recovery enclosure 740 into the scattering element 720 is subject to some reflection depending on angle of incidence due to Fresnel losses but is not subject to total internal reflection as the scattering element 720 is optically denser than the low-index medium inside the recovery enclosure 740. Light from inside the scattering element 720 that is directed back at the recovery enclosure 740 and does not undergo TIR, will escape from the scattering element 720 into the recovery enclosure 740. Short of being absorbed, both types of light will propagate through the recovery enclosure 740 and impinge somewhere else on the scattering element 720 and may be recycled back into the light output by the ASLV light-emitting device 700, or impinge on the light-emitting device 760 and be likely converted into heat. Depending on the size of the light-emitting device 760 relative to the diameter of the scattering element 720, the likelihood that back-scattered light may be lost to heat can be relatively small and the optical efficiency of the ASLV light-emitting device 700 can be relatively high.

Light that scatters from the scattering element 720 into the extractor element 710 will not undergo TIR at the exit surface as the ASLV light-emitting device 700 satisfies the Brewster condition. Due to Fresnel reflections, only a portion of such light, however, will transmit into an ambient region of the ASLV light-emitting device 700. The portion that is reflected back will interact with the scattering element 720 and propagate accordingly.

Figure 8:
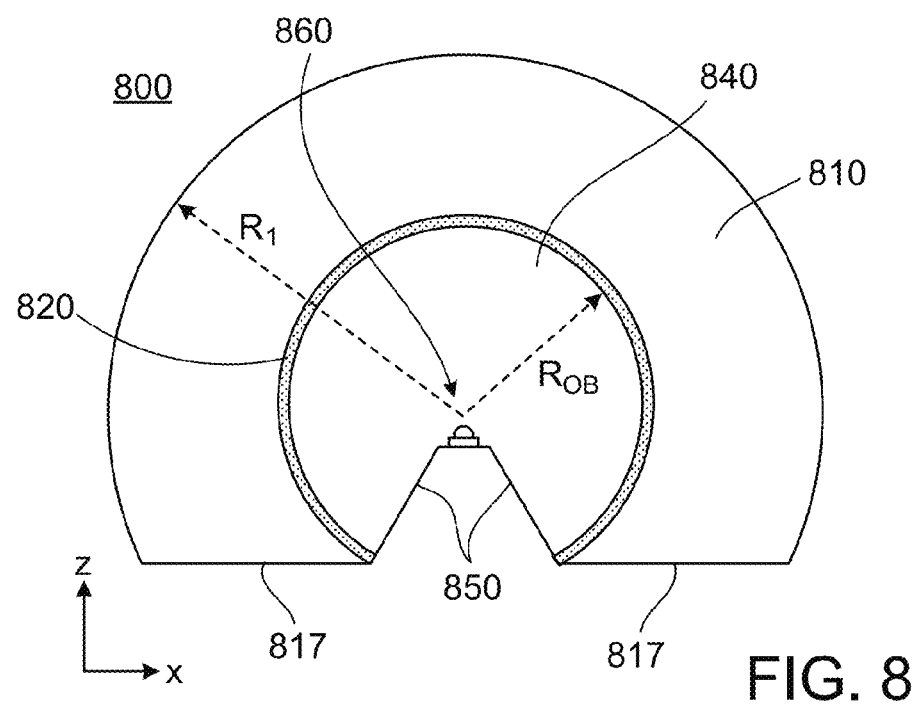
FIG. 8 shows an example of a light-emitting device having a concave scattering element, and a recovery enclosure with a protruded base.

FIG. 8 shows an ASLV light-emitting device 800 having a concave scattering element 820 and a recovery enclosure 840 with a protruded base 850. The ASLV light-emitting device 800 further includes a light-emitting element 860, an scattering element 820, and a recovery enclosure 840. The light-emitting element 860 is configured to emit blue light under operating conditions. The scattering element 820 is at least partially encompassed by the extractor 810. Additionally, the scattering element 820 includes active and passive scattering centers and is configured to convert a portion of the blue light provided by the light-emitting device 860 to generate white light. The extractor element 810 and the scattering element 820 include materials having refractive indices of about 1.5 to 1.7 or larger, for example. The recovery enclosure 840 is filled with a low-index medium, for example air or inert gas. The ASLV light-emitting device 800 is coupled via the base 850 to a socket for establishing an electromechanical connection to a source of power, drive electronics, electrical connections and cooling elements.

The ASLV light-emitting device 800 has a rotationally symmetric (around the z-axis) configuration of a spherical segment. The extractor element 810 and the scattering element 820 are configured as nesting shells shaped as spherical segments. Further, the extractor element 810 and the scattering element 820 can be injection molded in a multi-shot process. The extractor element 810 includes a flat surface 817 of annular shape. In some implementations, the annular surface 817 includes a reflector to reflect scattered light from the scattering element 820 to the exit surface of the extractor element 810. In other implementations, the annular surface 817 is uncoated and scattered light from the scattering element 820 can internally reflect at the annular surface 817 toward the exit surface of the extractor element 810, or transmit through the exit surface of the extractor element 810 to the ambient. The light output by the ASLV light-emitting device 800 through the annular surface 817 would be output as a backward portion of an intensity distribution.

The light-emitting element 860 is mounted on a top surface of the base 850. The scattering element 820 defines an aperture aligned with the inner diameter of the annular surface 817 to accommodate the base 850 so that substantially all light from the light-emitting element 860 is emitted into the recovery enclosure 840 during operating conditions. The base 850 protrudes inside the recovery enclosure 840 and is shaped as a truncated cone or pyramid. Side surface of the base 850 is arranged to face the recovery enclosure 840 and has a reflecting coating configured to reflect yellow and blue light back-scattered from the scattering element 820. In this manner, the recovery enclosure 840 is formed by a combination of a light-entry surface of the scattering element 820 and the reflecting side surface of the protruded base 850.

Light that propagates from the recovery enclosure 840 into the scattering element 820 is subject to some reflection depending on angle of incidence due to Fresnel losses but is not subject to total internal reflection as the scattering element 820 is optically denser than the low-index medium inside the recovery enclosure 840. Light from inside the scattering element 820 that is directed back at the recovery enclosure 840 and does not undergo TIR, will escape from the scattering element 820 into the recovery enclosure 840. Short of being absorbed, both types of light will propagate through the recovery enclosure 840 and either (i) impinge somewhere else on the scattering element 820 and may be recycled back into the light output by the ASLV light-emitting device 800, or (ii) undergo a single reflection on the side surface of the base 850 before re-entering the scattering element 820, or (iii) impinge on the light-emitting device 860 and be likely converted into heat. Depending on the size of the light-emitting device 860 relative to the diameter of the scattering element 820, the likelihood that back-scattered light may be lost to heat can be relatively small and the optical efficiency of the ASLV light-emitting device 800 can be relatively high.

An exit surface of the extractor element 810 is spherical and has a radius R1. The scattering element 820 is disposed concentric with the extractor element 810 within a portion of space defined by a notional sphere of Brewster radius, $R_{OB}$. In the example illustrated in FIG. 8, an optical interface formed between the scattering element 820 and the extractor element 810 is substantially the Brewster sphere. This means that light that is incident on the exit surface of the extractor element 810 emanating from the scattering element 820 satisfies the Brewster condition, and is limited to angles of incidence at the exit surface greater than the Brewster angle. Light that scatters from the scattering element 820 into the extractor element 810 will not undergo TIR at the exit surface as the ASLV light-emitting device 800 satisfies the Brewster condition. Due to Fresnel reflections, only a portion of such light, however, will transmit into an ambient region of the ASLV light-emitting device 800. The portion that is reflected back will interact with the scattering element 820 and propagate accordingly.

Figure 9A:
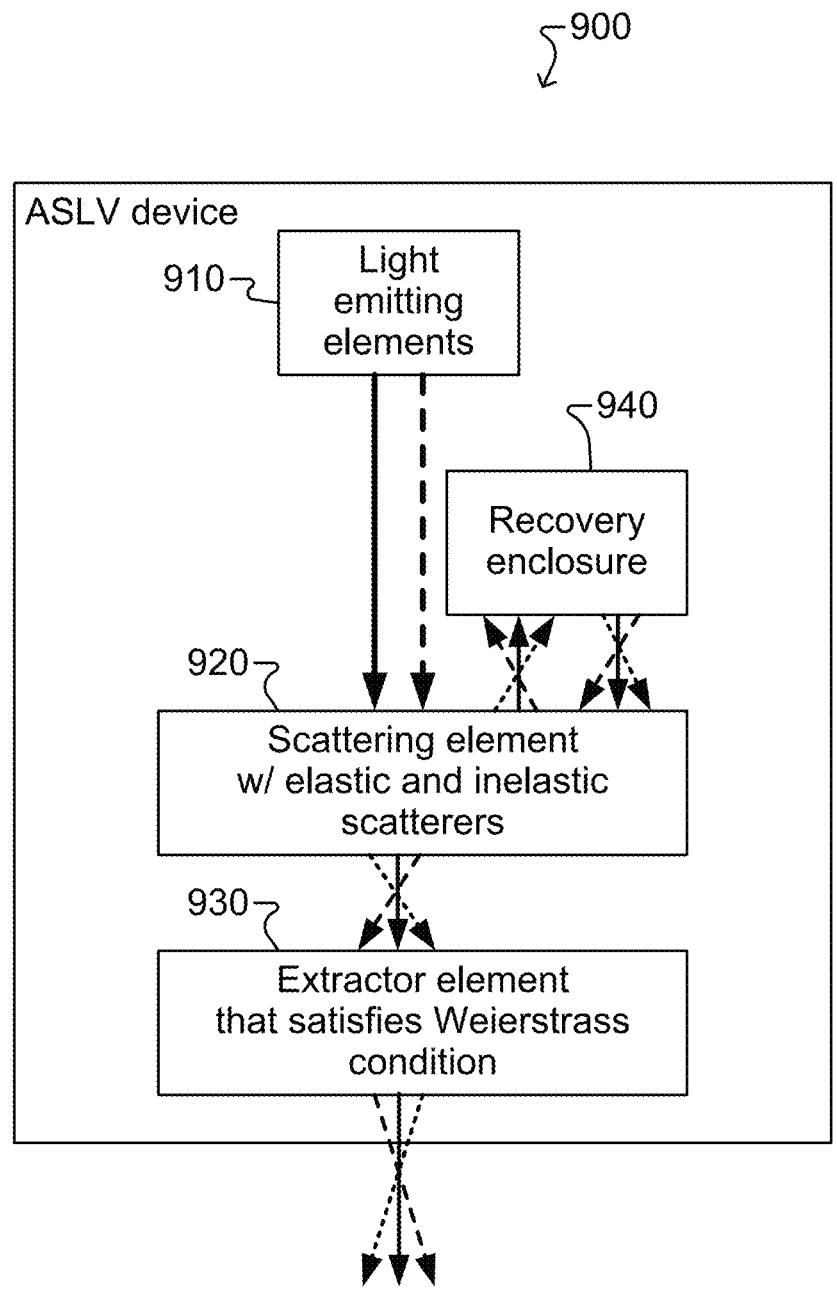
FIG. 9A is a schematic diagram of an example of an ASLV light-emitting device having multiple light-emitting devices and a scattering element with elastic and inelastic scattering centers.

While the foregoing embodiments of ASLV light-emitting devices each include a single light-emitting element, embodiments can, in general, include more than one light-emitting element. Referring to FIG. 9A, an ASLV light-emitting device 900 includes first and second light-emitting elements 910. ASLV light-emitting device 900 further includes a scattering element 920 (also referred to as a first optical element), an extractor element 930 (also referred to as a second optical element), and a recovery enclosure 940.

The first light-emitting element is configured to provide light having a first spectral power distribution during operation, and the second light-emitting element is configured to provide light having a second spectral power distribution different from the first spectral power distribution during operation. Spectral power distribution of light emitted by the first light-emitting element (also referred to as pump light) can be blue, and spectral power distribution of light emitted by the second light-emitting element can be red, for instance. The scattering element 920 has a first surface (also referred to as a light-entry surface) spaced apart from the first and second light-emitting elements 910 and is positioned to receive the light from the first and second light-emitting elements 910. The scattering element 920 includes inelastic scattering centers arranged to convert the blue light from the first light-emitting element into converted light, e.g., yellow light, that is substantially isotropically scattered, and elastic scattering centers arranged to substantially isotropically scatter the light from the second light-emitting element. In this manner, the scattering element 920 provides mixed light including the red scattered light from the second light-emitting element and the yellow converted light, such that the mixed light has a mixed spectral power distribution (that includes yellow and red). In some implementations, the elastic scattering centers of the scattering element 920 further substantially isotropically scatter a portion of the light from the first light-emitting element. In such case, the scattering element 920 provides mixed light including the red scattered light from the second light-emitting element, blue scattered light from the first light-emitting element, and the yellow converted light, such that the mixed light has a mixed spectral power distribution (that includes blue, yellow and red).

Figure 9B:
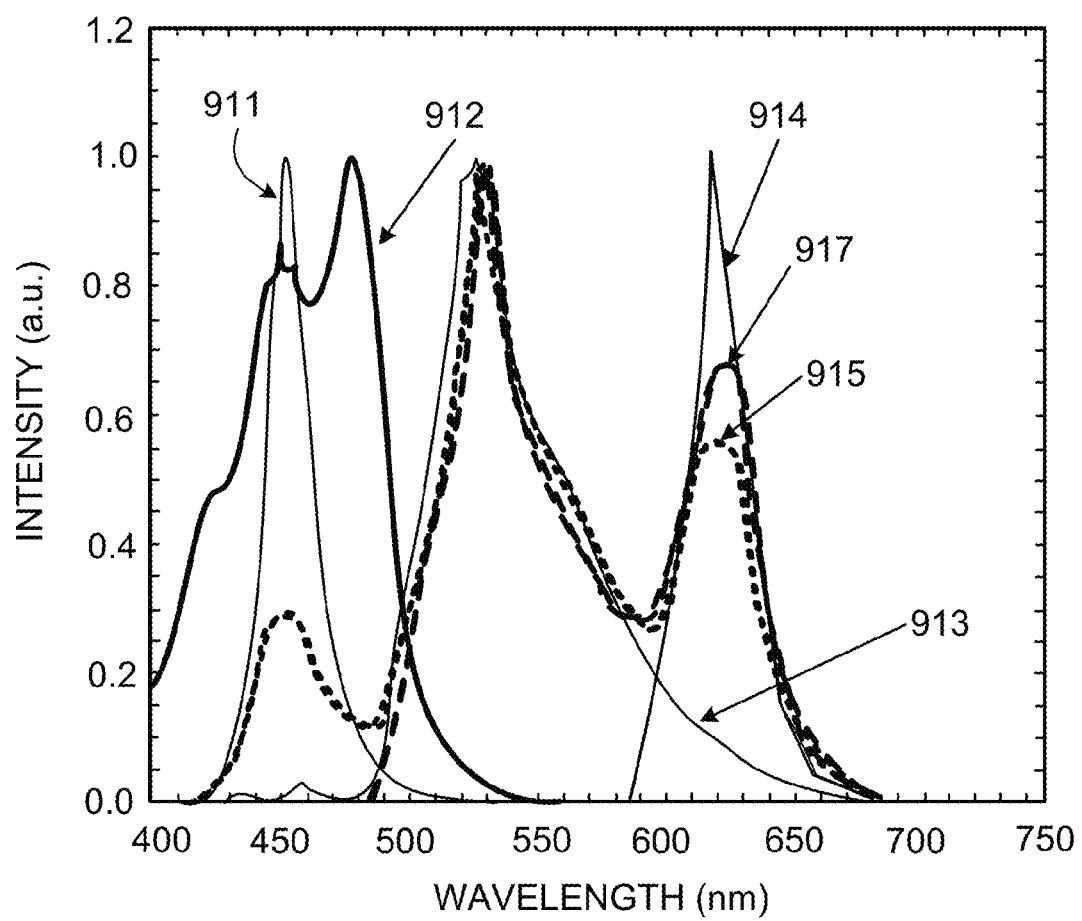
FIG. 9B shows examples of spectra of output light of ASLV light-emitting devices including a scattering element with elastic and inelastic scattering centers.

FIG. 9B shows an emission spectrum 911 for a blue LED and another emission spectrum 914 for a red LED. The blue and red LEDs can be used as the first and second light-emitting elements, respectively, in the ASLV light-emitting device 900. Further, FIG. 9B shows an absorption spectrum 912 and an emission spectrum 913 of the inelastic scattering centers. The emission spectrum 913 of the inelastic scattering centers corresponds to the spectrum of the converted light. Spectral power distribution of the scattered red light or blue light is the same as the spectral power distribution of the second light-emitting element or the first light-emitting element, respectively (corresponding to the spectra 914 or 911, respectively.) Moreover, the absorption spectrum of the scattering centers 912 overlaps the spectrum of the light emitted by the first light-emitting element 910. Spectral power distribution of the converted light is different from the pump light. For instance, the converted light will have a spectrum 913 that is shifted (e.g., Stokes shifted) to longer wavelengths than the pump light spectrum 911. For example, where the pump light is blue, e.g., corresponding to the spectrum 911, the converted light can be characterized by an overall yellow/amber color, e.g., corresponding to the spectrum 913. Furthermore, FIG. 9B shows a spectrum of the mixed light 915 (represented with a dashed-line) corresponding to a case when the blue pump light is fully converted to yellow light. In this case, the spectrum of the mixed light 915 is a combination of the spectrum 914 of the elastically scattered red light and the spectrum 913 of the converted yellow light. Additionally, FIG. 9B shows another spectrum of the mixed light 917 (represented with a dotted-line.) The spectrum of the mixed light 917 is a combination of the spectra 911 and 914 of the elastically scattered blue and red light and the spectrum 913 of the converted yellow light.

Referring again to FIG. 9A, the extractor element 930 is formed from a transparent material having an exit surface. The exit surface is generally a curved, transparent surface. In other words, changes in the mixed light passing through the exit surface can generally be described by Snell's law of refraction, as opposed to, for example, an opaque or diffuse surface where scattering of transmitted light occurs. The extractor element 930 is in contact with the scattering element 920, such that there is an optical interface between the scattering and extractor elements at the place of contact, and the optical interface is opposite the first surface of the scattering element 920. Moreover, the extractor element 930 is arranged so that a portion of the mixed light enters the extractor element 930 through the optical interface.

Further, the ASLV light-emitting device 900 includes a medium adjacent the first surface of the scattering element 920 having a refractive index n0, and the scattering element 920 includes a material having a first refractive index n1, where n0<n1. The transparent material has a refractive index, n2, where n0<n2. Furthermore, the recovery enclosure 940 encloses the medium adjacent the first surface of the scattering element 920. The recovery enclosure 940 is arranged and configured to recover a portion of the mixed light that propagates through the first surface into the medium. In some implementations, the exit surface of the extractor element 930 is a transparent surface that is shaped such that an angle of incidence on the exit surface of the mixed light provided by the scattering element 920 that directly impinges on the exit surface is less than the critical angle for total internal reflection. In this case, the extractor element 930 is said to satisfy the Weierstrass condition, as described above in connection with FIG. 1A. In some implementations, the exit surface of the extractor element 930 is shaped such that an angle of incidence on the exit surface of the mixed light provided by the scattering element 920 that directly impinges on the exit surface is less than the Brewster angle. In this case, the extractor element 930 is said to satisfy the Brewster condition, as described above in connection with FIG. 1A. Additionally, the ASLV light-emitting device 900 outputs a predetermined portion of the mixed light through the exit surface into the ambient environment. As described above, examples of spectra 915 and 917 of the light output by the ASLV light-emitting device 900 are shown in FIG. 9B.

Figure 10A:
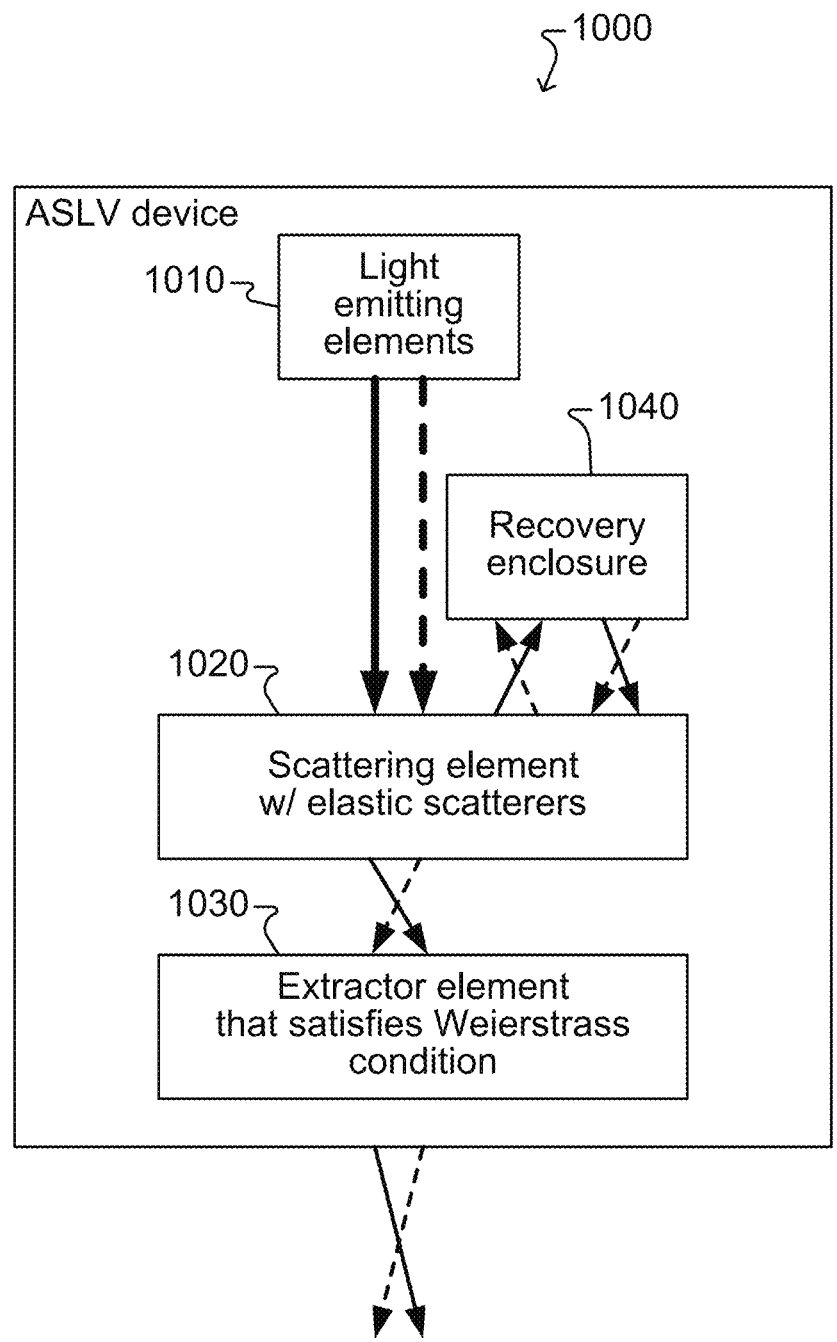
FIG. 10A is a schematic diagram of an example of an ASLV light-emitting device having multiple light-emitting devices and a scattering element including elastic scattering centers.

While the foregoing embodiments of ASLV light-emitting devices include multiple light-emitting elements in combination with a scattering element that contains elastic and inelastic scattering centers, embodiments can, in general, include multiple light-emitting elements in combination with a scattering element that contains only elastic scattering centers. FIG. 10A shows a diagram of an example of yet another ASLV light-emitting device 1000 that includes first and second light-emitting elements 1010, a scattering element 1020 (also referred to as a first optical element), an extractor element 1030 (also referred to as a second optical element), and a recovery enclosure 1040.

The first light-emitting element is configured to provide light having a first spectral power distribution during operation, and the second light-emitting element is configured to provide light having a second spectral power distribution different from the first spectral power distribution during operation. Spectral power distribution of light emitted by the first light-emitting element can be blue, and spectral power distribution of light emitted by the second light-emitting element can be red, for instance. The scattering element 1020 has a first surface (also referred to as a light-entry surface) spaced apart from the first and second light-emitting elements 1010 and positioned to receive the light from the first and second light-emitting elements 1010. The scattering element 1020 includes elastic scattering centers arranged to substantially isotropically scatter the light from the first and second light-emitting elements 1010 and provide mixed light including blue light from the first light-emitting element and red light from the second light-emitting element, such that the mixed light has a mixed spectral power distribution (that includes blue and red.) In some implementations, the ASLV light-emitting device 1000 includes a third and fourth light-emitting elements configured to provide light respectively having third and fourth spectral power distributions during operation. For example, the third spectral power distribution is green, and the fourth spectral power distribution is yellow. In this case, the elastic scattering centers of the scattering element further substantially isotropically scatter the light from the third and fourth light-emitting elements. In such case, the scattering element 1020 provides mixed light including the red scattered light from the second light-emitting element, blue scattered light from the first light-emitting element, green scattered light from the third light-emitting element, and yellow scattered light from the fourth light-emitting element, such that the mixed light has another mixed spectral power distribution (that includes blue, green, yellow and red).

Figure 10B:
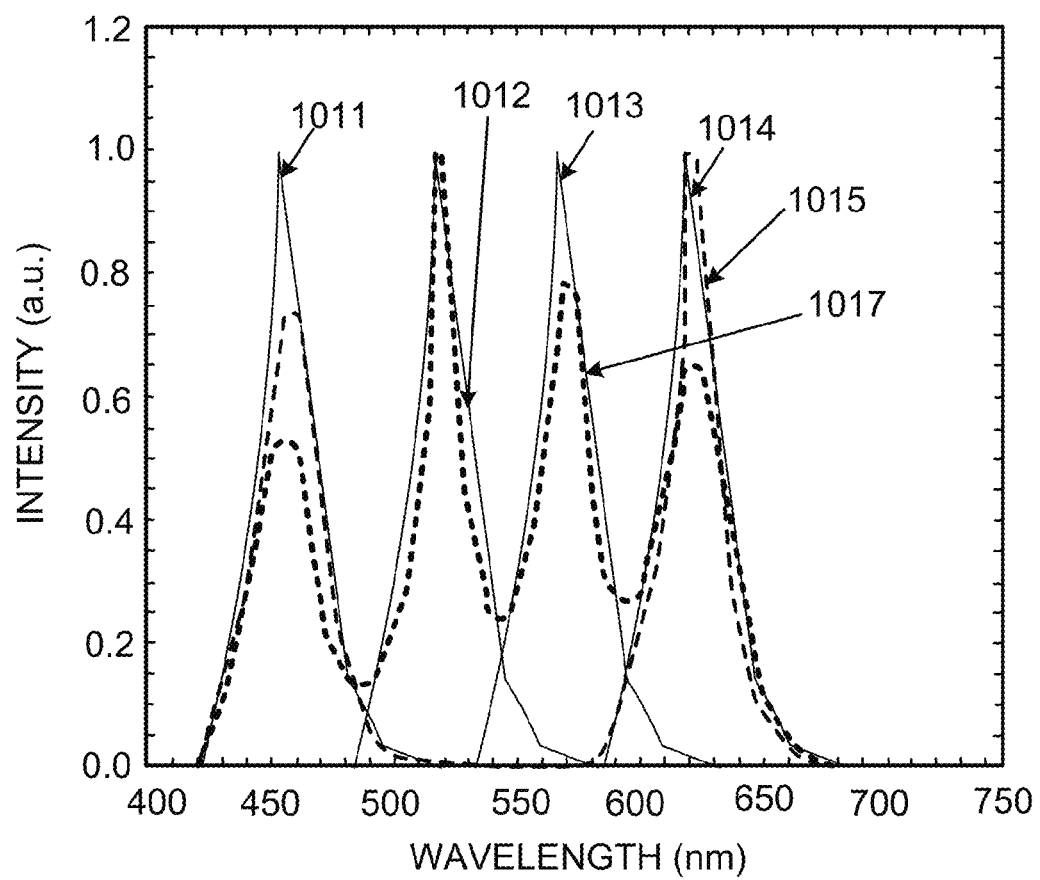
FIG. 10B shows examples of spectra of output light of ASLV light-emitting devices including a scattering element with elastic scattering centers.

FIG. 10B shows an emission spectrum 1011 for a blue LED and another emission spectrum 1014 for a red LED. The blue and red LEDs can be used as the first and second light-emitting elements, respectively, in the ASLV light-emitting device 1000. Further, FIG. 9B shows a spectrum of the mixed light 1015 (represented with a dashed-line) corresponding to a case when the ASLV light-emitting device includes blue and red LEDs. In this case, the spectrum of the mixed light 1015 is a combination of the spectra 1011 and 1014 of the elastically scattered blue and red light. Additionally, FIG. 10B shows an emission spectrum 1012 for a green LED and another emission spectrum 1013 for a yellow LED. The green and yellow LEDs can be used as the third and fourth light-emitting elements, respectively, along with the blue and red LEDs in the ASLV light-emitting device 1000. Furthermore, FIG. 10B shows another spectrum of the mixed light 1017 (represented with a dotted-line) corresponding to the case when the light-emitting device includes blue, green, yellow and red LEDs. In this case, the spectrum of the mixed light 1017 is a combination of the spectra 1011, 1012, 1013 and 1014 of the elastically scattered blue, green, yellow and red light.

Returning to FIG. 10A, the extractor element 1030 is formed from a transparent material having an exit surface. The exit surface is generally a curved, transparent surface. In other words, changes in the mixed light passing through the exit surface can generally be described by Snell's law of refraction, as opposed to, for example, an opaque or diffuse surface where scattering of transmitted light occurs. The extractor element 1030 is in contact with the scattering element 1020, such that there is an optical interface between the scattering and extractor elements at the place of contact, and the optical interface is opposite the first surface of the scattering element. Moreover, the extractor element 1030 is arranged so that a portion of the mixed light enters the extractor element 1030 through the optical interface.

Further, the ASLV light-emitting device 1000 includes a medium adjacent the first surface of the scattering element 1020 having a refractive index n0, and the scattering element includes a material having a first refractive index n1, where n0<n1. The transparent material has a refractive index n2, where n0<n2. Furthermore, the recovery enclosure 1040 encloses the medium adjacent the first surface of the scattering element 1020. The recovery enclosure 1040 is arranged and configured to recover a portion of the mixed light that propagates through the first surface into the medium. In some implementations, the exit surface is a transparent surface that is shaped such that an angle of incidence on the exit surface of the mixed light provided by the scattering element 1020 that directly impinges on the exit surface of the extractor element 1030 is less than the critical angle for total internal reflection. In this case, the extractor element 1030 is said to satisfy the Weierstrass condition, as described above in connection with FIG. 1A. In some implementations, the exit surface is shaped such that an angle of incidence on the exit surface of the mixed light provided by the scattering element 1020 that directly impinges on the exit surface of the extractor element 1030 is less than the Brewster angle. In this case, the extractor element 1030 is said to satisfy the Brewster condition, as described above in connection with FIG. 1A. Additionally, the ASLV light-emitting device 1000 outputs mixed light through the exit surface into the ambient environment. As described above, examples of spectra 1015 and 1017 of the light output by the ASLV light-emitting device 1000 are shown in FIG. 10B.

Figure 11:
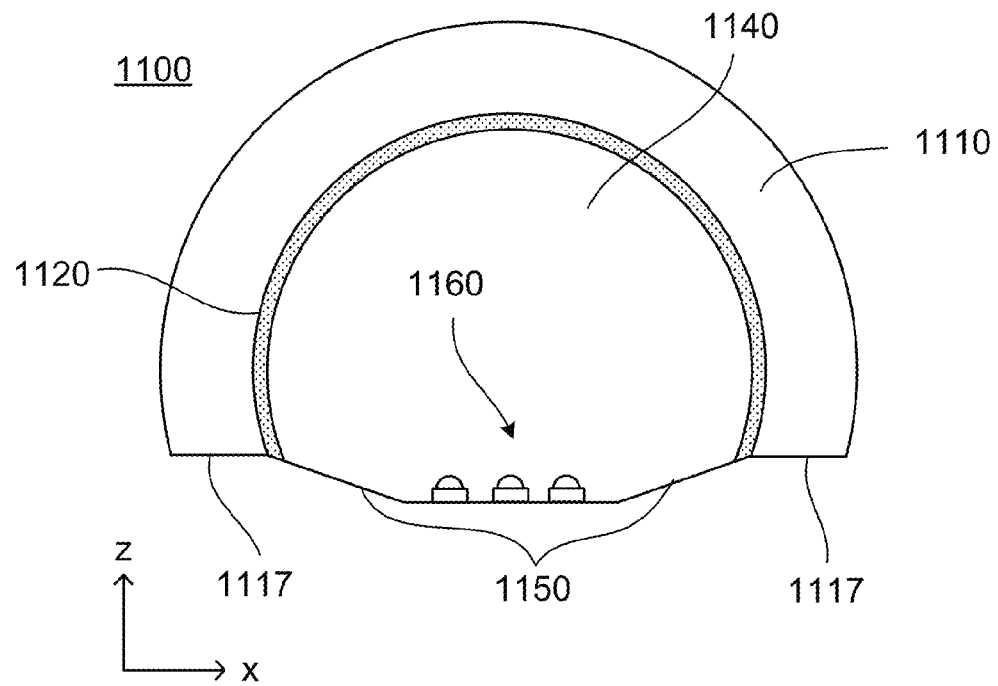
FIG. 11 shows an example of a light-emitting device having multiple light-emitting devices, a concave scattering element, and a recovery enclosure with a recessed base.

FIG. 11 shows such an ASLV light-emitting device 1100 having multiple light-emitting devices 1160. In addition, the ASLV light-emitting device 1100 includes a concave scattering element 1120, and a recovery enclosure 1140 with a recessed base. The ASLV light-emitting device 1100 has a generally spherical configuration. The light-emitting devices 1160 include pump (e.g., blue) LED packages and red LED packages operatively disposed on a substrate with a recess. The surface 1150 adjacent the LED packages is formed as a recessed dish and is specular reflective to effectively direct light impinging thereon back into the recovery enclosure 1140. This surface 1150 may also be diffuse or mixed diffuse-specular reflective. The LED packages are disposed in the recess of the substrate. The shape of the substrate can be varied to affect beam shaping.

The scattering element 1120 includes active and passive scattering centers. The active scattering centers are configured to convert (inelastically scatter) the light provided by the light-emitting device 1160 to yellow/amber light, and the passive scattering centers are configured to elastically scatter the pump light and the red light. In this manner, the scattering element 1120 mixes the converted yellow/amber light with the scattered blue and red light to generate white light. The extractor element 1110 and the scattering element 1120 may be formed in a multi-shot molding process. The ASLV light-emitting device 1100 further includes diffuse reflective layers 1117 and a passive cooler. The ASLV light-emitting device 1100 may further include for example one or more sockets for establishing an electromechanical connection to a source of power, drive electronics, electrical connections and one or more heat sinks. The ASLV light-emitting device 1100 may be configured as a replacement for light bulbs of various sizes and configurations.

In this example, the extractor element 1110 and the scattering element 1120 are configured as nesting spherical shells. The scattering element 1120 forms a hollow, recovery enclosure 1140 that is filled with a low-index medium, for example air or inert gas. The extractor element 1110 defines an aperture bordered by the diffuse reflective layers 1117. The scattering element 1120 substantially abuts the sides of the light-emitting device 1160 so that substantially all light from the light-emitting device is emitted into the recovery enclosure 1140 during operating conditions. The section of the spherical shells, that is the particular angular portion of an otherwise full spherical shell, can be varied to affect beam shaping and mixing of light provided by the ASLV light-emitting device 1100. The inclination of the surfaces of the extractor element 1110 that are coupled with the reflective layers 1117 and/or the recess in the substrate of the light-emitting device 1160 may be different than illustrated. Such surfaces may also be non-planar to reflect light in a predetermined manner different from planar surfaces to affect efficiency and beam shaping.

In this example, the scattering element 1120 is disposed concentric with the extractor element 1110 within a portion of space defined by a notional sphere of radius R/n wherein R is the radius of the exit surface of the extractor element 1110. In this example, the scattering element 1120 has the shape of a spherical shell with an outer radius R/n. It is noted that the scattering element 1120 may have an outer radius that is smaller or larger than R/n. It is also noted that all or portions of the scattering element 1120 may be disposed outside the notional concentric sphere of R/n. Generally, the more the scattering element 1120 extends into the space outside of the notional concentric sphere of radius R/n, the more TIR may occur at the exit surface of the extractor element 1110. It is further noted, that the scattering element 1120 may have a non-spherical shape, for example a body with regular or irregular polygonal facets. It is also noted that the extractor element of other examples may have a generally curved but non-spherical and non-cylindrical exit surface, as described below in this specification.

Figure 12:
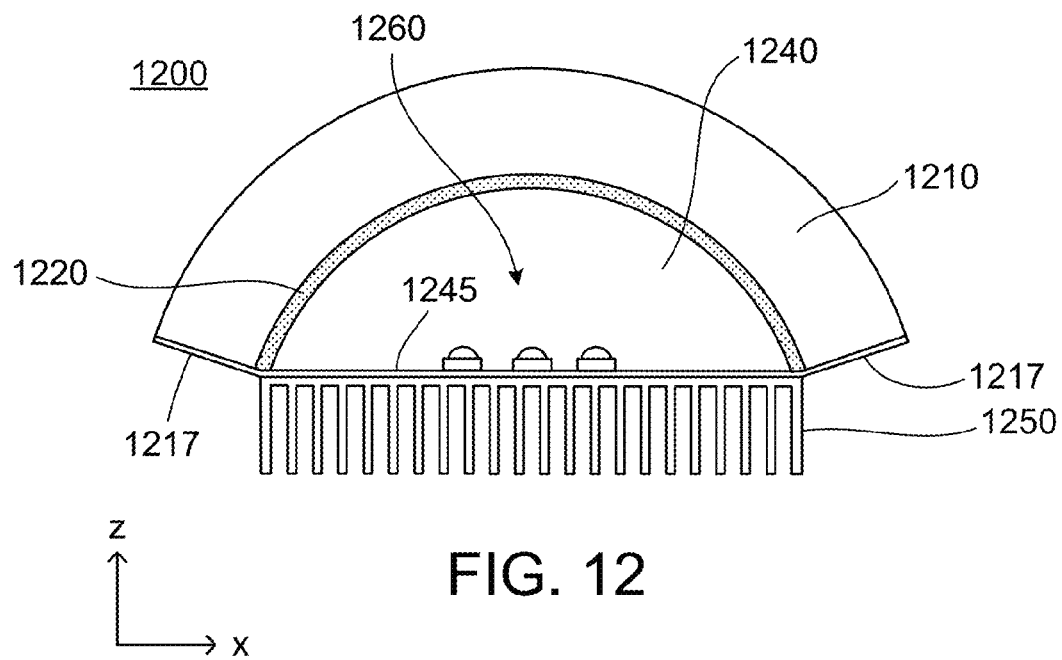
FIG. 12 shows an example of a light-emitting device having multiple light-emitting devices and a concave scattering element.

FIG. 12 shows another example of an ASLV light-emitting device 1200 having multiple light-emitting devices 1260 and a concave scattering element 1220. In this example, the ASLV light-emitting device 1200 has an elongate, e.g., along the y-axis perpendicular to the page, generally cylindrical configuration and includes an extractor element 1210 in addition to the scattering element 1220 and the multiple light-emitting devices 1260. The light-emitting devices 1260 include blue and red LED packages operatively disposed on a generally planar substrate. The surface of the substrate 1245 between the LED packages can have a specular reflective, a diffuse reflective, a mixed specular and diffuse reflective, or other reflective coating to effectively direct light impinging thereon back into the recovery enclosure 1240. The scattering element 1220 includes active and passive scattering centers and is configured to convert the light provided by the light-emitting device 1260 to generate white light as described above in connection with FIGS. 9-11. The extractor element 1210 and the scattering element 1220 may be formed by extrusion. The ASLV light-emitting device 1200 further includes reflective layers 1217 and a passive cooler 1250. The ASLV light-emitting device 1200 may further include for example one or more sockets for establishing an electromechanical connection to a source of power, drive electronics and electrical connections. The ASLV light-emitting device 1200 may be configured as a replacement for a fluorescent tube or a combination of a fluorescent tube and troffer.

The extractor element 1210 and the scattering element 1220 are configured as nesting cylindrical shells. The scattering element 1220 forms a hollow, recovery enclosure 1240 that is filled with a low-index medium, for example air or inert gas. The extractor element 1210 defines an aperture bordered by reflective layers 1217. The scattering element 1220 substantially abuts the sides of the light-emitting devices 1260 so that substantially all light from the light-emitting devices is emitted into the recovery enclosure 1240 during operating conditions. The section of the cylindrical shells, that is the particular angular portion of an otherwise full cylindrical tube, can be varied to affect beam shaping and mixing of light provided by the ASLV light-emitting device 1200. The inclination of the surfaces of the extractor element 1210 that are coupled with the reflective layers 1217 may be different than illustrated. Such surfaces may also be non-planar to reflect light in a predetermined manner different from planar surfaces. As such the reflective layers 1217 may affect efficiency and further affect beam shaping.

The scattering element 1220 is disposed concentric with the extractor element 1210 within a portion of space defined by a notional cylinder of radius R/n wherein R is the radius of the exit surface of the extractor element 1210. In this example, the scattering element 1220 has the shape of a cylindrical shell with an outer radius R/n. It is noted that the scattering element may have an outer radius that is smaller or larger than R/n. It is also noted that all or portions of the scattering element may be disposed outside the notional concentric cylinder of R/n. Generally, the more the scattering element extends into the space outside of the notional concentric cylinder of radius R/n, the more TIR may occur at the exit surface of the extractor element 1210. It is further noted, that the scattering element 1220 may have a non-cylindrical cross section, for example a regular or irregular polygonal section.

Figure 13:
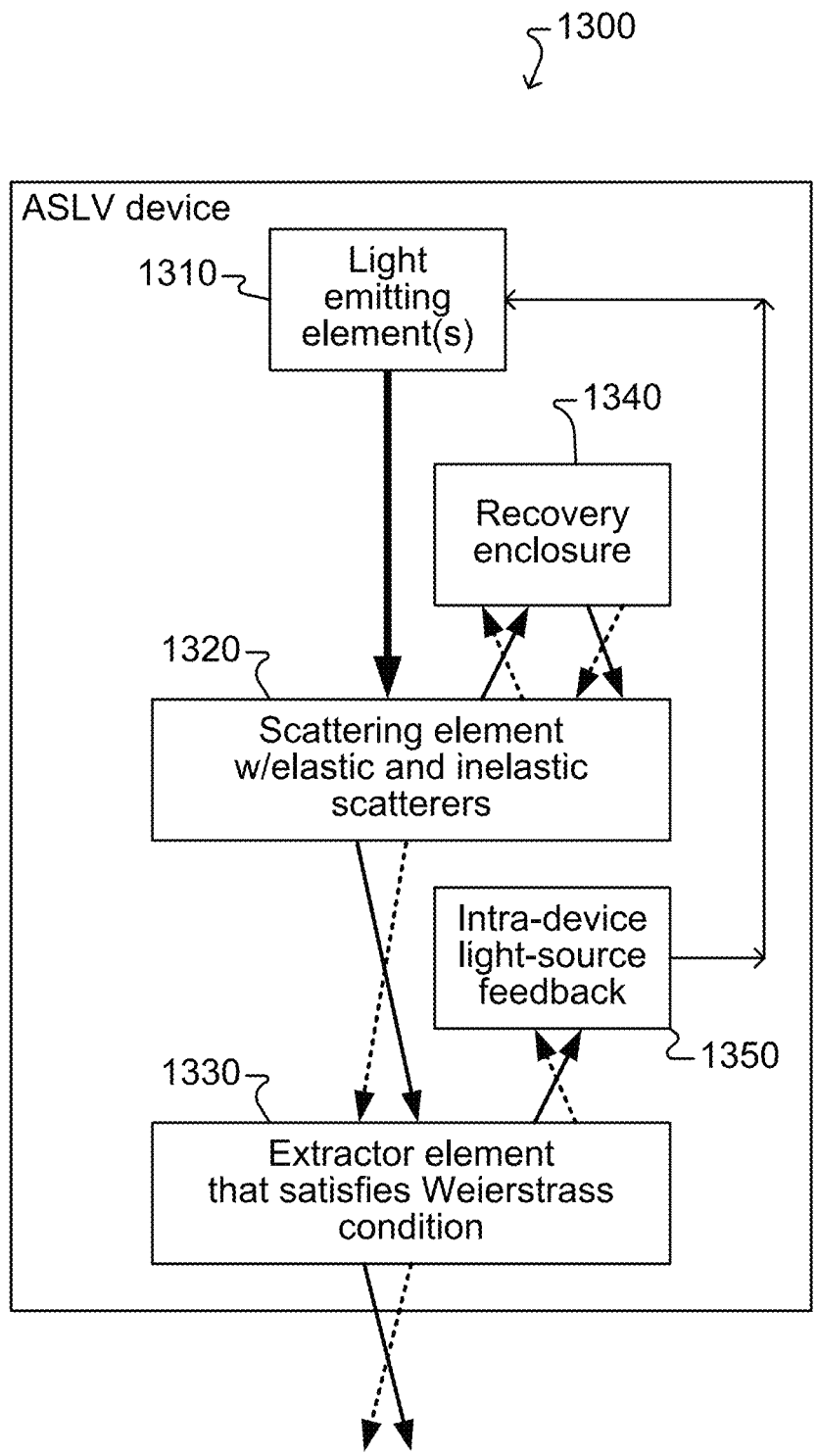
FIG. 13 is a schematic diagram of an example of an ASLV light-emitting device having an intra-system source feedback.

In general, embodiments of ASLV light-emitting devices can include components in addition to the light-emitting element(s), scattering element, extractor element and base structure. For example, FIG. 13 shows a schematic diagram of an example of an ASLV light-emitting device 1300 that includes an intra-system source feedback unit 1350, a light-emitting element 1310, a scattering element 1320 (also referred to as a first optical element), an extractor element 1330 (also referred to as a second optical element), and a recovery enclosure 1340.

The light-emitting element 1310 is configured to produce and emit light during operation. In a first case, the light-emitting element 1330 includes one or more blue LEDs. In a second case, the light-emitting element 1310 includes two or more different ones of red, green, blue or yellow LEDs. The scattering element 1320 has a first surface (also referred to as a light-entry surface) spaced apart from the light-emitting element 1310 and positioned to receive the light from the light-emitting element 1310. The scattering element 1320 includes scattering centers arranged to substantially isotropically scatter the light from the light-emitting element 1310 and to provide scattered light. The scattered light includes elastically scattered blue, green or red light and inelastically scattered blue light in the form of converted yellow light. Spectral power distribution of the elastically scattered light is the same as the spectral power distribution of the blue, green or red light, and spectral power distribution of the inelastically scattered light can be yellow, for instance. Spectra 111, 911, 1011, 1012, 1013, 1014 of the elastically scattered blue, green, yellow and red light and spectra 113, 913 of the inelastically scattered pump blue in the form of yellow light are shown in FIGS. 1B, 9B and 10B along with corresponding spectra the scattered light.

Referring again to FIG. 13, the extractor element 1330 is formed from a transparent material having an exit surface. The exit surface is generally a curved, transparent surface. In other words, changes in the scattered light passing through the exit surface can generally be described by Snell's law of refraction, as opposed to, for example, an opaque or diffuse surface where further scattering of transmitted light occurs. The extractor element 1330 is in contact with the scattering element 1320, such that there is an optical interface between the scattering and extractor elements at the place of contact, and the optical interface is opposite the first surface of the scattering element. Moreover, the extractor element 1330 is arranged so that light scattered through the optical interface enters the extractor element 1330.

Further, the ASLV light-emitting device 1300 includes a medium adjacent the first surface of the scattering element having a refractive index n0, and the scattering element 1320 includes a material having a first refractive index n1, where n0<n1. The transparent material has a refractive index n2, where n0<n2. In some implementations, the exit surface is a transparent surface that is shaped such that an angle of incidence on the exit surface of the scattered light that directly impinges on the exit surface is less than the critical angle for total internal reflection. In this case, the extractor element 1330 is said to satisfy the Weierstrass condition, as described above in connection with FIG. 1A. In some implementations, the exit surface is a transparent surface that is shaped such that an angle of incidence on the exit surface of the scattered light that directly impinges on the exit surface is less than the Brewster angle. In this case, the extractor element 1330 is said to satisfy the Brewster condition, as described above in connection with FIG. 1A. Furthermore, the recovery enclosure 1340 encloses the medium adjacent the first surface of the scattering element. The recovery enclosure 1340 is arranged and configured to recover a portion of the scattered light that propagates through the first surface into the medium. Additionally, the ASLV light-emitting device 1300 outputs scattered light through the exit surface into the ambient environment. As described above, the light output by the ASLV light-emitting device 1300 has a spectral power distribution corresponding to the spectrum 115 shown in FIG. 1B.

The intra-system source feedback unit 1350 includes a sensor arranged to receive a fraction of the portion of the scattered light prior to being output through the exit surface. The sensor is configured to provide a sensor signal based on the fraction of the portion of the scattered light. Moreover the sensor includes a color detector, an intensity detector, or a combination of both. For the first case when the light-emitting element 1310 includes one or more blue LEDs, the sensor is an intensity sensor and the sensor signal indicates intensity values corresponding to the scattered blue light and converted yellow light. For the second case when the light-emitting element 1310 includes two or more different ones of blue, green, yellow or red LEDs, the sensor is a color sensor and the sensor signal indicates color values corresponding to the mixed light. In the latter case, the color sensor may also be configured to provide an intensity signal to indicate intensity values of the mixed light.

In addition, the intra-system source feedback unit 1350 includes a control circuit in communication with the sensor and configured to adjust power applied to the light-emitting element 1310 in response to the sensor signal. In some implementations, the fraction of the portion of the scattered light received by the sensor corresponds to light reflected in the extractor element 1330 at the exit surface. For instance, the sensor can be arranged such that the light reflected in the extractor element 1330 at the exit surface received by the sensor originates from a large portion of the optical interface.

Figure 14:
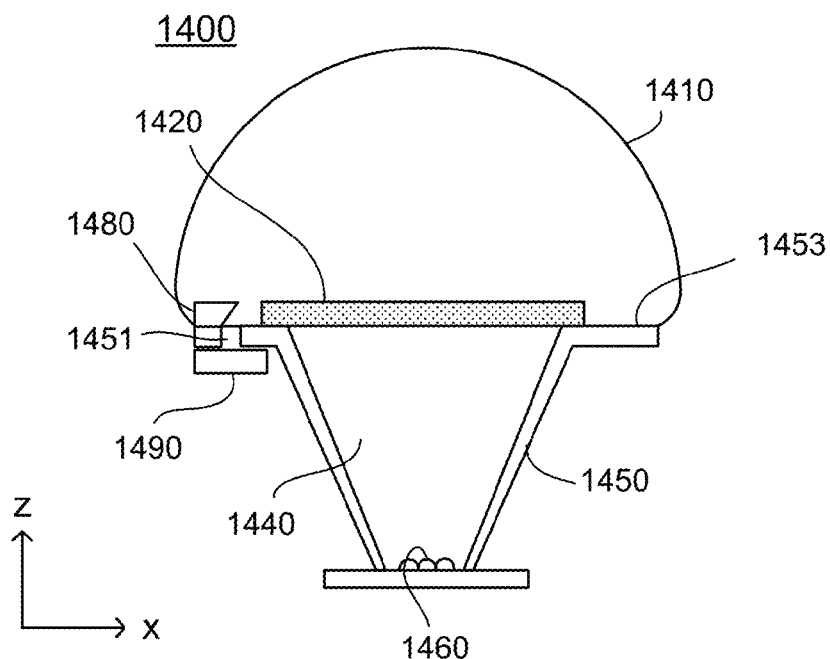
FIGS. 14-16 show configurations of intra-device feedback for light-emitting devices.

Turning now to specific embodiments of devices with intra-system feedback, FIG. 14 shows an ASLV light-emitting device 1400 including an example configuration of intra-device feedback. The ASLV light-emitting device 1400 includes an extractor element 1410, a scattering element 1420, an optical coupler 1450 and one or more detectors 1490. The ASLV light-emitting device 1400 further includes two or more of red, green, blue or yellow LEEs 1460. The scattering element 1420 includes passive scattering centers only.

The optical coupler 1450 is configured to redirect light from the LEEs 1460 to a predetermined angular range around the z-axis in order to provide suitable incidence thereof at the scattering element 1420. The optical coupler 1450 is further configured as a recovery enclosure of the ASLV light-emitting device 1400 to redirect predetermined amounts of light received from the scattering element 1420 back to the scattering element 1420. The optical coupler 1450 has a hollow configuration with a specular reflective inside 1440. The optical coupler has one or more diffuse reflective shoulders 1453.

The ASLV light-emitting device 1400 further includes one or more reflectors 1480. Each reflector 1480 is configured to redirect a portion of light that is emitted sideways from the scattering element 1420 towards corresponding ones of the one or more detectors 1490. The optical coupler 1450 has an opening or transparent section 1451 associated with each of the one or more reflectors 1480 to allow some light from the extractor element 1410 and/or the scattering element 1420 to pass to the detectors 1490.

The one or more detectors 1490 may be configured as RGB detectors. The extractor element 1410 may be configured as a Weierstrass sphere, cylinder or torus, for example. The LEEs 1460 are grouped by color and operatively interconnected with a suitable drive system (e.g., like the one described below in connection with FIG. 17.) The operative interconnection is configured to allow independent control of the LEEs 1460 by color. Each group of LEEs can include one or more LEEs 1460 of like color. The LEEs per groups may be interconnected in serial, parallel and/or both serial and parallel manners. The ASLV light-emitting device 1400 may have a rotationally symmetrical, elongate, toroidal or other configuration, for example.

As described herein, a suitably configured example ASLV light-emitting device can provide intra-lamp color mixing that is suitable to enable feedback control of independently addressable multi-color LEEs based on intra-lamp feedback. Each LEE provides a radiation pattern. Different color LEEs can have substantially different radiation patterns. Furthermore, different LEEs of like color also can have substantially different radiation patterns. Other complications can result from misalignments between the optical axes of different LEEs, which may be caused by the assembly process, inherent properties of the LEEs or other aspects, for example. Without the scattering element 1420, the resulting far-field variations would be difficult to specify and possibly result in undesired color variations as the root cause of this goes back to the difficulty of guaranteeing an identical angular distribution of every spectral component of white light. On the other hand, a properly configured ASLV light-emitting device 1400 can provide a color-independent angular intensity distribution on the downstream side of the scattering element 1420.

In this example, the detectors 1490 are disposed to sample scattered light downstream of the optical path after the scattering element 1420. The illustrated detector 1490 is positioned so it can detect portions of light that is emitted sideways from the edge of the scattering element 1420. Other detectors, if any, may be configured otherwise.

Such intra-lamp color sampling represents a valid color mix of the color distribution in the far field. A suitably configured scattering element 1420 can provide very efficient color mixing without the losses associated with scattering further downstream in the optical path. Intra-lamp sampling and feedback loops (e.g., like the ones described in connection with FIG. 17) avoid the wiring or wireless communications cost associated with far-field sampling. This may remove a significant impediment of realizing cost effective digital color tuning in broad segments of the general lighting market, for example.

Figure 15:
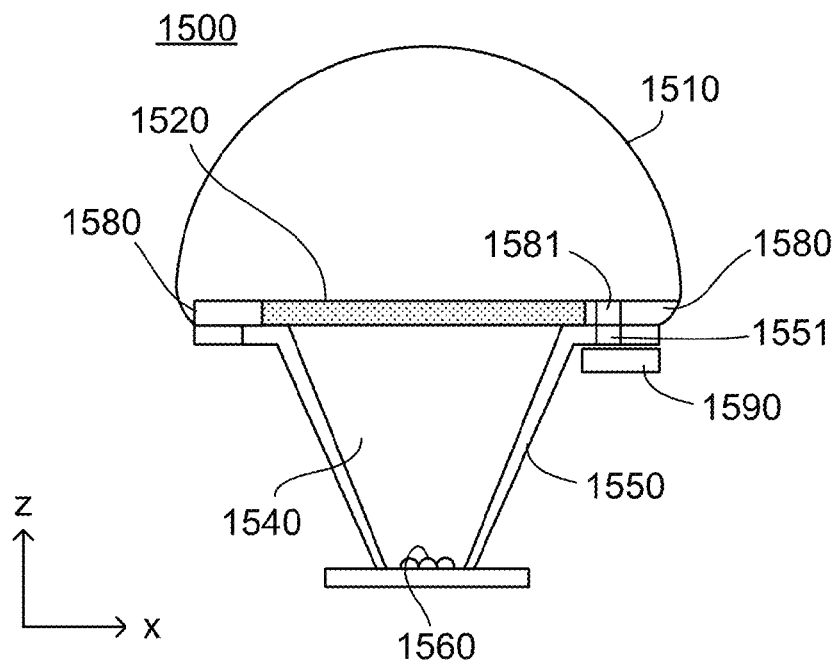

FIG. 15 shows an ASLV light-emitting device 1500 including another example configuration of intra-device feedback. The ASLV light-emitting device 1500 includes an optical element 1510, a scattering element 1520, an optical coupler 1550 and a detector 1590. The ASLV light-emitting device 1500 further includes one or more blue pumps and one or more red LEDs that form a light emitting element 1560. The scattering element 1520 is configured to scatter and to convert blue pump light into white light and to scatter red light without conversion. The scattering element 1520 includes active and passive scattering centers. The optical coupler 1550 is configured to collimate light from the LEE 1560 to a predetermined degree in order to provide suitable incidence thereof at the scattering element 1520.

The optical coupler 1550 optionally may be configured to provide good redirection of light from the scattering element 1520 back to the scattering element 1520. The optical coupler 1550 has a hollow configuration with a specular reflective inside 1540 and, hence, the optical coupler 1550 forms, in combination with the scattering element 1520, a recovery enclosure for the ASLV light-emitting device 1500. The ASLV light-emitting device 1500 further includes a reflector 1580 configured to reflect light from the extractor element 1510 and the scattering element 1520 (back) into the extractor element 1510. The reflector 1580 has an opening or transparent section 1581 associated with an opening or transparent section 1551 in the optical coupler 1550. The openings or transparent sections 1551 and 1581 allow some light from the optical element 1510 to pass to the detectors 1590.

In this example, one detector 1590 is provided and is configured as a CCT (correlated color temperature) detector to provide an indication of the CCT of the light in the extractor element 1510. The extractor element 1510 is configured as a Weierstrass sphere. The LEEs 1560 are grouped by color and operatively interconnected with a suitable drive system. The operative interconnection is configured to allow independent control of the LEEs 1560 by color. Each group of LEEs can include one or more LEEs 1560 of like color. The LEEs per groups may be interconnected in serial, parallel and/or both serial and parallel manners. The ASLV light-emitting device 1500 may have a rotationally symmetrical configuration. The drive system may be configured to allow feedback control of the CCT and flux output of the ASLV light-emitting device 1500.

The detector 1590 is disposed to sample scattered light downstream of the optical path after the scattering element 1520. The detector 1590 is positioned so it can detect portions of light that is reflected back into the optical element 1510 by Fresnel reflection at the outer surface of the optical element 1510.

According to another example the blue pump LEEs may be replaced with white LED packages. In such an example, the scattering element may be configured to merely scatter light.

Figure 16:
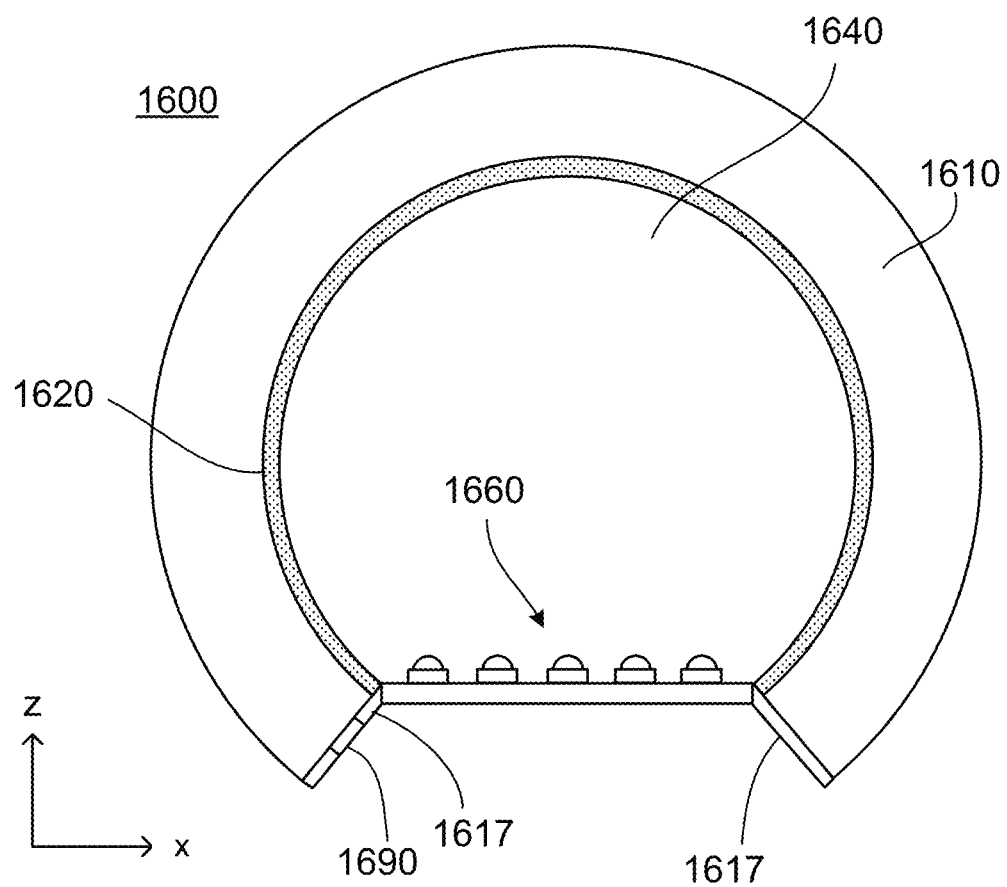

FIG. 16 shows an ASLV light-emitting device 1600 including yet another configuration of intra-device feedback. The ASLV light-emitting device 1600 has a generally toroidal configuration and includes an extractor element 1610, a scattering element 1620 and a light-emitting device 1660. The light-emitting device 1660 includes two or more of red, green, blue and yellow LED packages operatively disposed on a substrate. The surface of the substrate between the LED packages has a specular reflective coating to effectively direct light impinging thereon back into a recovery enclosure 1640. The scattering element 1620 includes passive scattering centers and is configured to mix the light provided by the light-emitting device 1660 to generate white light. The extractor element 1610 and the scattering element 1620 may be formed by extrusion. The ASLV light-emitting device 1600 further includes a detector 1690 and reflective layers 1617. The ASLV light-emitting device 1600 may further include for example one or more sockets for establishing an electromechanical connection to a source of power, drive electronics, electrical connections and cooling elements.

The extractor element 1610 and the scattering element 1620 are configured as nesting cylindrical shells. The scattering element 1620 forms a hollow, recovery enclosure

1640 that is filled with a low-index medium, for example air or inert gas. The extractor element 1610 defines an aperture bordered by reflective layers 1617. The scattering element 1620 substantially abuts the sides of the light-emitting device 1660 so that substantially all light from the light-emitting device 1660 is emitted into the recovery enclosure 1640 during operating conditions. The section of the cylindrical shells, that is the particular angular portion of an otherwise full cylindrical tube, can be varied to affect beam shaping and mixing of light provided by the ASLV light-emitting device 1600. The inclination of the surfaces of the extractor element 1610 that are coupled with the reflective layers 1617 may be different than illustrated. Such surfaces may also be non-planar to reflect light in a predetermined manner different from planar surfaces.

The scattering element 1620 is disposed concentric with the extractor element 1610 within a portion of space defined by a notional cylinder of radius R/n wherein R is the radius of the exit surface of the extractor element 1610. This configuration may be referred to as a cylindrical Weierstrass geometry and avoids TIR at the exit surface for all light that directly propagates in a plane perpendicular to the cylinder axis thereto from the optical junction the scattering element 1620. This geometry also avoids TIR for light that propagates in planes that are oblique to the plane perpendicular to the cylinder axis so long the critical angle for TIR is not exceeded.

The detector 1690 is configured as a CCT detector to provide an indication of the CCT of the light in the extractor element 1610. The detector 1690 is disposed to sample scattered light downstream of the optical path after the scattering element 1620. The LED packages of the light-emitting device 1660 are grouped by color and operatively interconnected with a suitable drive system. The operative interconnection is configured to allow independent control of the LED packages of the light-emitting device 1660 by color. A group of LED packages can include one or more LED packages of like color. The LED packages in a group may be interconnected in serial, parallel and/or both serial and parallel manners. The drive system may be configured to allow feedback control of the CCT and flux output of the ASLV light-emitting device 1600.

Figure 17:
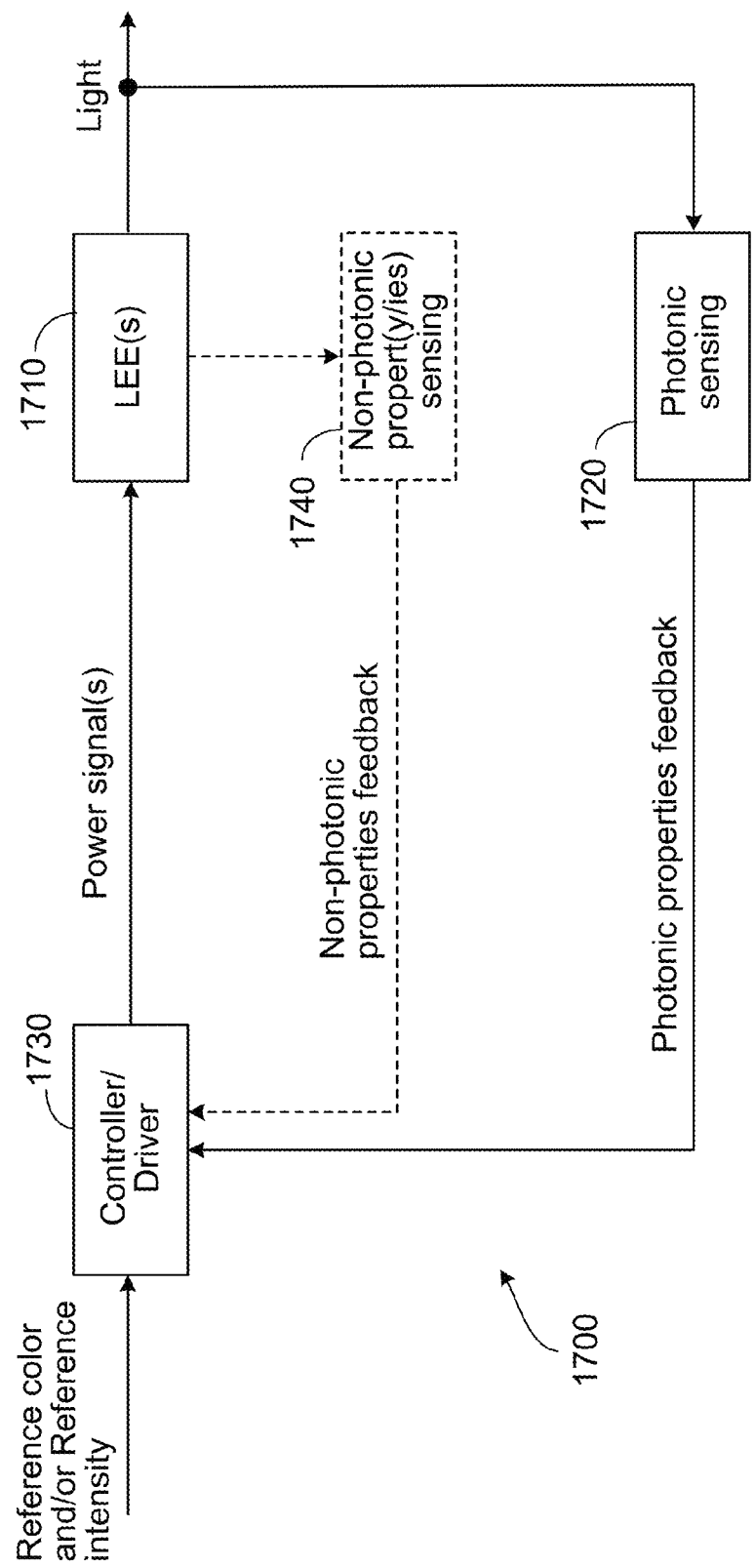
FIG. 17 is a schematic diagram of an example of a feedback circuit used to provide intra-device light-source feedback in an ASLV light-emitting device.

FIG. 17 shows a schematic diagram of a feedback circuit 1700 used to provide intra-system source feedback in an ASLV light-emitting device. In this example, the feedback circuit 1700 includes a photonic sensing unit 1720 and a controller 1730.

The photonic sensing unit 1720 is placed downstream from a scattering element of the ASLV light-emitting device to sense scattered light propagating within an extractor element of the ASLV light-emitting device. In some implementations, the photonic sensing unit 1720 can include a color detector, an intensity detector, or a combination of both. In some implementations, one or more of the detectors can be arranged such that mostly scattered light that is Fresnel-reflected at an exit interface of the extractor element is being sensed. Moreover, the one or more detectors can be arranged such that the scattered light reflected by the exit surface of the extractor element and received by the sensor originates from a large portion of an optical interface between the scattering element and the extractor element.

The controller unit 1730 can be implemented as hardware, software or a combination of both. For example, the controller unit 1730 can be implemented as a software driver executed by a specialized or general purpose chip. The controller unit 1730 parses sensing signals received from the photonic sensing unit 1720. Parsed signal values are compared by the controller unit 1730 to reference color values or reference intensity values, referred to as reference values. The controller unit 1730 accesses such reference values in one or more lookup tables, for instance. For example, the controller unit 1730 selectively transmits adjustment signals to a power driver to adjust relative power values for a combination of different color light-emitting elements 1710, in response to sensing that chromaticity of the scattered light propagating in the extractor element has changed. As another example, the controller unit 1730 selectively transmits adjustment signals to the power driver to adjust power values for one or more light-emitting elements 1710, in response to sensing that the intensity of the scattered light propagating in the extractor element has changed.

Optionally, the feedback circuit 1700 can include a non-photonic propert(y/ies) sensing unit 1740. Examples of non-photonic properties sensed by this unit are temperature, voltage drop, etc. In such implementations, the controller unit 1730 parses the non-photonic sensing signals received from the non-photonic propert(y/ies) sensing unit 1740 in combination with the photonic sensing signals received from the photonic sensing unit 1720. Values of the parsed combination of photonic and non-photonic sensing signals are used by the controller unit 1730 to transmit adjustment signals to the driver that drives the LEEs 1710.

Figure 18:
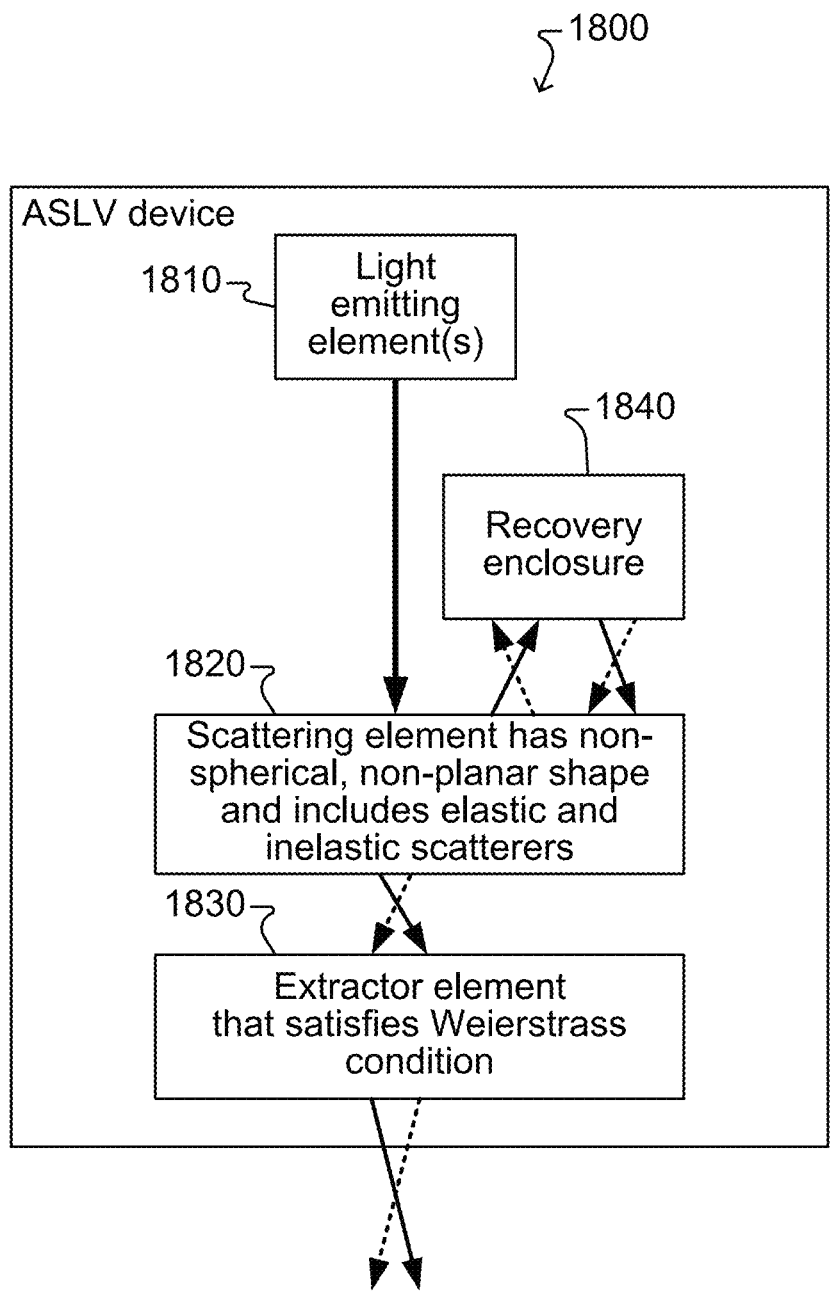
FIG. 18 is a schematic diagram of an example of an ASLV light-emitting device having a non-spherical, non-planar optical interface that controls intensity distribution of output light.

As described above in this specification, the shape of the scattering element can vary and examples of scattering elements having non-planar and non-spherical or cylindrical shapes are described above. In general, the shape of the scattering element can be selected to provide specific optical characteristics of the ASLV light-emitting device. For example, FIG. 18 shows a schematic diagram of an example of an ASLV light-emitting device 1800 that includes a light-emitting element 1810, a scattering element 1820 (also referred to as a first optical element), an extractor element 1830 (also referred to as a second optical element), and a recovery enclosure 1840.

The light-emitting element 1810 is configured to produce and emit light during operation. A spectral power distribution of light emitted by the light-emitting element 1810 (also referred to as pump light) can be blue, for instance. The spectral power distribution for visible light is referred to as chromaticity. The scattering element 1820 has a first surface (also referred to as a light-entry surface) spaced apart from the light-emitting element and positioned to receive the light from the light-emitting element 1810. The scattering element 1820 includes scattering centers arranged to substantially isotropically scatter the light from the light-emitting element and to provide scattered light. The scattered light includes elastically scattered pump light and inelastically scattered pump light. Spectral power distribution of the elastically scattered light is the same as the spectral power distribution of the pump light, and spectral power distribution of the inelastically scattered light can be yellow, for instance. A spectrum 111 of the elastically scattered pump light and a spectrum 113 of the inelastically scattered pump light are shown in FIG. 1B along with a spectrum 115 of the scattered light.

Referring again to FIG. 18, the extractor element 1830 is formed from a transparent material having an exit surface. The exit surface is generally a curved, transparent surface. In other words, changes in the scattered light passing through the exit surface can generally be described by Snell's law of refraction, as opposed to, for example, an opaque or diffuse surface where further scattering of transmitted light occurs. The extractor element 1830 is in contact with the scattering element 1820, such that there is an optical interface between the scattering and extractor elements at the place of contact, and the optical interface is opposite the first surface of the scattering element. Moreover, the extractor element 1830 is arranged so that light scattered through the optical interface enters the extractor element 1830.

Further, the ASLV light-emitting device 1800 includes a medium adjacent the first surface of the scattering element having a refractive index n0, and the scattering element 1820 includes a material having a first refractive index n1, where n0<n1. The transparent material has a refractive index n2, where n0<n2. In some implementations, the exit surface is a transparent surface that is shaped such that an angle of incidence on the exit surface of the scattered light that directly impinges on the exit surface is less than the critical angle for total internal reflection. In this case, the extractor element 1830 is said to satisfy the Weierstrass condition, as described above in connection with FIG. 1A. In some implementations, the exit surface is a transparent surface that is shaped such that an angle of incidence on the exit surface of the scattered light that directly impinges on the exit surface is less than the Brewster angle. In this case, the extractor element 1830 is said to satisfy the Brewster condition, as described above in connection with FIG. 1A. Furthermore, the recovery enclosure 1840 encloses the medium adjacent the first surface of the scattering element. The recovery enclosure 1840 is arranged and configured to recover a portion of the scattered light that propagates through the first surface into the medium.

Additionally, a combination of a shape of the exit surface of the second element and a non-spherical, non-planar shape of the optical interface is configured to (i) output scattered light through the exit surface, and (ii) control the intensity distribution of the output light. For example, the combination is configured to control directions of peak intensities of the output intensity distribution. In this manner, the output intensity distribution can be shaped to match an input requirement of a secondary optical system, for instance. Moreover, the light output by the ASLV light-emitting device 1800 has a spectral power distribution corresponding to the spectrum 115 shown in FIG. 1B.

Depending on the embodiment, the scattering element 1820 can be configured as one or more sheets having a thickness of down to 200 microns or less, it can be configured as one or more bodies with several millimeter long sides or diameters and a fraction of a millimeter thickness, or it can be configured as one or more dome-shaped or box-shaped objects of up to several centimeter size and a thickness of the order of down to a millimeter or thinner.

Figure 19A:
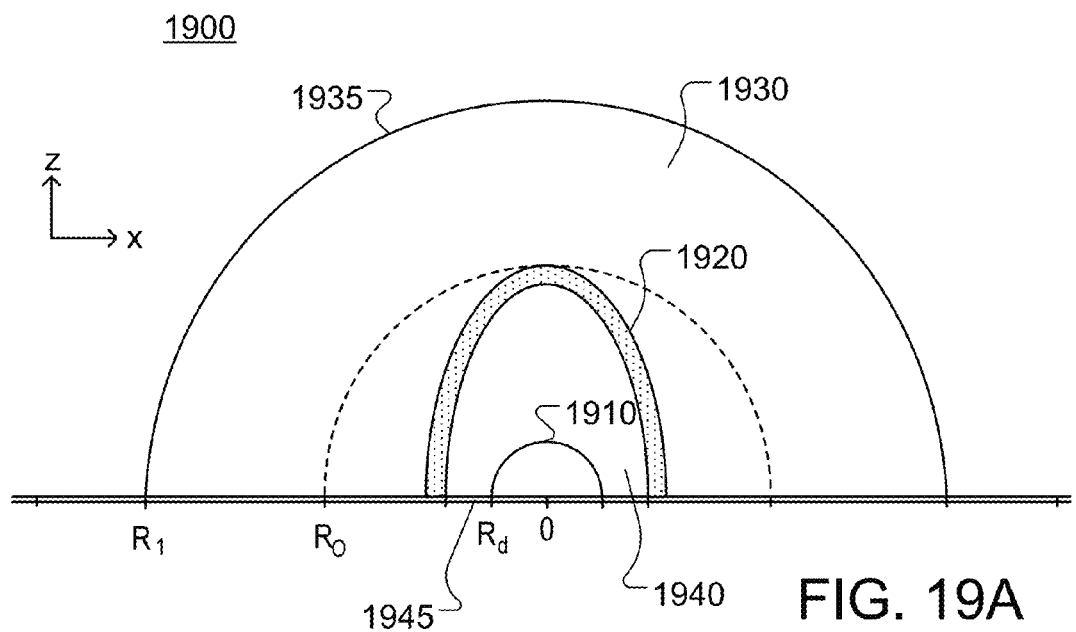
FIGS. 19A-19B show aspects of an example of a light-emitting device having an ellipsoidal scattering element.

In some embodiments, the scattering element is ellipsoidal in shape. FIG. 19A shows an ASLV light-emitting device 1900 having an ellipsoidal scattering element 1920. The extractor element 1930 has an exit surface 1935 of radius R1. In this example, the scattering element 1920 is shaped as an ellipsoidal segment with its long axis along the optical z-axis within a notional $R_O$ semi-sphere. In some implementations, the $R_O$ semi-sphere represents the Weierstrass sphere, while in other implementations the $R_O$ semi-sphere represents the Brewster sphere. A recovery cavity 1940 is formed from a light-entry surface of the scattering element 1920 and a planar reflector 1945. The recovery cavity 1940 is filled with a gas, e.g., air, or is evacuated. An index of refraction np of the scattering element 1920 is smaller than or equal to an index of refraction n1 of the extractor element 1930. A light-emitting element 1910 is located in an aperture of the planar reflector 1945 and emits light in the recovery cavity 1940. In some implementations, the planar reflector 1945 extends laterally to the outer edge of the scattering element 1920. In other implementations, the planar reflector 1945 extends laterally to the exit surface of the extractor element 1935. In other implementations, the planar reflector 1945 extends laterally farther out than the exit surface of the extractor element 1935, for example to a radius of 1.2×, 1.5× or 2.0×R1.

Figure 19B:
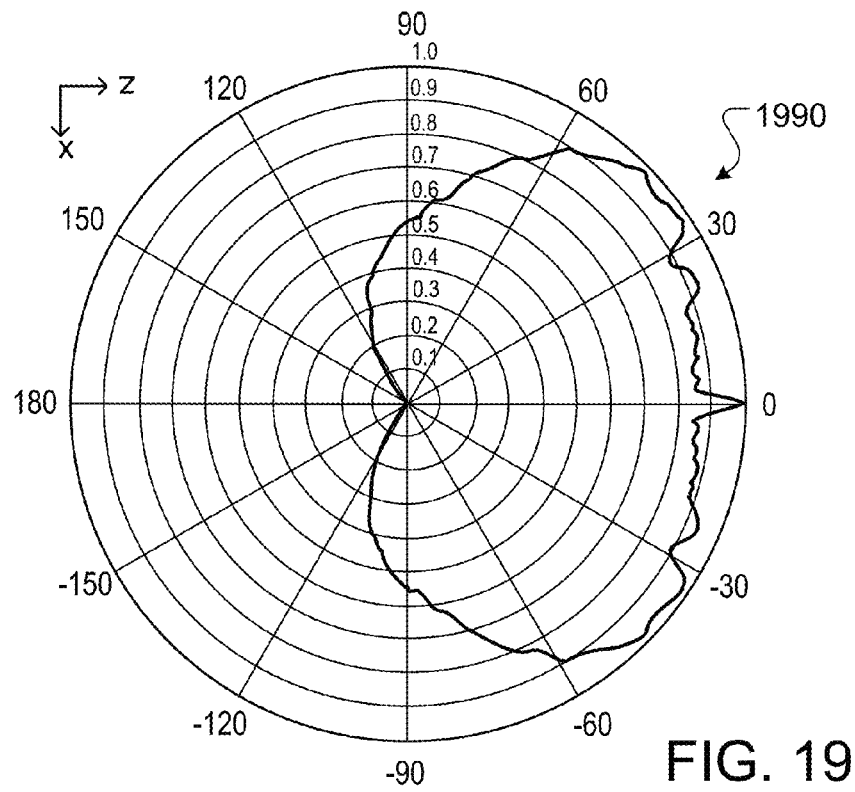

FIG. 19B shows an intensity distribution 1990 of light output by an ASLV light-emitting device similar to the ASLV light-emitting device 1900. The intensity distribution 1990 indicates that such an ASLV light-emitting device favors transverse (in the ±directions of the x-axis, simply referred to as lateral or side) emission at the expense of on-axis intensity (along the z-axis.) In general, the intensity distribution of light output by an ASLV light-emitting device is biased along a direction perpendicular to the largest cross-section of the extractor element 1920.

Figure 20A:
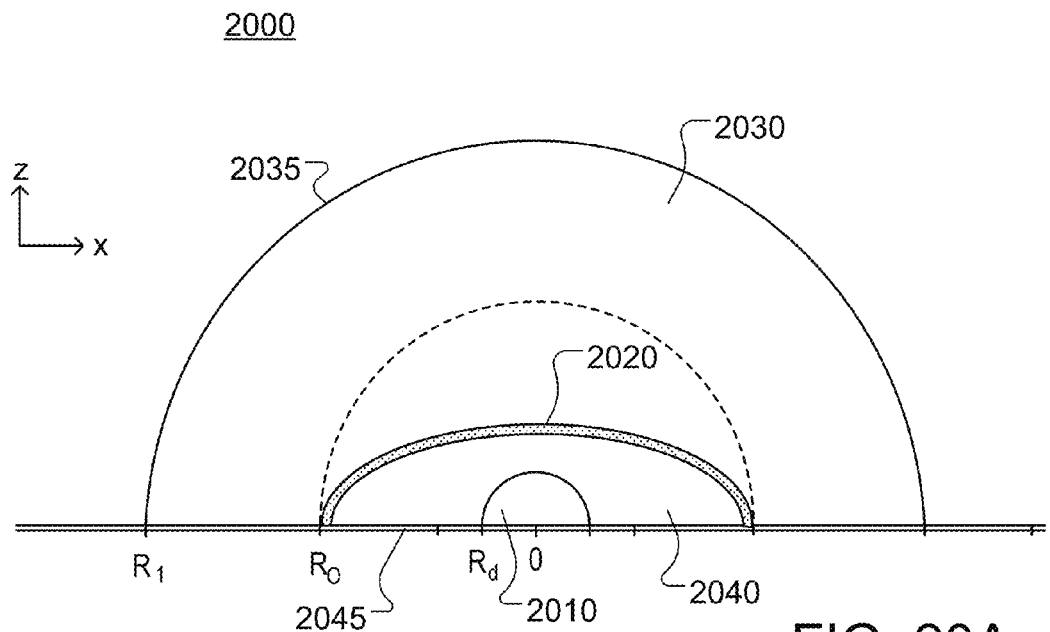
FIGS. 20A-20B show aspects of another example of a light-emitting device having an ellipsoidal scattering element.

FIG. 20A shows another ASLV light-emitting device 2000 having an ellipsoidal scattering element 2020. In this example, the scattering element 2020 is shaped as an ellipsoidal segment with its short axis along the optical z-axis. The extractor element 2030 has an exit surface 2035 of radius R1. In this example, the scattering element 2020 is shaped as an ellipsoidal segment with its long axis perpendicular to the optical z-axis within a notional $R_O$ semi-sphere. In some implementations, the $R_O$ semi-sphere represents the Weierstrass sphere, while in other implementations the $R_O$ semi-sphere represents the Brewster sphere. A recovery cavity 2040 is formed from a light-entry surface of the scattering element 2020 and a planar reflector 2045. The recovery cavity 2040 is filled with a gas, e.g., air, or is evacuated. An index of refraction np of the scattering element 2020 is larger than or equal to an index of refraction n1 of the extractor element 2030. A light-emitting element 2010 is located in an aperture of the planar reflector 2045 and emits light in the recovery cavity 2040. In some implementations, the planar reflector 2045 extends laterally to the outer edge of the scattering element 2020. In other implementations, the planar reflector 2045 extends laterally to the exit surface of the extractor element 2035. In other implementations, the planar reflector 2045 extends laterally farther out than the exit surface of the extractor element 2035, for example to a radius of 1.2×, 1.5× or 2.0×R1.

Figure 20B:
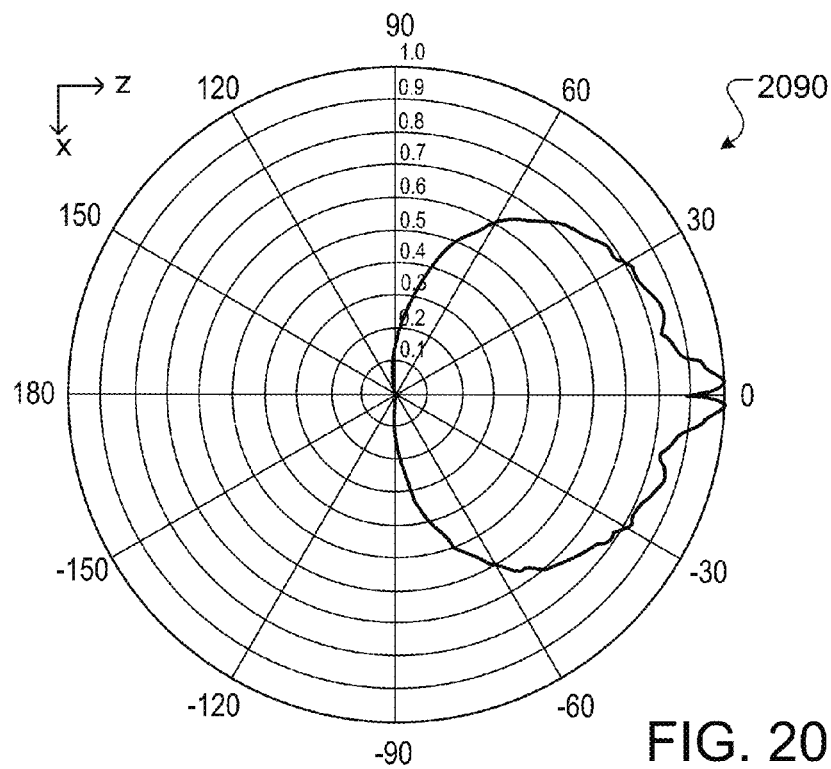

FIG. 20B shows an intensity distribution 2090 of light output by an ASLV light-emitting device similar to the ASLV light-emitting device 2000. The intensity distribution 2090 indicates that such an ASLV light-emitting device favors on-axis (along the z-axis or simply referred to as forward) intensity at the expense of lateral emission (in the ±directions of the x-axis.) In this case, the intensity distribution is biased along the z-direction because the largest cross-section (x-y) of the scattering element 2020 is the x-y cross-section. In addition, note that as long as the entire scattering element 2020 is within the $R_O$ semi-sphere, there is almost no TIR at the outer extractor/air interface 2035.

Figure 21A:
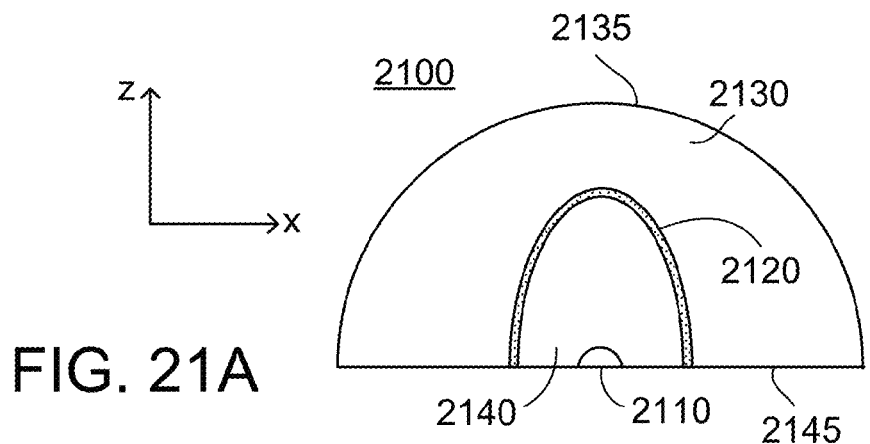
FIGS. 21A-21E show aspects of an example of a light-emitting device having an ellipsoidal scattering element with unequal orthogonal axes.
Figure 21B:
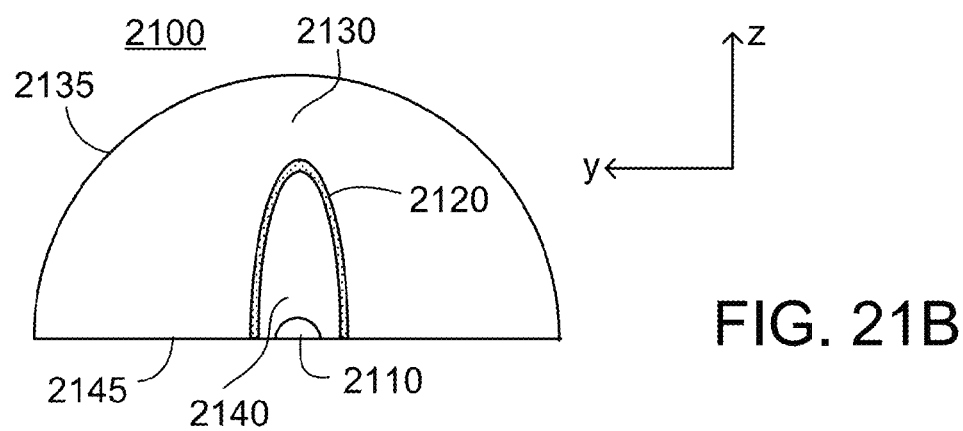
Figure 21C:
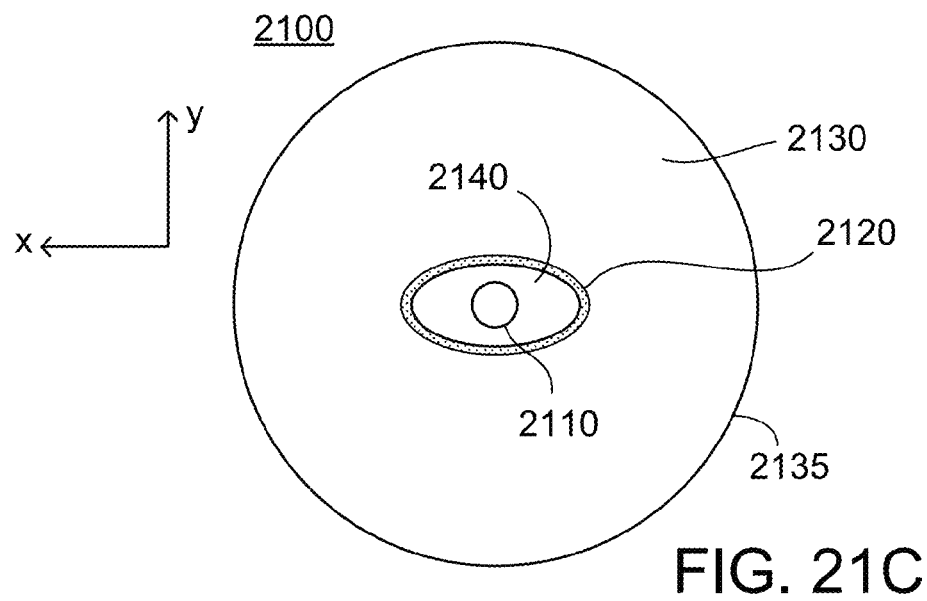

FIGS. 21A-21B show side-view cross-sections of another ASLV light-emitting device 2100. FIG. 21C shows a bottom view cross-section of the same device. The ASLV light-emitting device 2100 has an ellipsoidal scattering element 2120 with unequal orthogonal axes along the x-, y-, and z-axes. In this example, the scattering element 2120 is shaped as a semi-ellipsoid with axes that satisfy a ratio 2:1:4 in the x:y:z directions. The ASLV light-emitting device 2100 further includes a light-emitting element 2110, a planar reflector 2145, and an extractor element 2130.

The extractor element 2130 is hemispherical and has an exit surface 2135 of radius R1 that is concentric with the semi-ellipsoidal scattering element 2120. The long axis of the scattering element 2120 is oriented along the optical z-axis of the ASLV light-emitting device 2100 within a notional $R_O$ semi-sphere. In some implementations, the $R_O$ semi-sphere represents the Weierstrass sphere, while in other implementations the RO semi-sphere represents the Brewster sphere. A recovery cavity 2140 is formed from a light-entry surface of the scattering element 2120 and the planar reflector 2145. The recovery cavity 2140 is filled with a gas, e.g., air, or is evacuated. An index of refraction np of the scattering element 2120 is smaller than or equal to an index of refraction n1 of the extractor element 2130. The light-emitting element 2110 is located in an aperture of the planar reflector 2145 and emits light in the recovery cavity 2140. In some implementations, the planar reflector 2145 extends laterally to the outer edge of the scattering element 2120. In other implementations, the planar reflector 2145 extends laterally to the exit surface of the extractor element 2135.

Figure 21D:
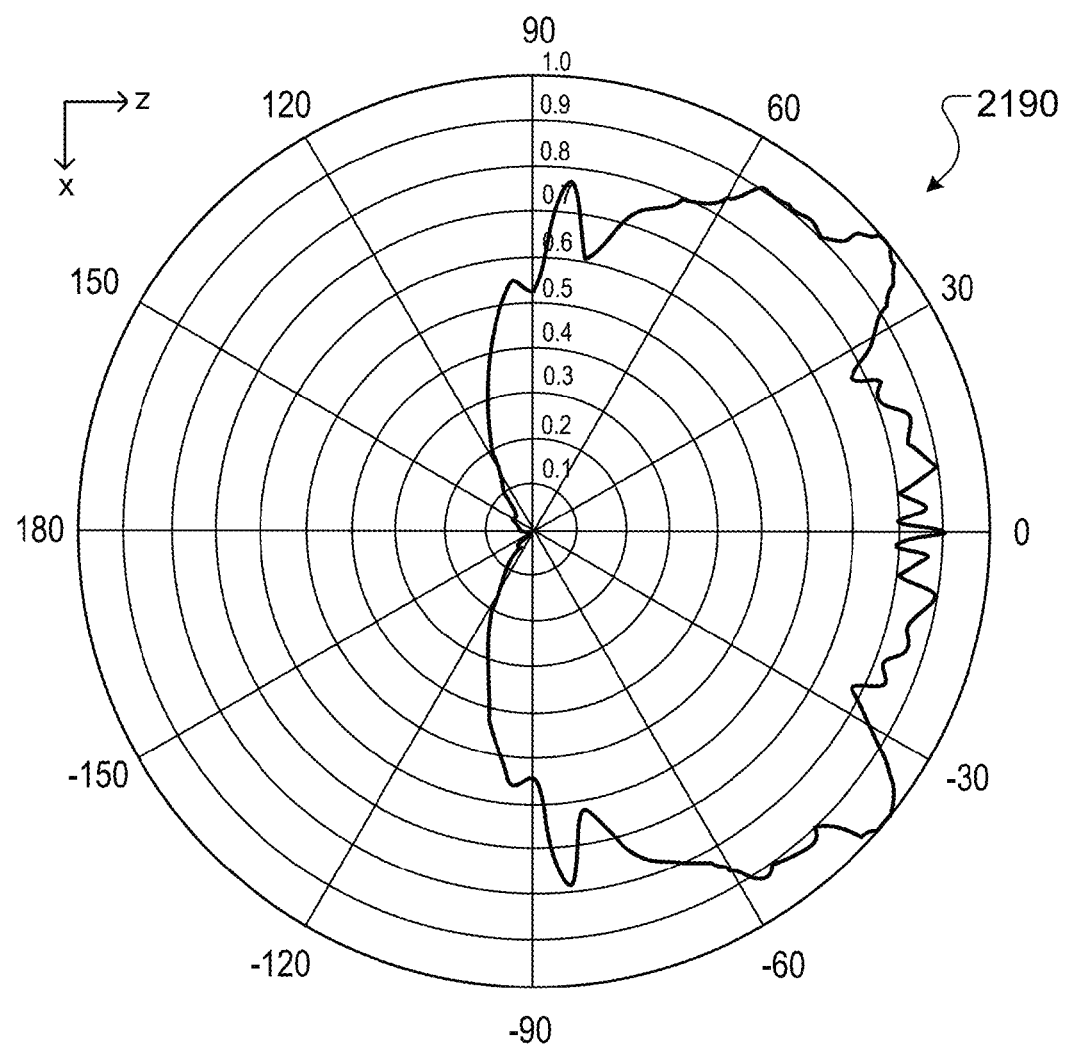
Figure 21E:
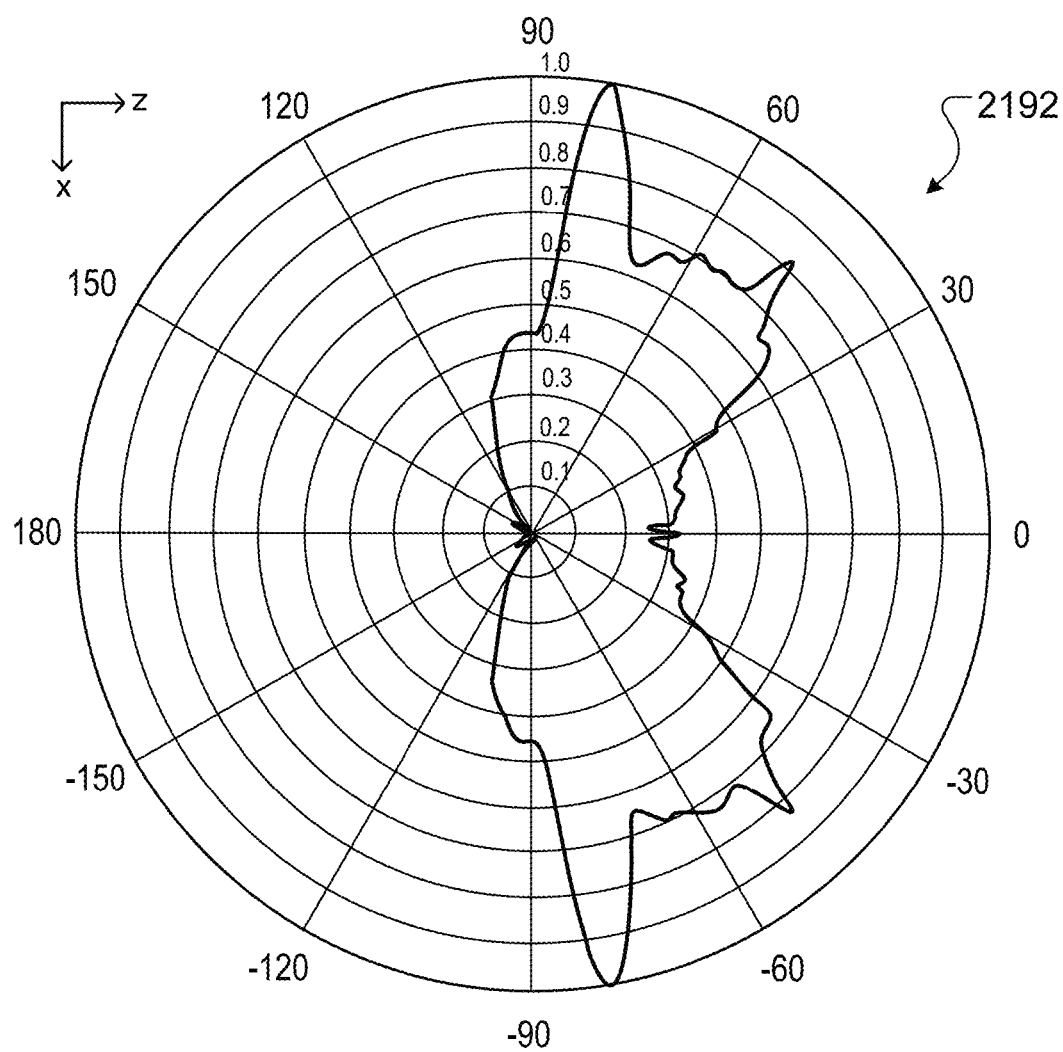

FIG. 21D shows an x-z intensity distribution 2190 of light output by an ASLV light-emitting device similar to the ASLV light-emitting device 2100. In this example, the reflector 2145 extends to the exit surface 2135 of the extractor element 2130. In this manner, although the intensity distribution 2190 has a forward bias, it covers a solid angle of $>2\pi$ sr, since light originating from the upper part of the scattering element 2120 and propagating towards the lower edges of the extractor 2130 will be refracted into angles $>90°$ from the optical z-axis. FIG. 21E shows an intensity distribution 2192 of light output by the same embodiment of ASLV light-emitting device 2100 that has the reflector 2145 extending to the exit surface 2135 of the extractor element 2130. The intensity distribution 2192 indicates that such an ASLV light-emitting device favors transverse (in the ±directions of the y-axis, simply referred to as lateral or side) emission at the expense of on-axis intensity (along the z-axis) and the longitudinal intensity (along the x-axis).

In general, the intensity distribution of light output by an ASLV light-emitting device is biased along a direction perpendicular to the largest cross-section of the scattering element 2120. Because the x-z cross-section is larger than either of the y-z or x-y cross-sections, the ASLV light-emitting device 2100 issues most of the output light in the y-direction (laterally), while less of the output light is issued in the x-direction (along the longitudinal direction of the ASLV light-emitting device 2100) or in the z-direction (forward.)

In another implementation, the scattering element 2120 of the ASLV light-emitting device 2100 can be shaped as a semi-ellipsoid with axes that satisfy a ratio 4:2:4 in the x:y:z directions. In this other case, because the x-y and x-z cross-sections are larger than the y-z cross-section, an ASLV light-emitting device 2100 would issue most of the output light in the z-direction (forward) and in the y-direction (laterally), while only a fraction of the output light is issued in the x-direction (along the longitudinal direction of the ASLV light-emitting device 2100.)

Figure 22:
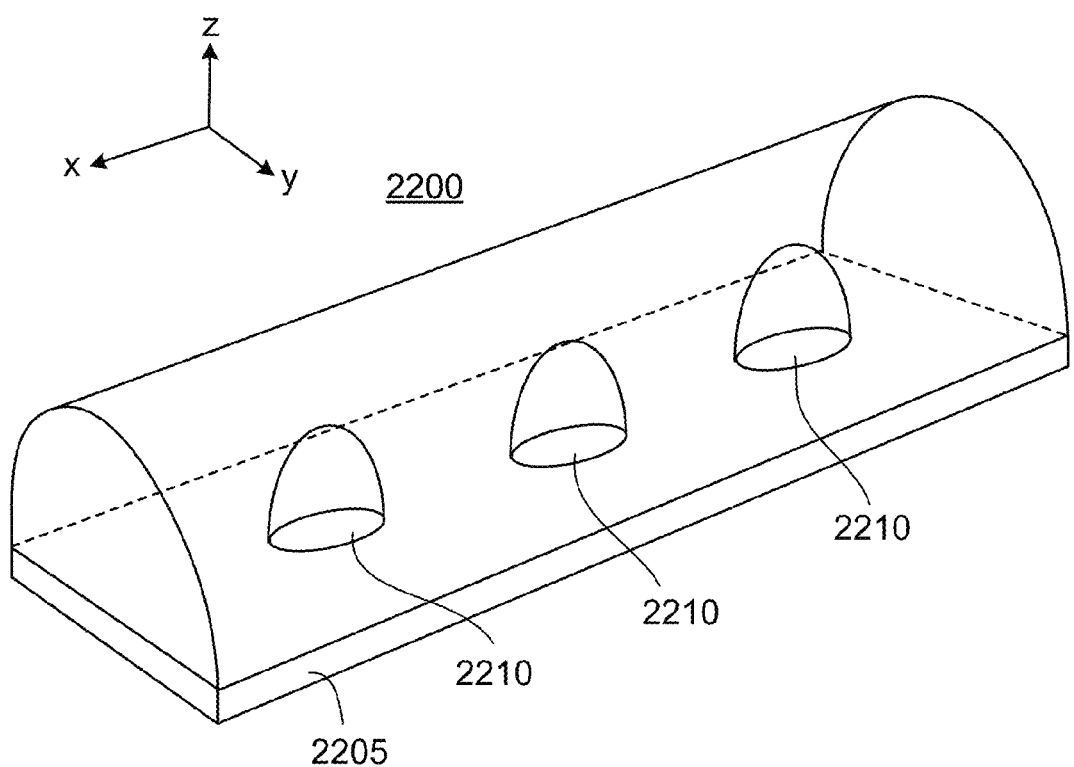
FIG. 22 shows an example of an elongated light-emitting device that uses multiple light-emitting devices having an ellipsoidal scattering element with unequal orthogonal axes.

FIG. 22 shows a lighting fixture 2200 including multiple ASLV light-emitting devices 2210 disposed in a longitudinal x-direction of a base substrate 2205. For example, each of the ASLV light-emitting devices 2210 can correspond to the ASLV light-emitting device 2100 that has a scattering element shaped as a semi-ellipsoid with axes that satisfy a ratio 4:2:4 in the x:y:z directions. In such case, the lighting fixture 2200 outputs most of the light in the z-direction (forward) and y-direction (laterally), while only a small fraction of the output light is output light along the longitudinal x-direction of the base substrate 2205.

Figure 23A:
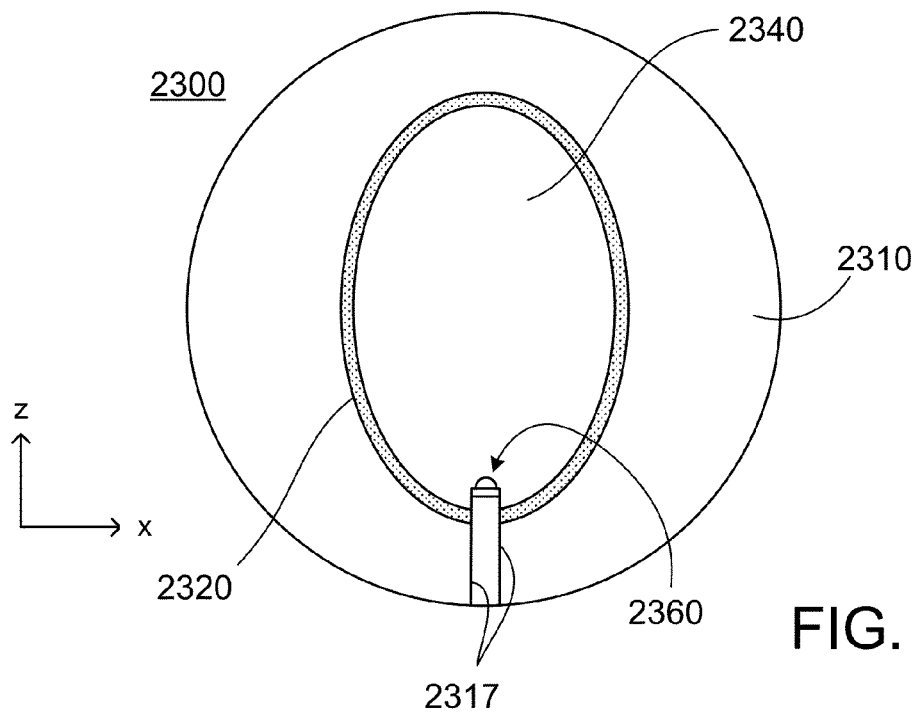
FIGS. 23A-23B show aspects of an example of a light-emitting device having an ellipsoidal scattering element that encloses a recovery enclosure.

FIG. 23A shows an ASLV light-emitting device 2300 having an ellipsoidal scattering element 2320 that encloses a recovery enclosure 2340. The ASLV light-emitting device 2300 has a rotationally symmetric mixed spherical and ellipsoidal configuration about the z-axis and includes an extractor element 2310, a scattering element 2320 and a light-emitting device 2360 configured to emit blue light under operating conditions. The scattering element 2320 includes active and passive scattering centers and is configured to convert a portion of the blue light provided by the light-emitting device 2360 to generate white light. The extractor element 2310 and the scattering element 2320 can be injection molded in a multi-shot process. In this example, the ellipsoidal scattering element 2320 is disposed concentric with the exit surface of the extractor element 2310 and is contained within a notional $R_O$ semi-sphere. In some implementations, the $R_O$ semi-sphere represents the Weierstrass sphere, while in other implementations the $R_O$ semi-sphere represents the Brewster sphere.

The ASLV light-emitting device 2300 may further include for example a socket for establishing an electromechanical connection to a source of power, drive electronics, electrical connections and cooling elements.

The extractor element 2310 is configured as a shell with a spherical exit surface on the outside and an ellipsoidal surface on the inside. The scattering element 2320 is configured as an ellipsoidal shell abutting the inside of the extractor element 2310. The scattering element 2320 forms a hollow recovery enclosure 2340 that is filled with a low-index medium, for example air or inert gas. Varying the shape of the scattering element 2320 provides for a degree of beam shaping. The scattering element 2320 defines an aperture surrounded by walls 2317 and substantially abuts sides of a pillar supporting the light-emitting device 2360 so that substantially all light from the light-emitting device is emitted into the recovery enclosure 2340 during operating conditions. Varying the distance between the light-emitting device 2360 and the scattering element 2320, that is the height of the light-emitting device 2360 above the bottom of the scattering element 2320, provides for another degree of beam shaping.

Figure 23B:
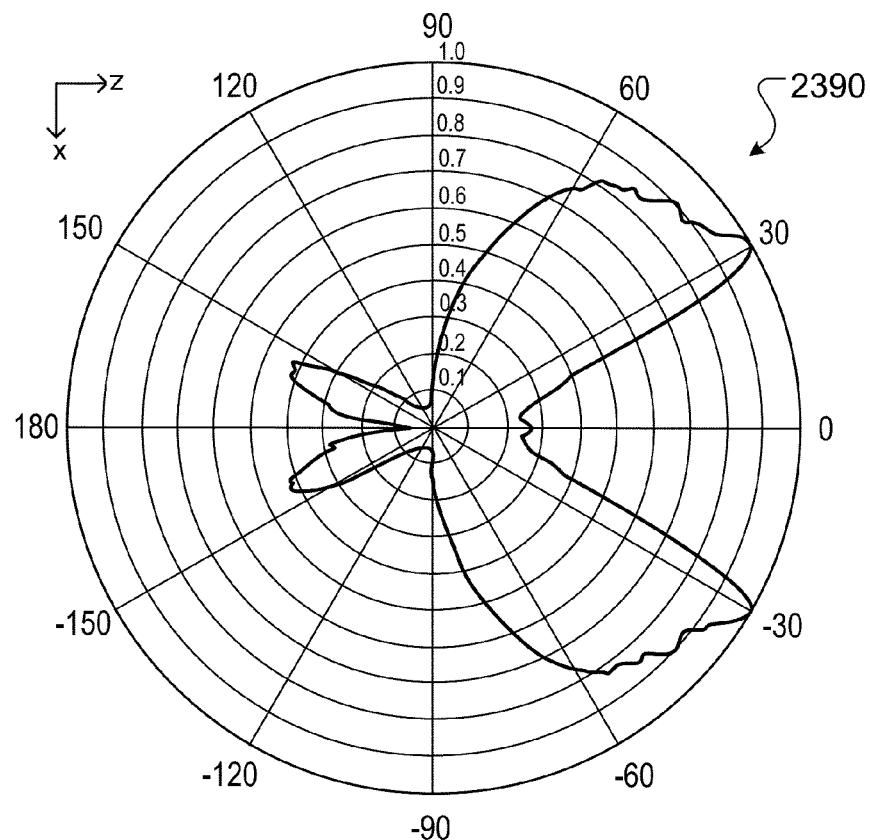

FIG. 23B shows an intensity distribution 2390 of light output by the ASLV light-emitting device 2300. The intensity distribution 2390 indicates that the ASLV light-emitting device 2300 favors transverse (lateral or side) emission (in the ±directions of the x-axis), at the expense of on-axis intensity (along the z-axis) because the lateral cross-section of the scattering element 2320 is larger than the on-axis cross-section of the same.

Figure 24A:
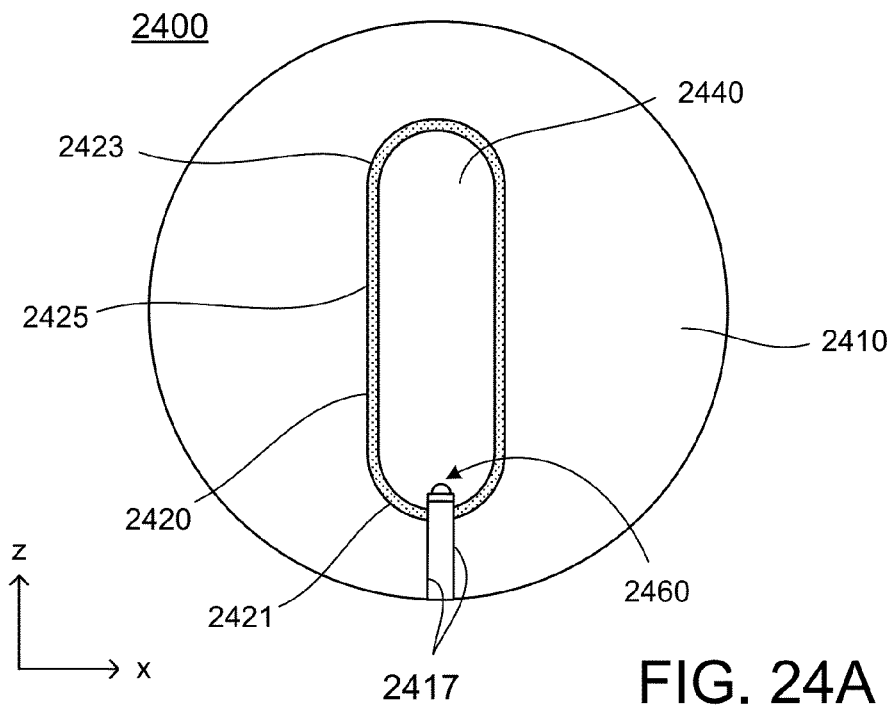
FIGS. 24A-24B show aspects of an example of a light-emitting device having an elongated scattering element that encloses a recovery enclosure.

FIG. 24A shows an ASLV light-emitting device 2400 having an elongated scattering element 2420 that encloses a recovery enclosure 2440. The ASLV light-emitting device 2400 has a rotationally symmetric mixed spherical and cylindrical configuration and includes a spherical extractor element 2410, a scattering element 2420 and a light-emitting device 2460 configured to emit blue light under operating conditions. The scattering element 2420 includes active and passive scattering centers and is configured to convert a portion of the blue light provided by the light-emitting device 2460 to generate white light. The extractor element 2410 and the scattering element 2420 can be injection molded in a multi-shot process. The ASLV light-emitting device 2400 may further include for example a socket for establishing an electromechanical connection to a source of power, drive electronics, electrical connections and cooling elements.

The extractor element 2410 has a spherical exit surface on the outside and a surface on the inside that is adequately shaped to match the scattering element 2420. The scattering element 2420 is clad to the inside of the extractor element 2410 and located within a region bound by particular notional sphere determined by the spherical exit surface of the extractor element 2410. In some implementations, the particular notional sphere is the Weierstrass sphere. In some implementations, the particular notional sphere is the Brewster sphere. The scattering element 2420 forms a hollow recovery enclosure 2440 that is filled with a low-index medium, for example air or inert gas. Varying the shape and/or dimensions of the scattering element 2420 provides for a degree of beam shaping.

Figure 24B:
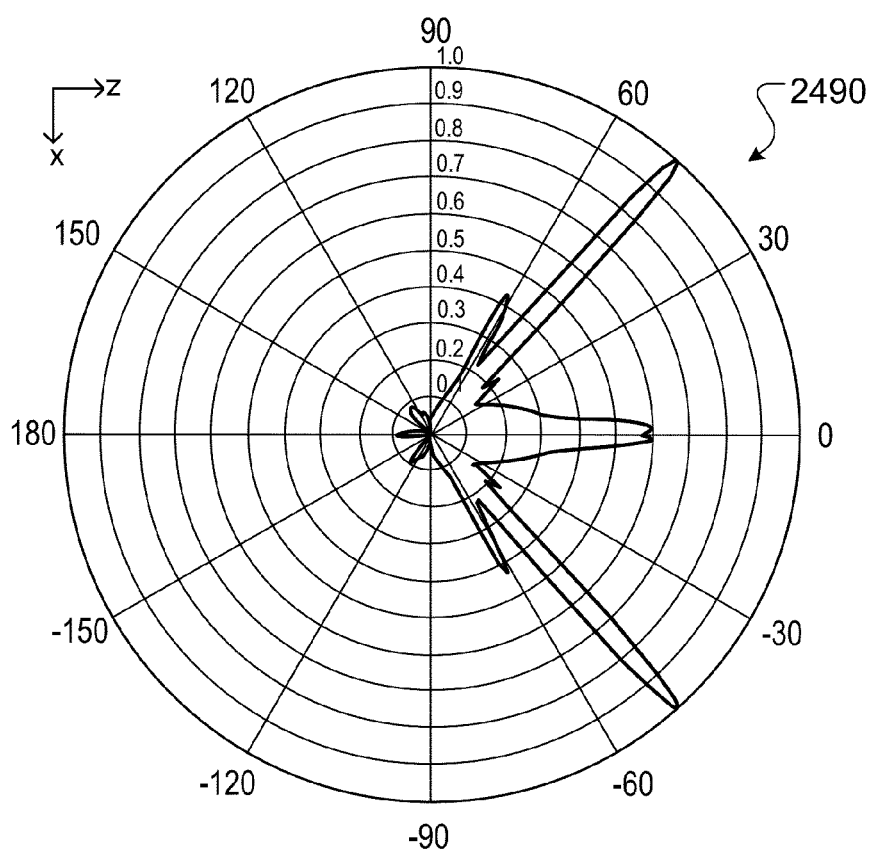

FIG. 24B shows an intensity distribution 2490 of light output by the ASLV light-emitting device 2400. The intensity distribution 2490 indicates that the ASLV light-emitting device 2400 outputs two narrow lobes (of width approximately 10°), such that each of the two narrow lobes has a transverse (lateral or side) component (in the + or − direction of the x-axis) about equal to an on-axis component (along the z-axis). In addition, the ASLV light-emitting device 2400 outputs a forward lobe (along the z-axis) with a magnitude that is about half a magnitude of the two narrow lobes.

In this example, the scattering element 2420 has a tubular center portion 2425 with dome-shaped caps 2421 and 2423 disposed at each end of the center portion 2425. The tubular center portion 2425 may be a cylinder, a prism or other object with a parallel or tapered wall. The dome-shaped caps 2421 and 2423 may have different or equal shapes. The dome-shaped caps 2421 and 2423 may have a hemi-spherical, parabolic, hyperbolic, elliptical or other shape. It is noted that such a scattering element may be configured for positioning light-emitting devices elsewhere other than illustrated in FIG. 24A, for example, proximate the circumference in the center of the center portion 2425.

The scattering element 2420 defines an aperture surrounded by walls 2417 and substantially abuts sides of a pillar supporting the light-emitting device 2460 so that substantially all light from the light-emitting device is emitted into the recovery enclosure 2440 during operating conditions.

Figure 25A:
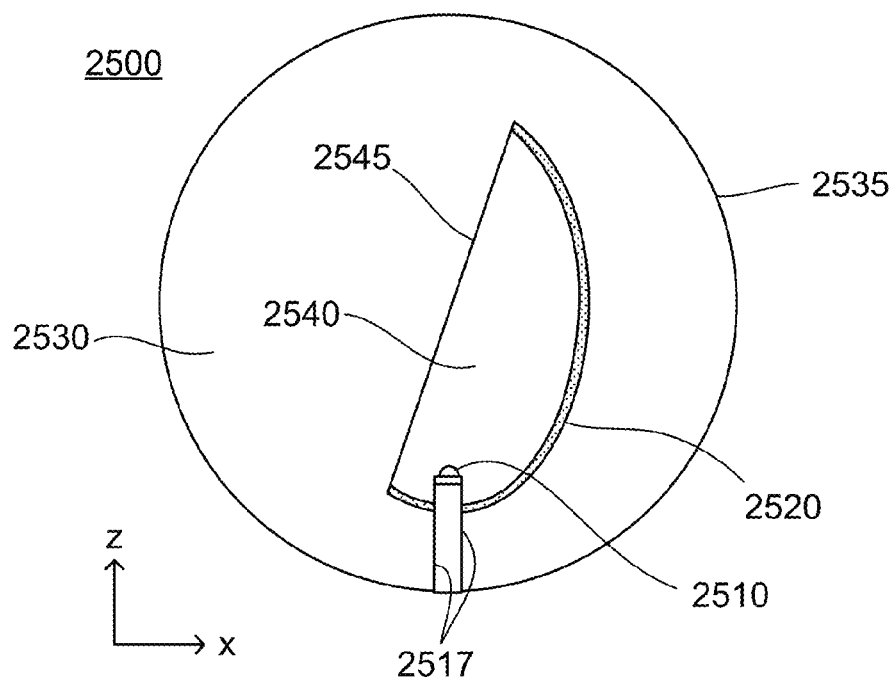
FIGS. 25A-25C show aspects of an example of a light-emitting device having a scattering element shaped as an ellipsoidal segment that encloses a recovery enclosure.

FIG. 25A shows an ASLV light-emitting device 2500 having a recovery enclosure 2540 enclosed by a combination of (i) a scattering element 2520 shaped as an ellipsoidal segment and (ii) a planar reflector 2545. In this example, the planar reflector 2545 is normal to the x-z plane and slanted by a slant angle with respect to the y-axis. The extractor element 2530 has an exit surface 2535 of radius R1. In this example, the scattering element 2520 is contained within a notional $R_O$ semi-sphere. In some implementations, the $R_O$ semi-sphere represents the Weierstrass sphere, while in other implementations the $R_O$ semi-sphere represents the Brewster sphere. The recovery enclosure 2540 can include gas, e.g. air, or can be evacuated. In some implementations, the planar reflector 2545 is formed at the planar interface between air, inside the recovery enclosure 2540 and the material of the extractor element 2530. In this case, scattered light (whether pump light or converted light) internally reflects at the planar reflector 2545. In other implementations, the planar reflector 2545 can be coated with a reflective material.

The scattering element 2520 defines an aperture surrounded by walls 2517 and substantially abuts sides of a pillar supporting a light-emitting device 2510 so that substantially all light from the light-emitting device is emitted into the recovery enclosure 2540 during operating conditions. Varying the distance between the light-emitting device 2510 and the scattering element 2520, that is the height of the light-emitting device 2510 above the bottom of the scattering element 2520, provides for another degree of beam shaping.

Figure 25B:
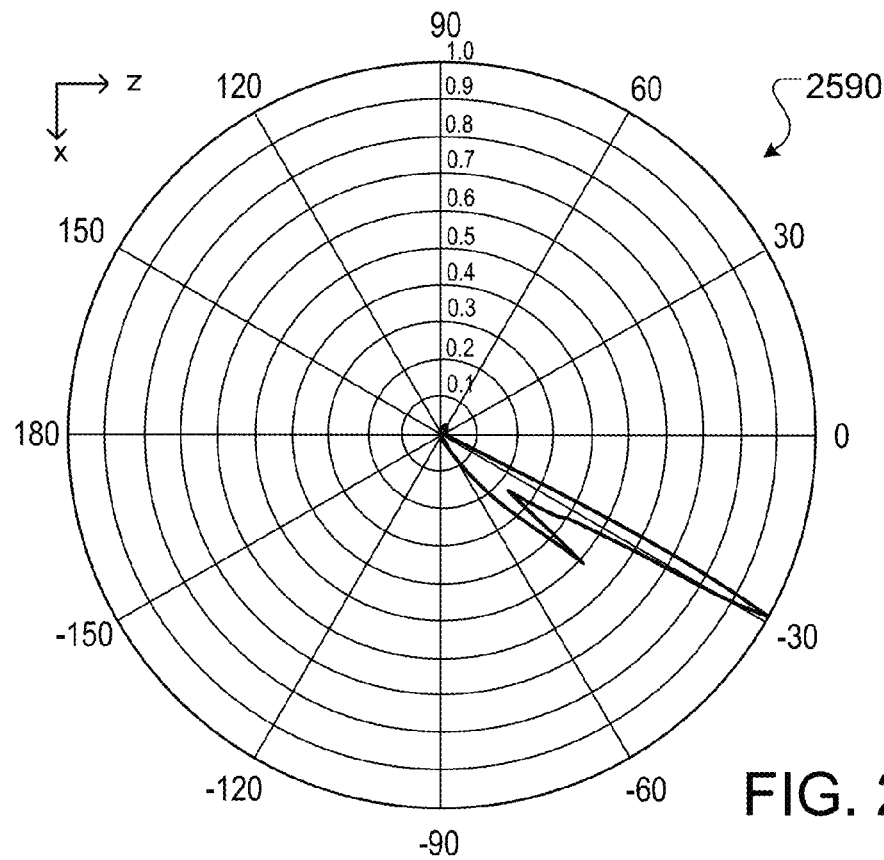
Figure 25C:
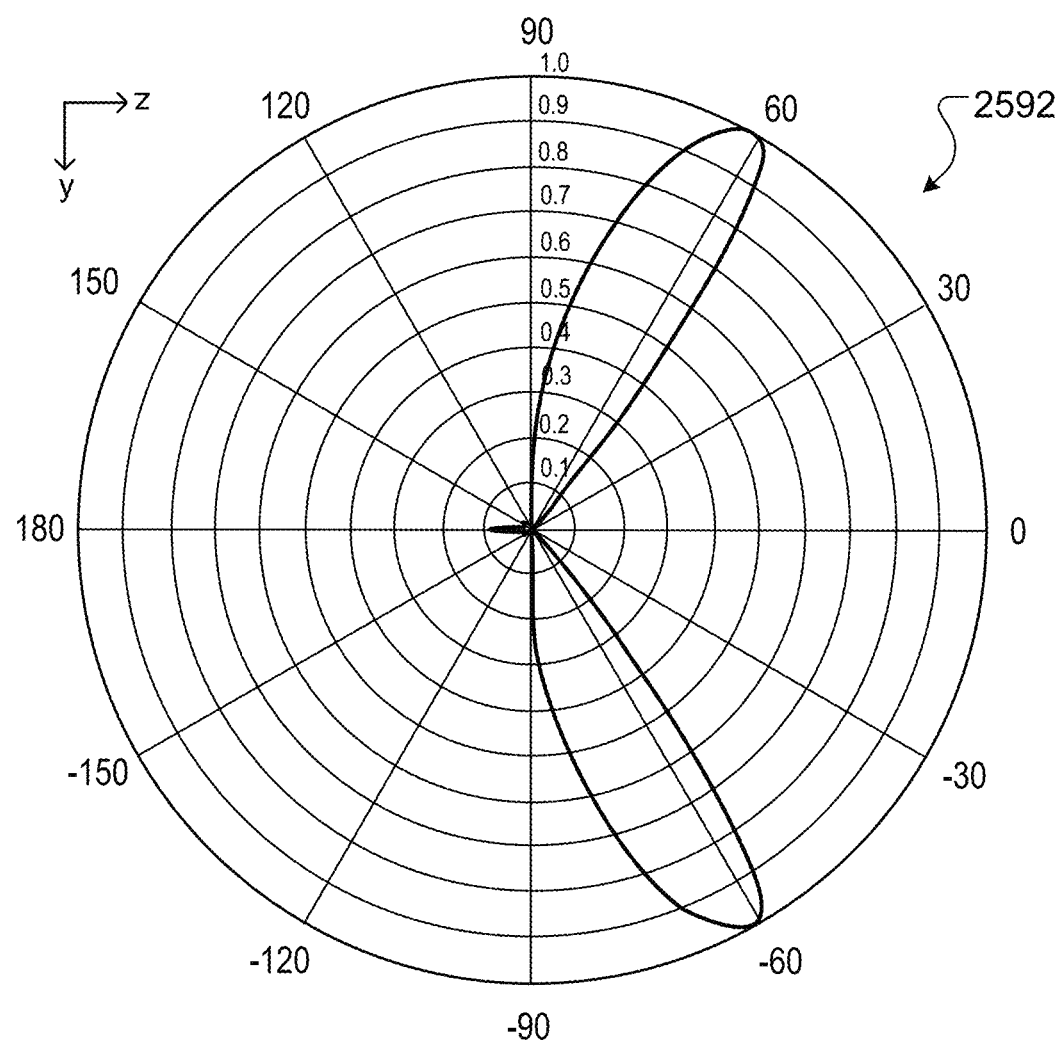

FIG. 25B shows an x-z intensity distribution 2590 of light output by an ASLV light-emitting device similar to the ASLV light-emitting device 2500 in a plane x-z perpendicular to the flat reflector 2545. The x-z intensity distribution 2590 indicates that the ASLV light-emitting device 2500 outputs a narrow lobe (of width approximately 5°) and oriented at an angle with respect to the z-axis. The angle of the narrow lobe corresponds to the slant angle of the flat reflector 2545. FIG. 25C shows a y-z intensity distribution 2592 of light output by an ASLV light-emitting device similar to the ASLV light-emitting device 2500 in a plane y-z that has a normal rotated by the given angle with respect to the normal of the flat reflector 2545. The y-z intensity distribution 2592 indicates that the ASLV light-emitting device 2500 outputs two side lobes respectively oriented mostly in the + and − directions of the y-axis.

Figure 26A:
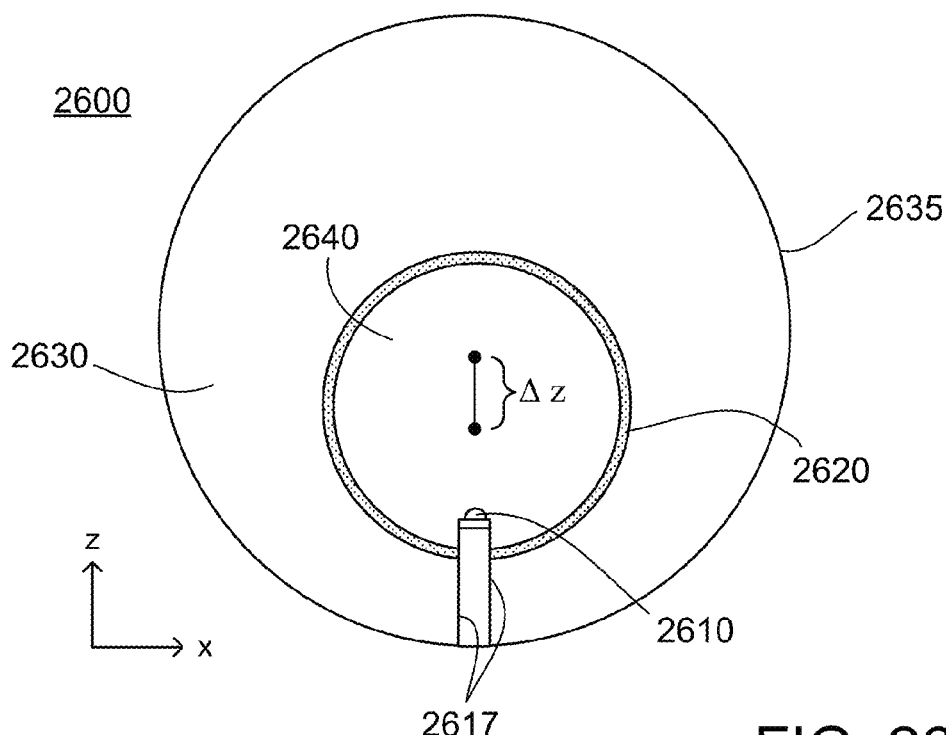
FIGS. 26A-26B show aspects of an example of a light-emitting device having a spherical scattering element that is off-centered relative to an extractor element and encloses a recovery enclosure.

FIG. 26A shows an ASLV light-emitting device 2600 having a spherical scattering element 2620 that is off-centered relative to a spherical extractor element 2630 and encloses a recovery enclosure 2640. The spherical scattering element 2620 is contained within a Weierstrass sphere corresponding to an exit surface 2635 of the spherical extractor element 2630. Moreover, the center of the spherical scattering element 2620 is offset with respect to the center of the spherical extractor element 2630 by a distance Δz. The extractor element 2630 has an exit surface 2635 of radius R1. In this example, the scattering element 2620 is contained within a notional $R_O$ semi-sphere. In some implementations, the $R_O$ semi-sphere represents the Weierstrass sphere, while in other implementations the $R_O$ semi-sphere represents the Brewster sphere. The recovery enclosure 2640 can include gas, e.g. air, or can be evacuated.

The scattering element 2620 defines an aperture surrounded by walls 2617 and substantially abuts sides of a pillar supporting a light-emitting device 2610 so that substantially all light from the light-emitting device is emitted into the recovery enclosure 2640 during operating conditions. Varying the distance between the light-emitting device 2610 and the scattering element 2620, that is the height of the light-emitting device 2610 above the bottom of the scattering element 2620, provides for another degree of beam shaping.

Figure 26B:
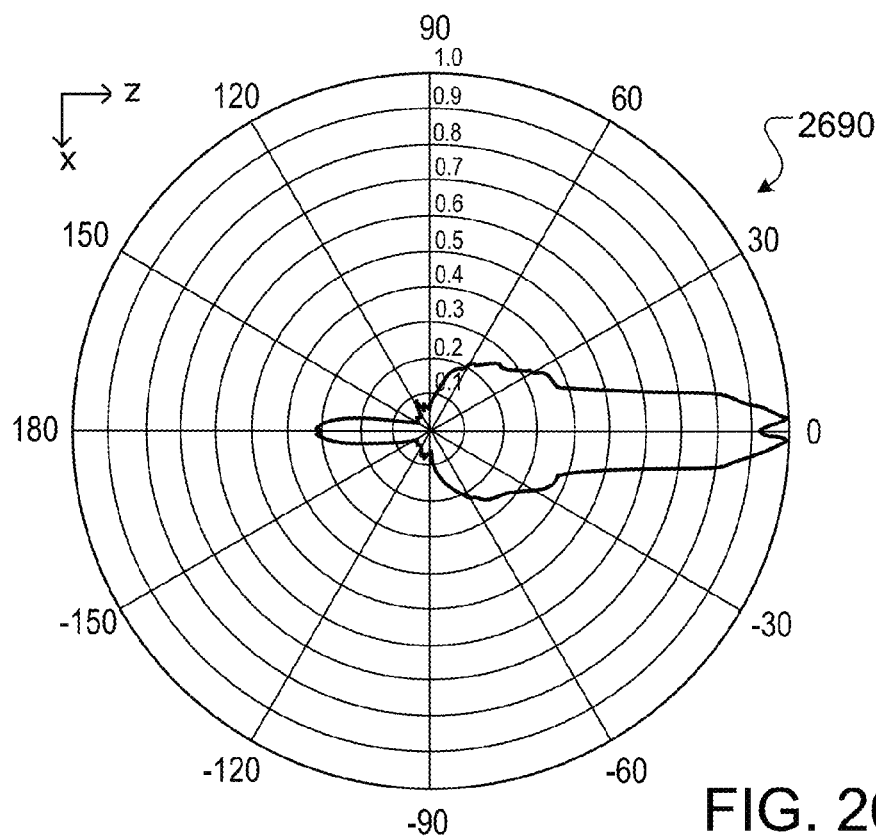

FIG. 26B shows an intensity distribution 2690 of light output by an ASLV light-emitting device similar to the ASLV light-emitting device 2600. The intensity distribution 2690 indicates that the ASLV light-emitting device 2400 favors on-axis (along the z-axis or simply referred to as forward) emission at the expense of lateral emission (in the ±directions of the x-axis.) The reason for the on-axis bias of the intensity distribution 2690 is that, for this device, an optical power of the exit surface of the extractor element 2635 is larger on-axis than laterally.

Figure 27A:
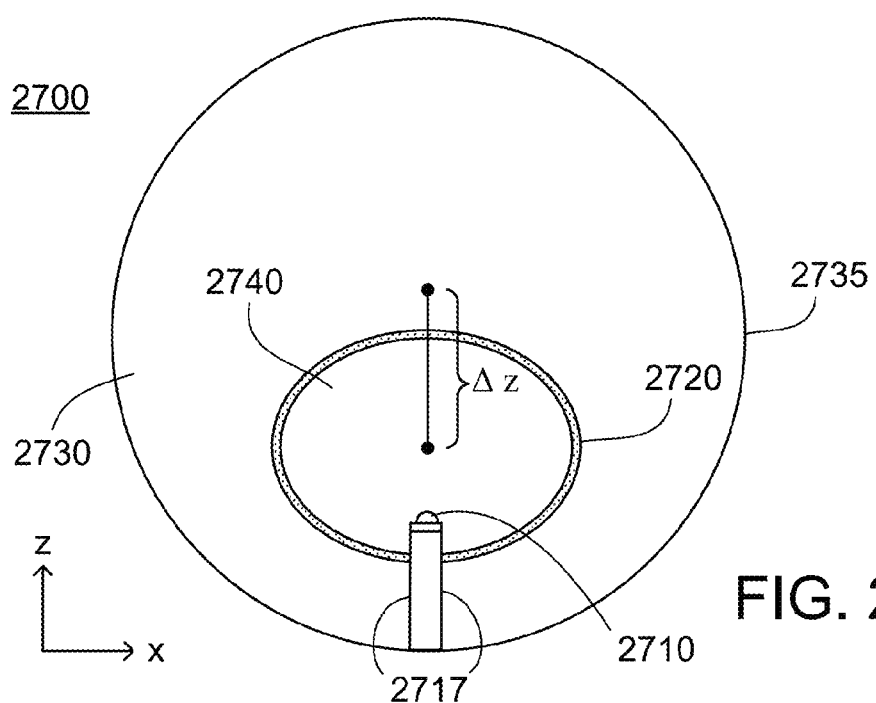
FIGS. 27A-27B show aspects of an example of a light-emitting device having an ellipsoidal scattering element that is off-centered relative to an extractor element and encloses a recovery enclosure.

FIG. 27A shows an ASLV light-emitting device 2700 having an ellipsoidal scattering element 2720 that is off-centered relative to a spherical extractor element 2710 and encloses a recovery enclosure 2740. The ellipsoidal scattering element 2720 has its long axis along the x-axis and is contained within a Weierstrass sphere corresponding to an exit surface 2735 of the spherical extractor element 2730.

Moreover, the ellipsoidal scattering element 2720 is offset with respect to the center of the spherical extractor element 2730 by a distance Δz. The extractor element 2730 has an exit surface 2735 of radius R1. In this example, the scattering element 2720 is contained within a notional $R_O$ semi-sphere. In some implementations, the $R_O$ semi-sphere represents the Weierstrass sphere, while in other implementations the $R_O$ semi-sphere represents the Brewster sphere. The recovery enclosure 2740 can include gas, e.g. air, or can be evacuated.

The scattering element 2720 defines an aperture surrounded by walls 2717 and substantially abuts sides of a pillar supporting a light-emitting device 2710 so that substantially all light from the light-emitting device is emitted into the recovery enclosure 2740 during operating conditions. Varying the distance between the light-emitting device 2710 and the scattering element 2620, that is the height of the light-emitting device 2710 above the bottom of the scattering element 2720, provides for another degree of beam shaping.

Figure 27B:
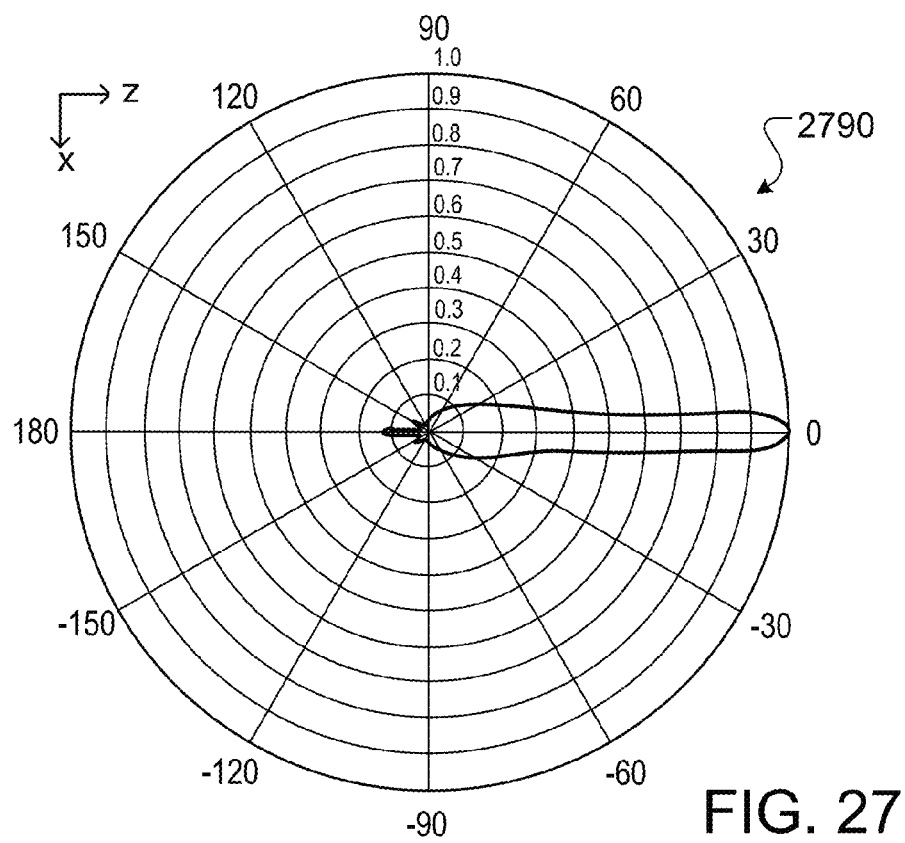

FIG. 27B shows an x-z intensity distribution 2790 of light output by an ASLV light-emitting device similar to the ASLV light-emitting device 2700. The x-z intensity distribution 2790 indicates that, in the x-z plane, the ASLV light-emitting device 2700 favors on-axis (along the z-axis or simply referred to as forward) emission at the expense of lateral emission (in the ±directions of the x-axis.) The reason for the on-axis bias of the intensity distribution 2790 is that, for this device, an optical power of the exit surface of the extractor element 2735 is larger on-axis than laterally. Moreover, note that the intensity distribution 2790 has a stronger on-axis bias than the intensity distribution 2590 because devices similar to the ASLV light-emitting device 2700 have a stronger on-axis optical power than devices similar to the ASLV light-emitting device 2500.

The distribution of light emitted from the ASLV light-emitting device also depends on the shape of the exit surface. Accordingly, varying the shape of the exit surface from spherical (rotationally symmetric embodiments) and cylindrical (elongate embodiments) can also provide different intensity distributions relative to spherical and/or cylindrical embodiments.

Figure 28:
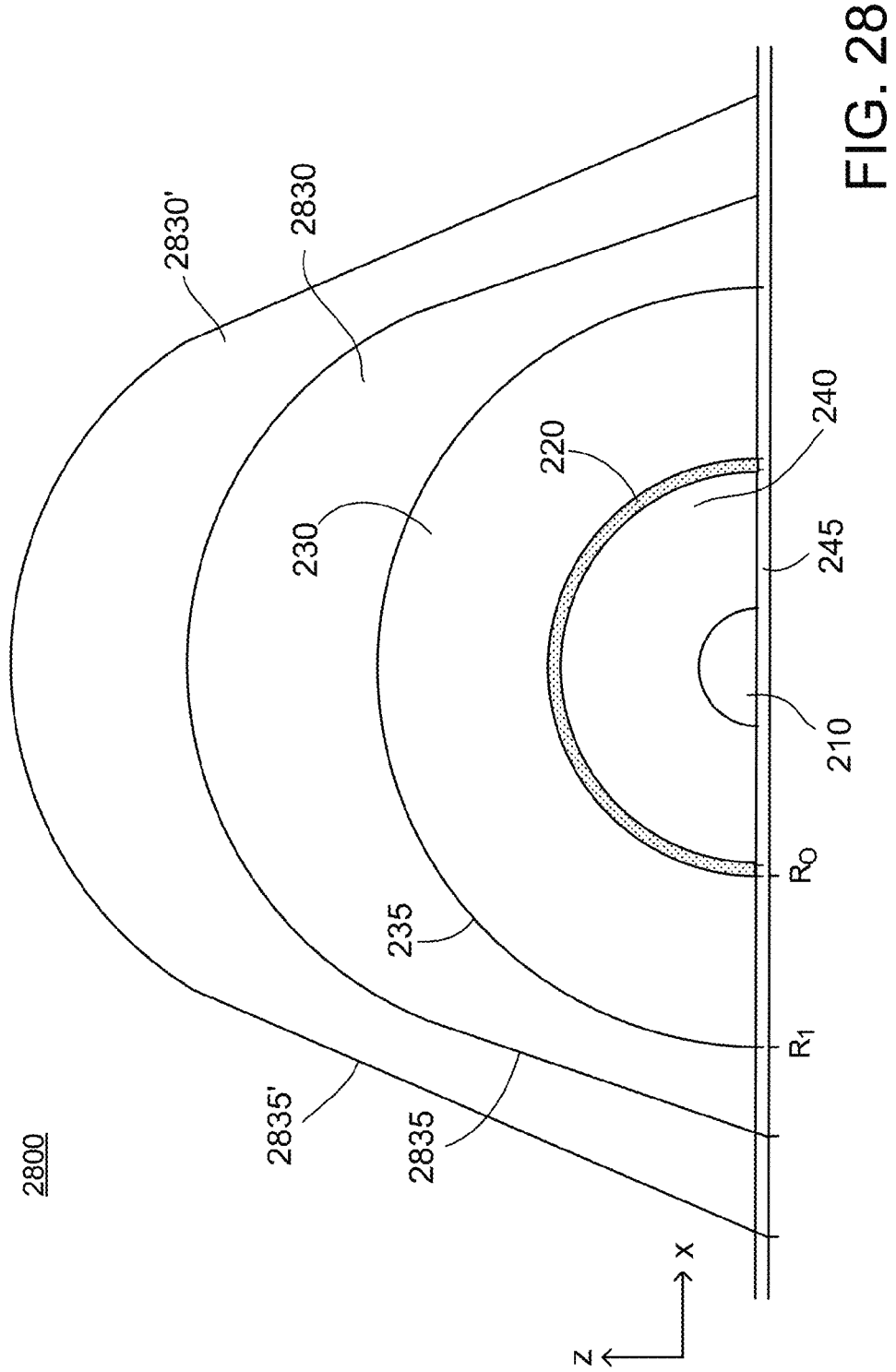
FIG. 28 shows aspects of an example of a light-emitting device having an extractor shaped as an ellipsoidal segment.

FIG. 28 shows an ASLV light-emitting device 2800 having an extractor element 2830/2830' shaped as an ellipsoidal segment. The ASLV light-emitting device 2800 further includes a light-emitting element 210, a scattering element 220 and a planar reflector 245. A recovery enclosure 240 is formed from a light-entry surface of the scattering element 220 and planar reflector 245. The recovery enclosure is filled with a gas, e.g., air, or is evacuated. An index of refraction np of the scattering element 220 is larger than or equal to an index of refraction n1 of the extractor element 230.

A configuration of the ASLV light-emitting device 2800 for which the ellipsoidal segment is a hemisphere 230 corresponds to the ASLV light-emitting device 200 described above in connection with FIG. 2A. In this case, an exit surface 235 of the hemispherical extractor 230 satisfies the Brewster condition, and hence, the Weierstrass condition. However, an apex of the extractor element 2830 (or 2830') is further away from the scattering element 220 compared to the apex of the extractor element 230. Hence, a configuration of an exit surface of the extractor 2835 (or 2835') increases the forward bias or on-axis intensity of light output by the ASLV light-emitting device 2800 along the z-axis relative to the corresponding on-axis intensity of light output by the ASLV light-emitting device 200. However, in the case of the ASLV light-emitting device 2800, linearly truncated side walls of its exit surface 2835 (or 2835') may result in some TIR losses.

As described above in this specification, an ASLV light-emitting device uses (i) an extractor element having a radius R to efficiently extract light from a scattering element immersed in a Weierstrass R/(n1/n0) sphere concentric to an exit surface of the extractor element, and (ii) a recovery enclosure at least partially bounded by the scattering element to return most of the light that escapes from the scattering element into the recovery enclosure. More refined analysis shows that the R/(n1/0) limit can still allow for quite significant reflection losses at the exit surface of the extractor, due to an increasing reflection coefficient at incidence angles less than the Critical Angle, arcsin(n1/n0)), but greater than the Brewster Angle, arctan(n1/n0), where n0 is an index of refraction of the ambient, e.g., n0=1 for air, and n1 is an index of refraction of the extractor element.

Further as described above in this specification, a scattering element smaller than the critical or Brewster limit radius, can have a variety of shapes, such as flat, part spherical, either more or less than hemi-spherical, or ellipsoids, of both prolate and oblate form, so long as they are entirely contained within preferably the Brewster radius limit. These shapes of the scattering element can create either narrower or wider flux distribution patterns with respect to the optical z-axis of the ASLV light-emitting devices as desired for end applications. However, the intensity distributions typically have a symmetry corresponding to the symmetry of the ASLV light-emitting device. Thus, a rotationally symmetric ASLV light-emitting device will typically provide an intensity distribution pattern being similarly rotationally symmetric. Using such ASLV light-emitting devices in a rectilinear environment, such as a room with a square or rectangular footprint, diagonal, corner-to-corner luminance will fall off between such sources spaced on a grid.

Accordingly, ASLV light-emitting devices may be formed having shapes more suited to providing illumination to rectilinear spaces. For example, the ASLV light-emitting devices described below have a square form exit surface of the extractor element, and are referred to as asymmetric square light valve (ASQLV). Such ASQLV light-emitting devices may be more efficient in corner illumination than rotationally symmetric ASLV light-emitting devices. An example of an ASQLV extractor profile has a plan view (e.g., footprint of a top view) that is square, rather than circular. The ASQLV extractor has a cross section sideways on that is generally a simple conic section. Examples of such sideways cross sections of the ASQLV extractor include circular as well as prolate, and oblate ellipse forms. In other examples, the sideways cross sections of the ASQLV extractor include parabolic and hyperbolic sections. Other geometries can also be used, but these simple conic forms are illustrative of the general concept of this technology.

Figure 29:
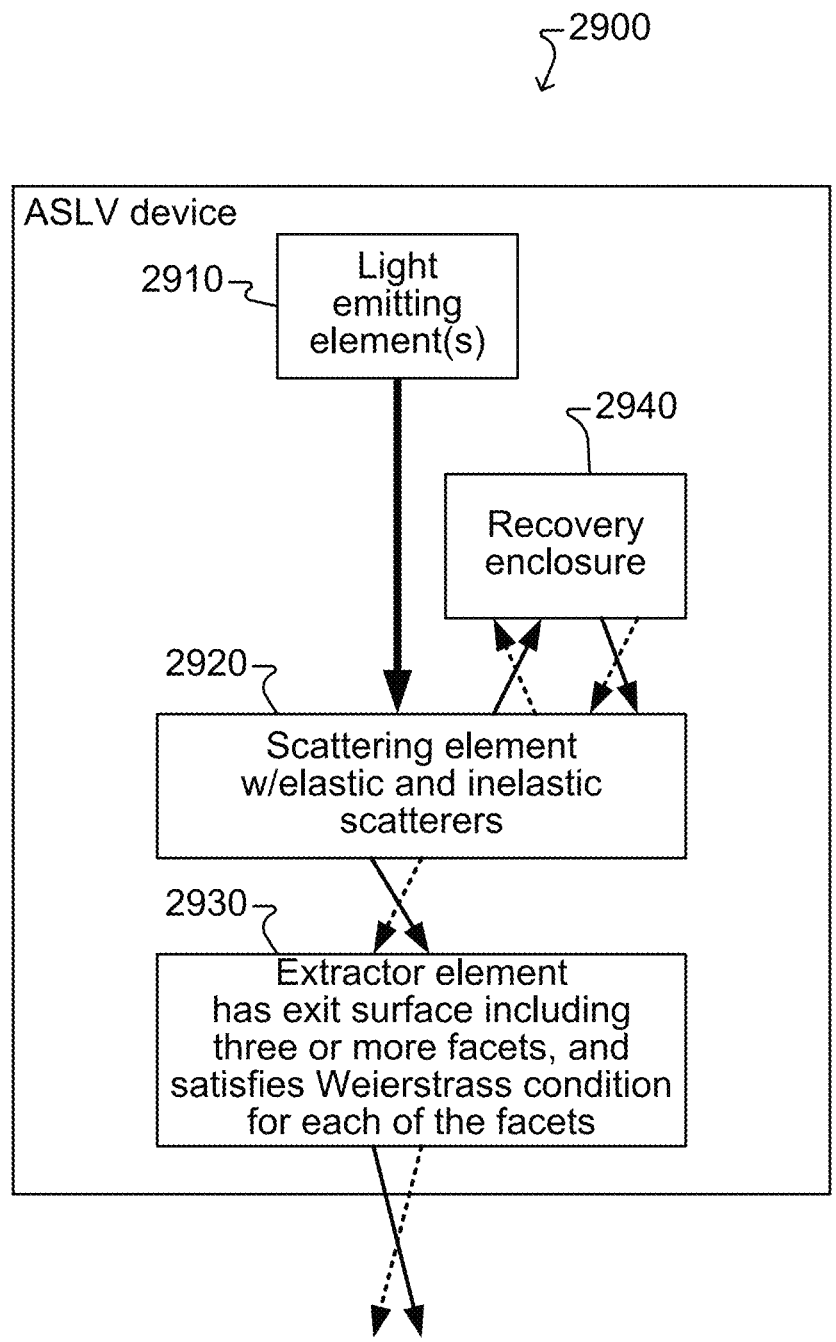
FIG. 29 is a schematic diagram of an example of an ASLV light-emitting device having an extractor element with three or more portions arranged to control intensity distribution of output light.

FIG. 29 shows a schematic diagram of an example of an ASLV light-emitting device 2900 that includes a light-emitting element 2910, a scattering element 2920 (also referred to as a first optical element), an extractor element 2930 (also referred to as a second optical element), and a recovery enclosure 2940.

The light-emitting element 2910 is configured to produce and emit light during operation. A spectral power distribution of light emitted by the light-emitting element 2910 (also referred to as pump light) can be blue, for instance. The spectral power distribution for visible light is referred to as chromaticity. The scattering element 2920 has a first surface (also referred to as a light-entry surface) spaced apart from the light-emitting element 2910 and positioned to receive the light from the light-emitting element 2910. The scattering element 2920 includes scattering centers arranged to substantially isotropically scatter the light from the light-emitting element 2910 and to provide scattered light. The scattered light includes elastically scattered pump light and inelastically scattered pump light. Spectral power distribution of the elastically scattered light is the same as the spectral power distribution of the pump light, and spectral power distribution of the inelastically scattered light can be yellow, for instance. A spectrum 111 of the elastically scattered pump light and a spectrum 113 of the inelastically scattered pump light are shown in FIG. 1B along with a spectrum 115 of the scattered light.

Referring again to FIG. 29, the extractor element 2930 is formed from a transparent material having an exit surface. The exit surface is generally a curved, transparent surface. In other words, changes in the scattered light passing through the exit surface can generally be described by Snell's law of refraction, as opposed to, for example, an opaque or diffuse surface where further scattering of transmitted light occurs. The extractor element 2930 is in contact with the scattering element 2920, such that there is an optical interface between the scattering and extractor elements at the place of contact, and the optical interface is opposite the first surface of the scattering element. Moreover, the extractor element 2930 is arranged so that light scattered through the optical interface enters the extractor element 2930.

Further, the ASLV light-emitting device 2900 includes a medium adjacent the first surface of the scattering element having a refractive index n0, and the scattering element 2920 includes a material having a first refractive index n1, where n0<n1. The transparent material has a refractive index n2, where n0<n2. The exit surface is a transparent surface that includes multiple portions, such that each portion of the exit surface is joined to another portion at an edge. In some implementations, each portion of the exit surface is shaped such that an angle of incidence at each portion of the exit surface of the scattered light that directly impinges on the portion of the exit surface is less than the critical angle for total internal reflection. In this case, the extractor element 2930 is said to satisfy the Weierstrass condition, as described above in connection with FIG. 1A, for each portion of the exit surface. In some implementations, each portion of the exit surface is shaped such that an angle of incidence at each portion of the exit surface of the scattered light that directly impinges on the portion of the exit surface is less than the Brewster angle. In this case, the extractor element 2930 is said to satisfy the Brewster condition, as described above in connection with FIG. 1A, for each portion of the exit surface.

Furthermore, the recovery enclosure 2940 encloses the medium adjacent the first surface of the scattering element. The recovery enclosure 2940 is arranged and configured to recover a portion of the scattered light that propagates through the first surface into the medium. Additionally, a combination of a shape of the multiple portions of the exit surface of the second element and a shape of the optical interface is configured to (i) output scattered light through the exit surface, and (ii) control the intensity distribution of the output light. Moreover, the light output by the ASLV light-emitting device 2900 has a spectral power distribution corresponding to the spectrum 115 shown in FIG. 1B.

Figure 30A:
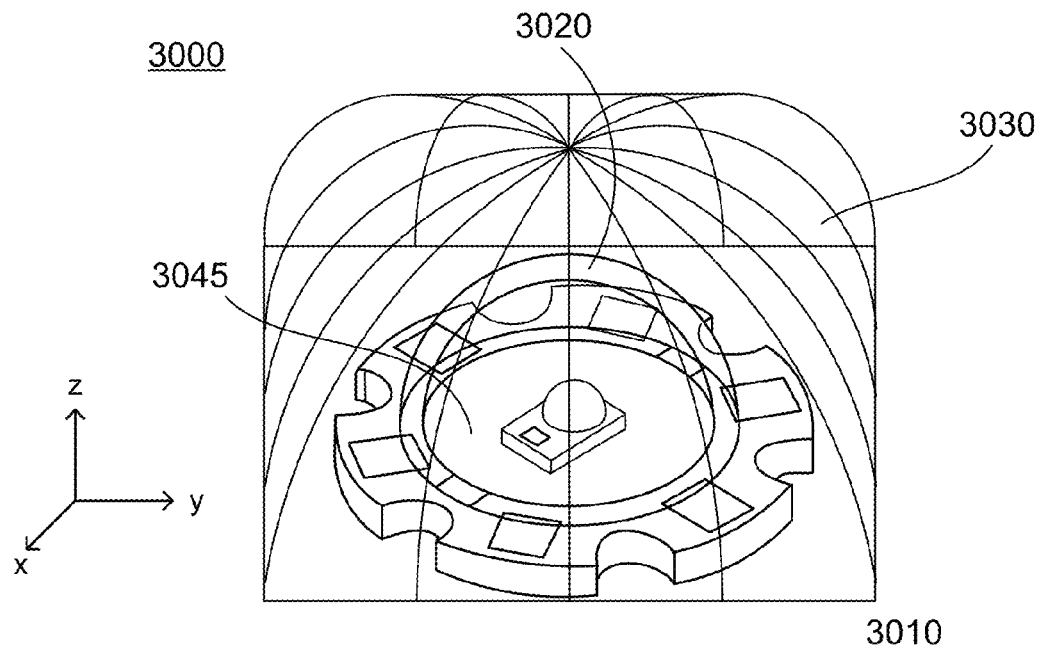
FIGS. 30A-30D show aspects of an example of a light-emitting device having a hemispherical scattering element and an extractor shaped as a squared hemisphere.
Figure 30B:
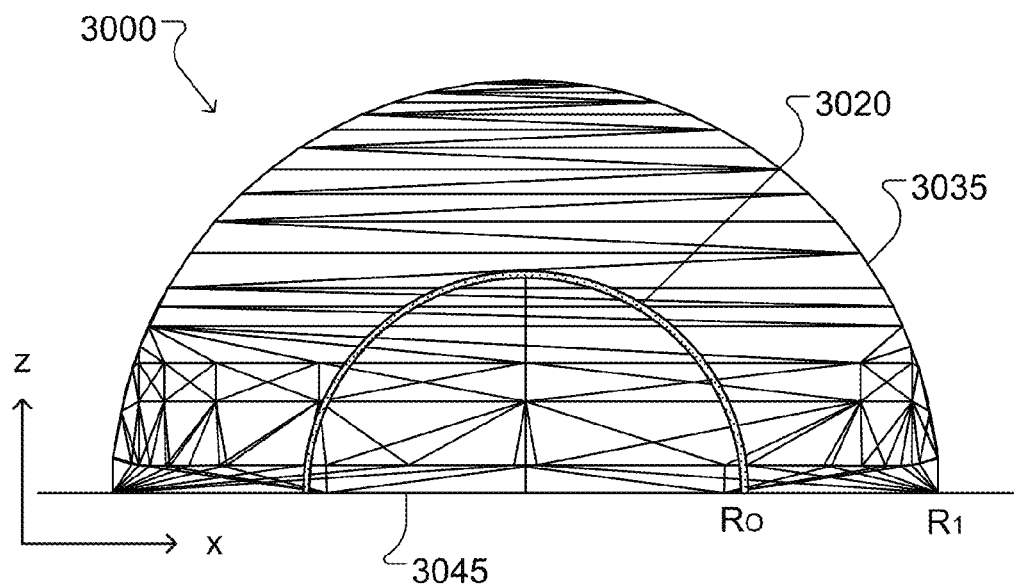

FIGS. 30A-30B show aspects of an example of an ASLV light-emitting device 3000 having a hemispherical scattering element 3020 and an extractor element 3030 that is circular in an x-z cross-section or a y-z cross-section, and has a square footprint in an x-y cross-section. The extractor element 3030 of the ASLV light-emitting device 3000 includes a volume common to two crossed semi-circular cylinders, hence, the extractor element 3030 is a cushion shaped object, whose section parallel to the sides of the square (in planes x-z or y-z), through the center, is a semi-circle. Planes through this center at other angles to the sides have oblate ellipsoidal sections, reaching a maximum eccentricity along the diagonals of the square form. The shortest cross section of the extractor element 3030 of the ASLV light-emitting device 3000 is a semicircle, and the longest is an oblate ellipse.

Many other choices are possible as desired, for example the longest section seen above could be made a semi-circle, in which case, all other sections would be prolate ellipses, instead of oblate. Any cross-section between the shortest parallel to the sides (in planes x-z or y-z), and the longest diagonal section, can be made circular, in which case an exit surface of the extractor element would be narrower prolate ellipse, and wider oblate ellipse, as desired for an end application. For each of these forms of an exit surface of the extractor element 3035, the scattering element 3020 is contained within a volume of the extractor element which satisfies, for all possible ray directions, at least the critical angle (corresponding to the Weierstrass) condition, and preferably the Brewster angle incidence condition. The scattering element 3020 can itself have a variety of shapes within the limits of the Critical or Brewster condition volumes, to further control the flux distribution patterns obtainable from the scattering element.

Figure 30C:
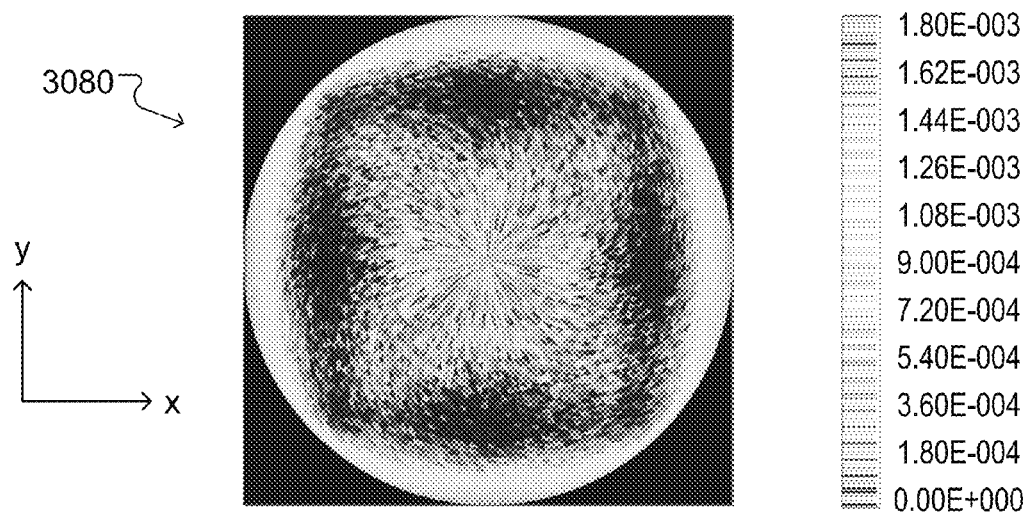
Figure 30D:
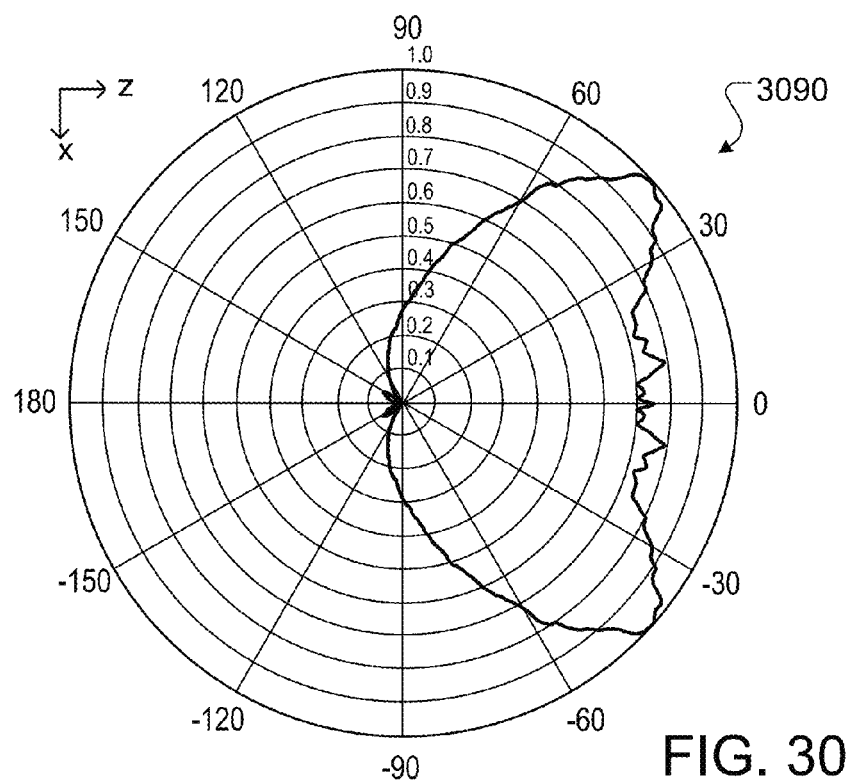

FIG. 30C shows x-y far field illuminance (intensity distribution) 3080 in an x-y plane perpendicular to an optical z-axis, and FIG. 30D shows x-z far field illuminance (intensity distribution) 3090 in an x-z plane that contains the optical z-axis corresponding the ASLV light-emitting device 3000. The extractor element 3030 of the ASLV light-emitting device 3000 is shaped like crossed semi-circular cylinders with a conic constant K of zero (K=0). The diagonal is an oblate ellipse. The results illustrated in FIGS. 30C-30D show that the ASLV light-emitting device 3000 has better far field illuminance in the diagonal corner directions, and thus, gives better area illuminance patterns, compared to the rotationally symmetric ASLV light-emitting device 200, described above in connection with FIGS. 2A-2D. This example of extractor shape enables the ASLV light-emitting device 3000 to provide more intensity in the diagonal directions of the square room, leading to better illuminance in the corners, compared to a rotationally uniform pattern.

A wide range of possible illuminance or intensity patterns are available with different forms for the cushion shaped extraction surface 3035, and different forms of the internal effective light emitting volume of the scattering element 3020.

Figure 31A:
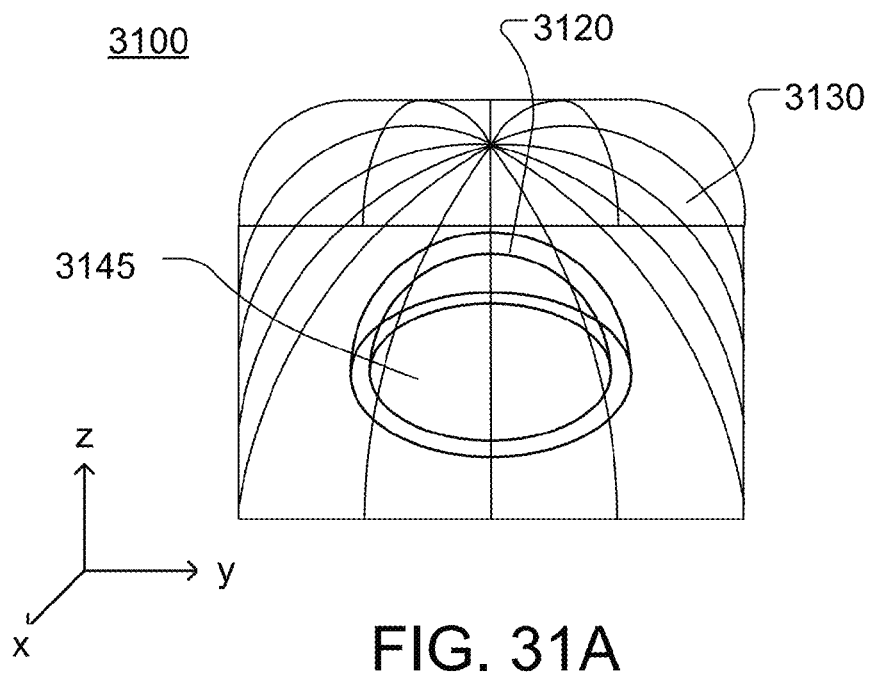
FIGS. 31A-31D show aspects of an example of a light-emitting device having a hemispherical scattering element and an extractor shaped as crossed elliptic cylinders.
Figure 31B:
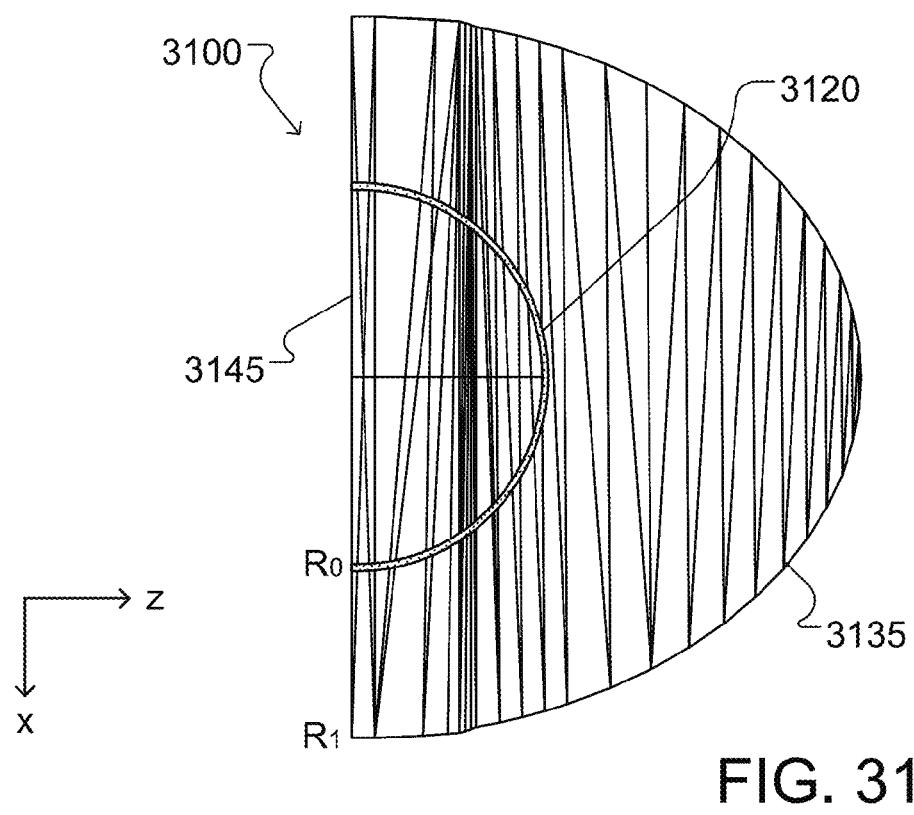
Figure 31C:
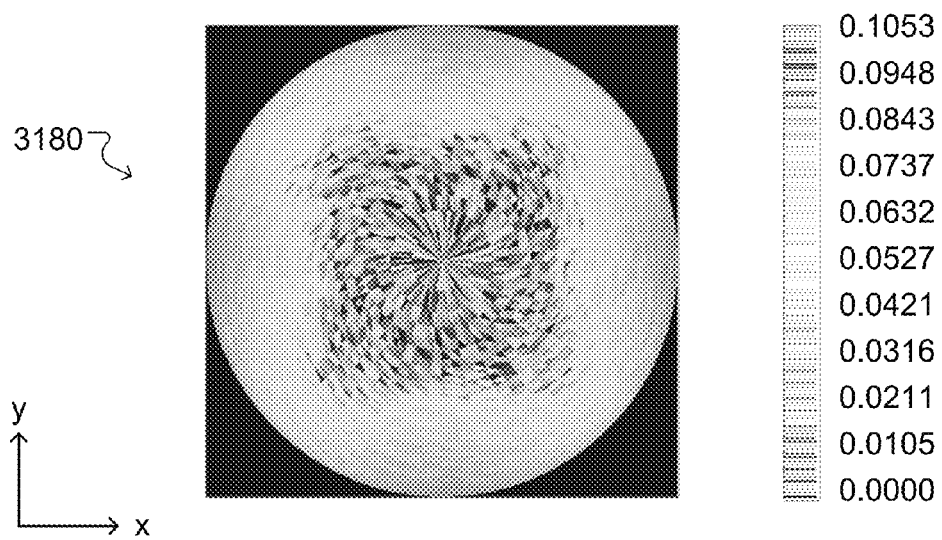
Figure 31D:
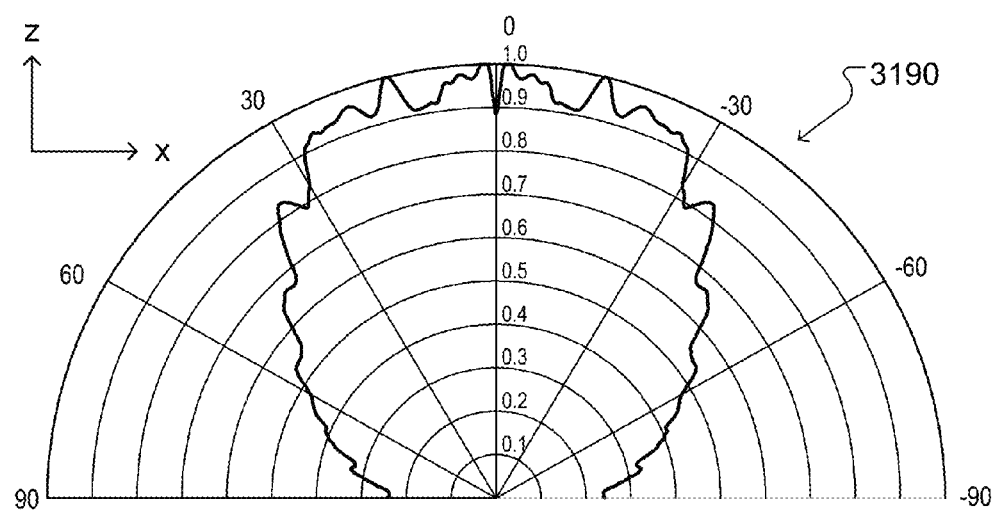

FIGS. 31A-31B show aspects of an example of an ASLV light-emitting device 3100 having a hemispherical scattering element 3120 and an extractor element 3130 shaped like crossed elliptic cylinders, with a diagonal section that is circular and a square footprint in the x-y plane. In this example, the ellipse has K=−0.5. FIG. 31C shows x-y far field illuminance (intensity distribution) 3180 in an x-y plane perpendicular to an optical z-axis, and FIG. 31D shows x-z far field illuminance (intensity distribution) 3190 in an x-z plane that contains the optical z-axis corresponding the ASLV light-emitting device 3100.

Figure 32:
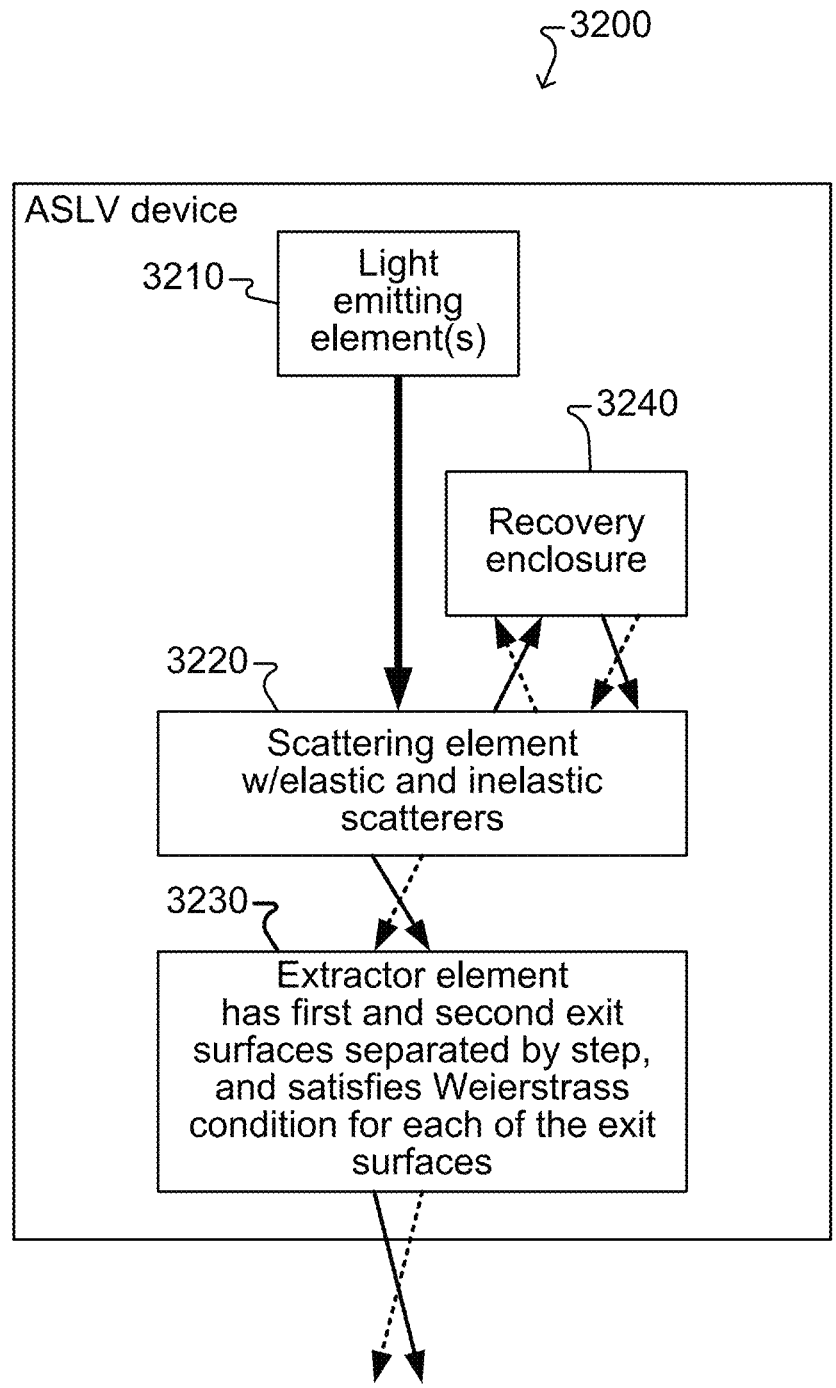
FIG. 32 is a schematic diagram of an example of an ASLV light-emitting device having an extractor element with two exit surfaces separate by a step.

While the foregoing embodiments feature extractor elements that include a single exit surface or facet exit surfaces, other embodiments are also possible. For example, FIG. 32 shows a schematic diagram of an example of an ASLV light-emitting device 3200 that includes an extractor element 3230 that has first and second exit surfaces separated by a step. The light-emitting device 3200 also includes a light-emitting element 3210, a scattering element 3220 (also referred to as a first optical element), and a recovery enclosure 3240.

The light-emitting element 3210 is configured to produce and emit light during operation. A spectral power distribution of light emitted by the light-emitting element 3210 (also referred to as pump light) can be blue, for instance. The spectral power distribution for visible light is referred to as chromaticity. The scattering element 3220 has a first surface (also referred to as a light-entry surface) spaced apart from the light-emitting element 3210 and positioned to receive the light from the light-emitting element 3210. The scattering element 3220 includes scattering centers arranged to substantially isotropically scatter the light from the light-emitting element and to provide scattered light. The scattered light includes elastically scattered pump light and inelastically scattered pump light. Spectral power distribution of the elastically scattered light is the same as the spectral power distribution of the pump light, and spectral power distribution of the inelastically scattered light can be yellow, for instance. A spectrum 111 of the elastically scattered pump light and a spectrum 113 of the inelastically scattered pump light are shown in FIG. 1B along with a spectrum 115 of the scattered light.

Referring again to FIG. 32, the extractor element 3230 is formed from a transparent material and is in contact with the scattering element 3220, such that there is an optical interface between the scattering and extractor elements at the place of contact, and the optical interface is opposite the first surface of the scattering element. Moreover, the extractor element 3230 is arranged so that light scattered through the optical interface enters the extractor element 3230.

Further, the ASLV light-emitting device 3200 includes a medium adjacent the first surface of the scattering element having a refractive index n0, and the scattering element includes a material having a first refractive index n1, where n0<n1. The transparent material has a refractive index n2, where n0<n2. The first and second exit surfaces are generally curved, transparent surfaces. In other words, changes in the scattered light passing through the first and second exit surfaces can generally be described by Snell's law of refraction, as opposed to, for example, an opaque or diffuse surface where further scattering of transmitted light occurs. In some implementations, the first and second exit surfaces are at least partially transparent and shaped such that an angle of incidence at the first and second exit surfaces of at least some of the scattered light that directly impinges thereon is less than the critical angle for total internal reflection. In this case, the extractor element 3230 is said to satisfy the Weierstrass condition, as described above in connection with FIG. 1A, for each of the exit surfaces. In some implementations, the first and second exit surfaces are shaped such that an angle of incidence at the first and second exit surfaces of at least some of the scattered light that directly impinges thereon is less than the Brewster angle. In this case, the extractor element 3230 is said to satisfy the Brewster condition, as described above in connection with FIG. 1A, for each of the exit surfaces. Furthermore, the recovery enclosure 3240 encloses the medium adjacent the first surface of the scattering element. The recovery enclosure 3240 is arranged and configured to recover a portion of the scattered light that propagates through the first surface into the medium. Additionally, the ASLV light-emitting device 3200 outputs scattered light through the first and second exit surfaces into the ambient environment. As described above, the light output by the ASLV light-emitting device 3200 has a spectral power distribution corresponding to the spectrum 115 shown in FIG. 1B.

For example, the first surface can be arranged to intersect an optical axis of the light-emitting element 3200. In some implementations, the first exit surface is recessed relative to the second exit surface. In other implementations, the second exit surface is recessed relative to the first exit surface. Moreover, the step can include one of a reflective surface or a transparent surface. In some implementations, at least one of the first and second exit surfaces is translucent.

An ASLV light-emitting device 3200 having multiple exit surfaces separated by a step can provide different magnifications for light emanating from the scattering element 3200 in directions corresponding to the exit surfaces. In this manner, the relative magnification of the exit surfaces can be adjusted to bias an intensity distribution of the ASLV light-emitting device 3200 in a direction of one of the exit surfaces. Example implementations of the ASLV light-emitting device 3200 are described below in connection with FIGS. 33-37.

Figure 33A:
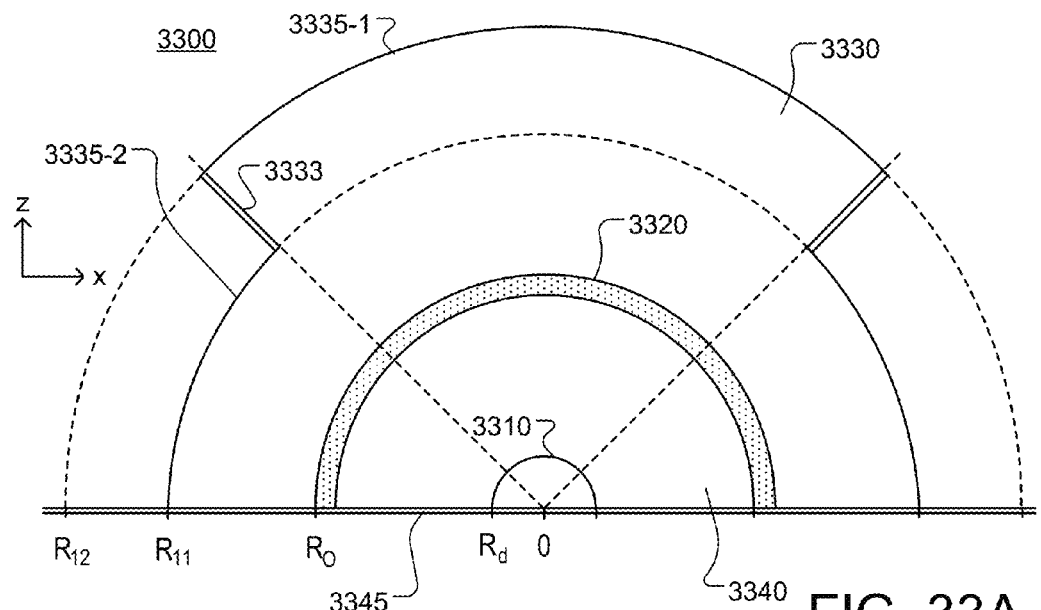
FIGS. 33A-33B show aspects of an example of a light-emitting device having a hemispherical scattering element and a step in an exit surface of an extractor element.

FIG. 33A shows an ASLV light-emitting device 3300 having a hemispherical scattering element 3320 and a step 3333 arranged between a first exit surface 3335-1 and a second exit surface 3335-2 of an extractor element 3330. The first surface 3335-1 is arranged to intersect an optical z-axis of the ASLV light-emitting device 3300. The ASLV light-emitting device 3300 further includes a light-emitting element 3310 and a planar reflector 3345. A recovery cavity 3340 is formed from a light-entry surface of the scattering element 3320 and the planar reflector 3345. The recovery cavity 3340 is filled with a gas, e.g., air, or is evacuated. An index of refraction np of the scattering element 3320 is larger than or equal to an index of refraction n1 of the extractor element 3330. The light-emitting element 3310 is located in an aperture of the planar reflector 3345 and emits light in the recovery cavity 3340.

The scattering element 3320 is contained within a notional $R_O$ semi-sphere. In some implementations, the $R_O$ semi-sphere represents the Weierstrass sphere corresponding to the shorter of radius R11 of the first exit surface 3335-1 and radius R12 of the second exit surface 3335-2. For the example illustrated in FIG. 33A, the first exit surface 3335-1 is recessed relative to the second exit surface 3335-2 hence a radius R12 of the second exit surface 3335-2 is shorter than a radius R11 of the first exit surface 3335-1. In this manner, the Weierstrass condition is satisfied for the second exit surface of the extractor 3335-2. In some implementations, the $R_O$ semi-sphere represents the Brewster sphere corresponding to the shorter of radius R11 of the first exit surface 3335-1 and radius R12 of the second exit surface 3335-2. When R12<R11, the Brewster condition is satisfied for the second exit surface of the extractor 3335-2.

To reduce potential TIR light losses at the step 3333 between the first 3335-1 and second 3335-2 exit surfaces of the extractor element 3330, the step 3333 is formed as a two-sided mirror. As radius R12 of the second 3335-2 exit surface of the extractor 3330 satisfies the Weierstrass condition, most rays hitting the mirror of the step 3333 on the central side transmit through the first exit surface 3335-1 without TIR. All rays transmitted from the outer edge of the scattering element 3320 towards the upper edge of the second exit surface 3335-2 of the extractor 3330 hit the outside of the mirror of the step 3333 and are redirected in a backwards direction at >90° to the optical z-axis. An optional extension of the mirror 3345 of the recovery enclosure 3340 can turn most of these rays back into a forward direction (along the +z axis.)

The planar reflector 3345 extends laterally to the outer edge of the extractor element 3320. In some implementations, the planar reflector 3345 extends laterally to an outer edge of the second exit surface 3335-2, to a distance equal to a radius R12. In other implementations, the planar reflector 3345 extends laterally farther out than the second exit surface 3335-2, for example to a distance between R12 and R11, or to a distance of 1.2×, 1.5× or 2.0×R11.

Figure 33B:
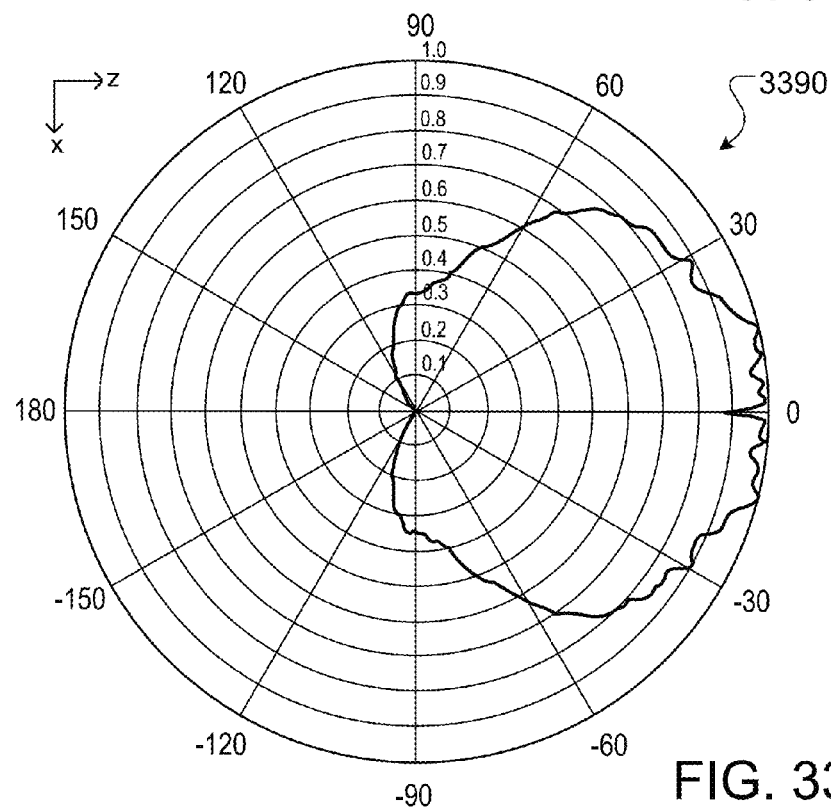

FIG. 33B shows an intensity distribution 3390 output by an ASLV light-emitting device similar to the ASLV light-emitting device 3300. Although the scattering elements of the ASLV light-emitting device 3300 and of the ASLV light-emitting device 200 are both hemispherical, the intensity distribution 3390 has a stronger forward bias that the intensity distribution 290. The reason for the noted increase in forward bias is that the center exit surface of the extractor element 3335-1 of the ASLV light-emitting device 3300 has optical power that is larger than the optical power of the corresponding portion of the exit surface of the extractor element 235 of the ASLV light-emitting device 200. Moreover, the intensity distribution 3390 covers a solid angle of >2π sr since light originating from the upper part of the scattering element 3320 and propagating towards the lower edges of the extractor 3330 will be refracted into angles >90° from the optical z-axis.

Figure 34A:
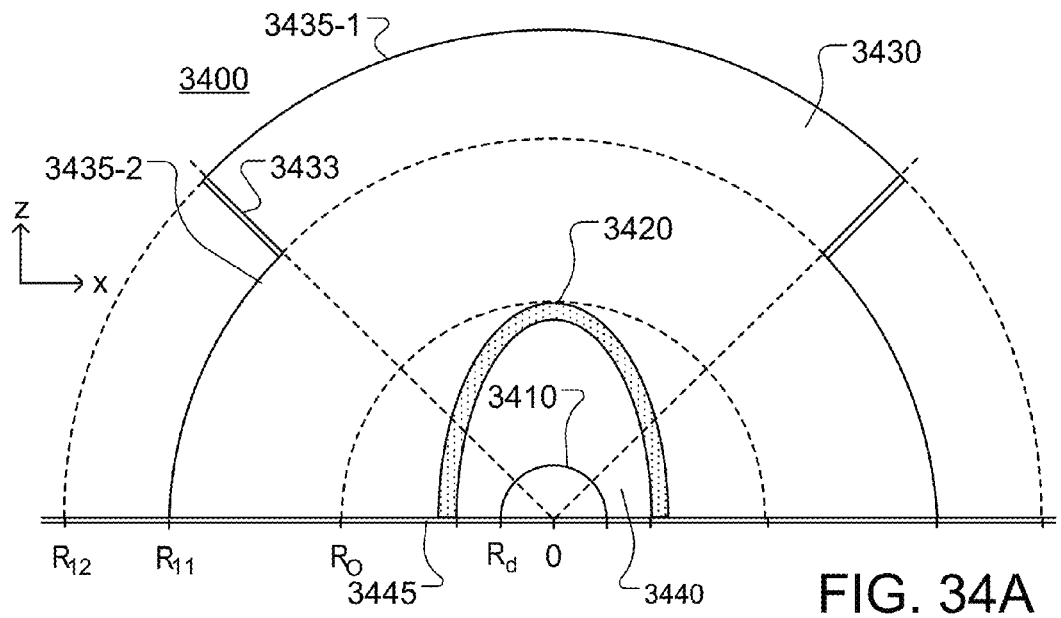
FIGS. 34A-34B show aspects of an example of a light-emitting device having an elliptical scattering element and a step in an exit surface of an extractor element.

FIG. 34A shows an ASLV light-emitting device 3400 having an elliptical scattering element 3420 and a step 3433 arranged between a first exit surface 3435-1 and a second exit surface 3335-2 of an extractor element 3430. The first surface 3435-1 is arranged to intersect an optical z-axis of the ASLV light-emitting device 3400. The ASLV light-emitting device 3400 further includes a light-emitting element 3410 and a planar reflector 3445. A recovery cavity 3440 is formed from a light-entry surface of the scattering element 3420 and the planar reflector 3445. The recovery cavity 3440 is filled with a gas, e.g., air, or is evacuated. An index of refraction np of the scattering element 3420 is larger than or equal to an index of refraction n1 of the extractor element 3430. The light-emitting element 3410 is located in an aperture of the planar reflector 3445 and emits light in the recovery cavity 3440.

The semi-ellipsoidal scattering element 3420 is contained within a notional $R_O$ semi-sphere. In some implementations, the $R_O$ semi-sphere represents the Weierstrass sphere corresponding to the shorter of radius R11 of the first exit surface 3435-1 and radius R12 of the second exit surface 3435-2. For the example illustrated in FIG. 34A, the first exit surface 3435-1 is recessed relative to the second exit surface 3435-2 hence a radius R12 of the second exit surface 3435-2 is shorter than a radius R11 of the first exit surface 3435-1. In this manner, the Weierstrass condition is satisfied for the second exit surface of the extractor 3435-2. In some implementations, the $R_O$ semi-sphere represents the Brewster sphere corresponding to the shorter of radius R11 of the first exit surface 3435-1 and radius R12 of the second exit surface 3435-2. When R12<R11, the Brewster condition is satisfied for the second exit surface of the extractor 3435-2.

To reduce potential TIR light losses at the step 3433 between the first 3435-1 and second 3435-2 exit surfaces of the extractor element 3430, the step 3433 is formed as a two-sided mirror. As radius R12 of the second 3435-2 exit surface of the extractor 3430 satisfies the Weierstrass condition, most rays hitting the mirror of the step 3433 on the central side transmit through the first exit surface 3435-1 without TIR. All rays transmitted from the outer edge of the scattering element 3420 towards the upper edge of the second exit surface 3435-2 of the extractor 3430 hit the outside of the mirror of the step 3433 and are redirected in a backwards direction at >90° to the optical z-axis. An optional extension of the mirror 3445 of the recovery enclosure 3440 can turn most of these rays back into a forward direction (along the +z axis.)

The planar reflector 3445 extends laterally to the outer edge of the extractor element 3320. In some implementations, the planar reflector 3445 extends laterally to an outer edge of the second exit surface 3435-2, to a distance equal to a radius R12. In other implementations, the planar reflector 3445 extends laterally farther out than the second exit surface 3435-2, for example to a distance between R12 and R11, or to a distance of 1.2×, 1.5× or 2.0×R11.

Figure 34B:
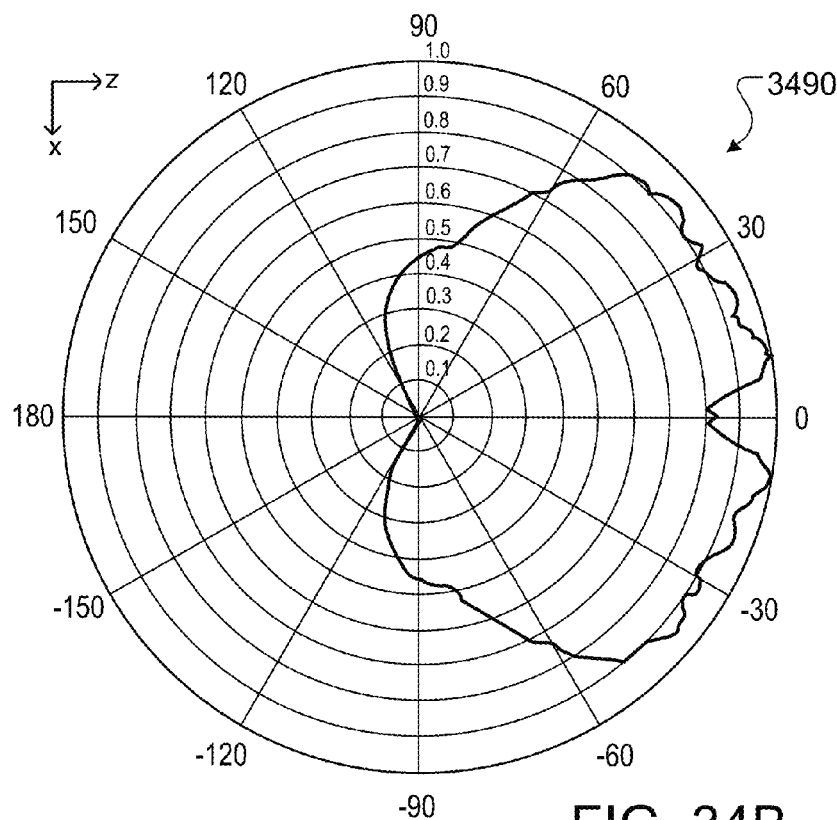

FIG. 34B shows an intensity distribution 3490 output by an ASLV light-emitting device similar to the ASLV light-emitting device 3400. Although the scattering elements of the ASLV light-emitting device 3400 and of the ASLV light-emitting device 1900 are both semi-ellipsoidal, the intensity distribution 3490 has a stronger forward bias that the intensity distribution 1990. The reason for the noted increase in forward bias is that the center exit surface of the extractor element 3435-1 of the ASLV light-emitting device 3400 has optical power that is larger than the optical power of the corresponding portion of the exit surface of the extractor element 1935 of the ASLV light-emitting device 1900. Moreover, the intensity distribution 3490 covers a solid angle of >2π sr since light originating from the upper part of the scattering element 3420 and propagating towards the lower edges of the extractor 3430 will be refracted into angles >90° from the optical z-axis.

Figure 35A:
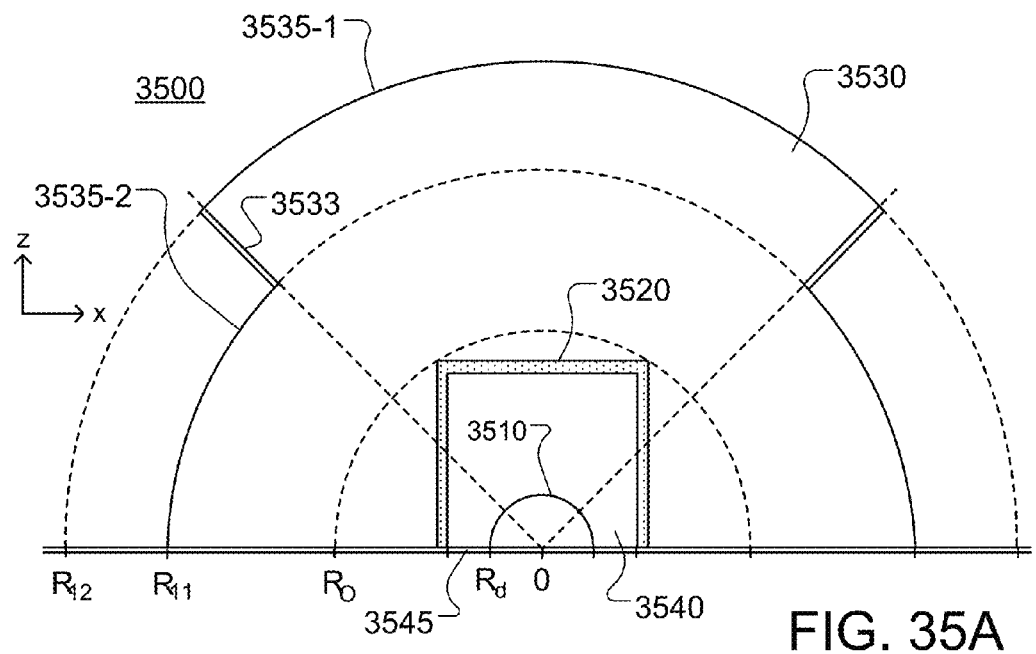
FIGS. 35A-35B show aspects of an example of a light-emitting device having a rectangular scattering element and a step in an exit surface of an extractor element.

FIG. 35A shows an ASLV light-emitting device 3500 having a rectangular scattering element 3520 and a step 3533 arranged between a first exit surface 3535-1 and a second exit surface 3535-2 of an extractor element 3530. The rectangular phosphor shape illustrated in FIG. 35 represents a diagonal cut of the rectangular scattering element 3520 of the ASLV light-emitting device 3500. The first surface 3535-1 is arranged to intersect an optical z-axis of the ASLV light-emitting device 3500. The ASLV light-emitting device 3500 further includes a light-emitting element 3510 and a planar reflector 3545. A recovery cavity 3540 is formed from a light-entry surface of the scattering element 3520 and the planar reflector 3545. The recovery cavity 3540 is filled with a gas, e.g., air, or is evacuated. An index of refraction np of the scattering element 3520 is larger than or equal to an index of refraction n1 of the extractor element 3530. The light-emitting element 3510 is located in an aperture of the planar reflector 3545 and emits light in the recovery cavity 3540.

The rectangular scattering element 3520 is contained within a notional $R_O$ semi-sphere. In some implementations, the $R_O$ semi-sphere represents the Weierstrass sphere corresponding to the shorter of radius R11 of the first exit surface 3535-1 and radius R12 of the second exit surface 3535-2. For the example illustrated in FIG. 35A, the first exit surface 3535-1 is recessed relative to the second exit surface 3535-2 hence a radius R12 of the second exit surface 3535-2 is shorter than a radius R11 of the first exit surface 3535-1. In this manner, the Weierstrass condition is satisfied for the second exit surface of the extractor 3535-2. In some implementations, the $R_O$ semi-sphere represents the Brewster sphere corresponding to the shorter of radius R11 of the first exit surface 3535-1 and radius R12 of the second exit surface

3535-2. When R12<R11, the Brewster condition is satisfied for the second exit surface of the extractor 3535-2.

To reduce potential TIR light losses at the step 3533 between the first 3535-1 and second 3535-2 exit surfaces of the extractor element 3530, the step 3533 is formed as a two-sided mirror. As radius R12 of the second 3535-2 exit surface of the extractor 3530 satisfies the Weierstrass condition, most rays hitting the mirror of the step 3533 on the central side transmit through the first exit surface 3535-1 without TIR. All rays transmitted from the outer edge of the scattering element 3520 towards the upper edge of the second exit surface 3535-2 of the extractor 3530 hit the outside of the mirror of the step 3533 and are redirected in a backwards direction at >90° to the optical z-axis. An optional extension of the mirror 3545 of the recovery enclosure 3540 can turn most of these rays back into a forward direction (along the +z axis.)

The planar reflector 3545 extends laterally to the outer edge of the scattering element 3520. In some implementations, the planar reflector 3545 extends laterally to an outer edge of the second exit surface 3535-2, to a distance equal to a radius R12. In other implementations, the planar reflector 3545 extends laterally farther out than the second exit surface 3535-2, for example to a distance between R12 and R11, or to a distance of 1.2×, 1.5× or 2.0×R11.

Figure 35B:
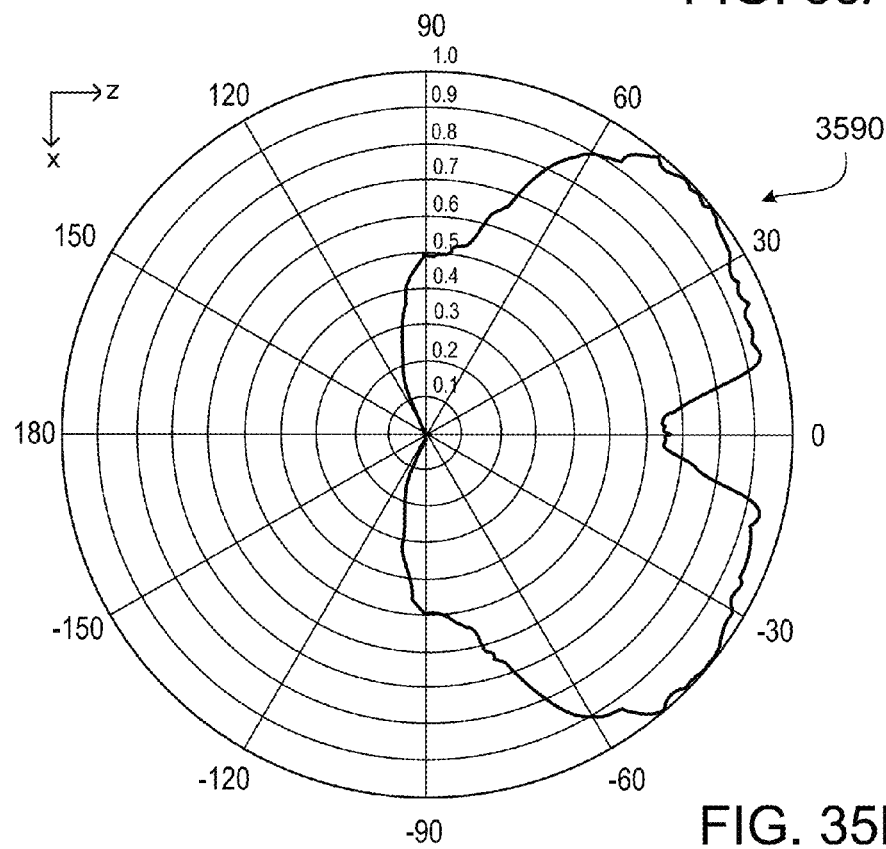

FIG. 35B shows an intensity distribution 3590 output by an ASLV light-emitting device similar to the ASLV light-emitting device 3500. Although the intensity distribution 3590 is forward biased, it indicates that the ASLV light-emitting device 3500 favors transverse (in the ±directions of the x- or y-axis, simply referred to as lateral or side) emission at the expense of on-axis emission (along the z-axis.) Moreover, the intensity distribution 3590 covers a solid angle of >2π sr since light originating from the upper part of the scattering element 3520 and propagating towards the lower edges of the extractor element 3530 will be refracted into angles >90° from the optical z-axis.

Figure 36:
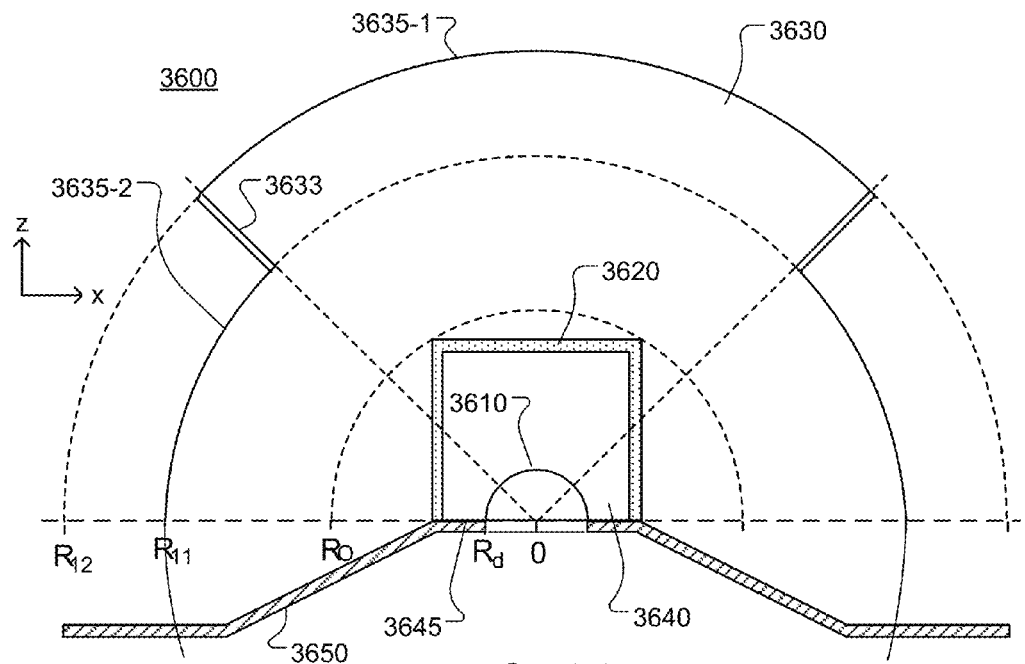
FIG. 36 shows an example of a light-emitting device having a rectangular scattering element and an extractor element with an exit surface that has a step and extends beyond a 90° angle from the optical axis.

FIG. 36 shows an ASLV light-emitting device 3600 having a rectangular scattering element 3620 and an extractor element 3630 with a first exit surface 3635-1 and a second exit surface 3635-2 separated by a step 3633. In addition, the second exit interface 3635-2 extends beyond a 90° angle from the optical z-axis. The first surface 3635-1 is arranged to intersect an optical z-axis of the ASLV light-emitting device 3600. The ASLV light-emitting device 3600 further includes a light-emitting element 3610 and a planar reflector 3645. A recovery cavity 3640 is formed from a light-entry surface of the scattering element 3620 and the planar reflector 3645. The recovery cavity 3640 is filled with a gas, e.g., air, or is evacuated. An index of refraction np of the scattering element 3620 is larger than or equal to an index of refraction n1 of the extractor element 3630. The light-emitting element 3610 is located in an aperture of the planar reflector 3645 and emits light in the recovery cavity 3640.

The rectangular scattering element 3620 is contained within a notional $R_O$ semi-sphere. In some implementations, the $R_O$ semi-sphere represents the Weierstrass sphere corresponding to the shorter of radius R11 of the first exit surface 3635-1 and radius R12 of the second exit surface 3635-2. For the example illustrated in FIG. 36, the first exit surface 3635-1 is recessed relative to the second exit surface 3635-2 hence a radius R12 of the second exit surface 3635-2 is shorter than a radius R11 of the first exit surface 3635-1. In this manner, the Weierstrass condition is satisfied for the second exit surface of the extractor 3635-2. In some implementations, the $R_O$ semi-sphere represents the Brewster sphere corresponding to the shorter of radius R11 of the first exit surface 3635-1 and radius R12 of the second exit surface 3635-2. When R12<R11, the Brewster condition is satisfied for the second exit surface of the extractor 3635-2.

To reduce potential TIR light losses at the step 3633 between the first 3635-1 and second 3635-2 exit surfaces of the extractor element 3630, the step 3633 is formed as a two-sided mirror. As radius R12 of the second 3635-2 exit surface of the extractor 3330 satisfies the Weierstrass condition, most rays hitting the mirror of the step 3633 on the central side transmit through the first exit surface 3635-1 without TIR. All rays transmitted from the outer edge of the scattering element 3620 towards the upper edge of the second exit surface 3635-2 of the extractor 3630 hit the outside of the mirror of the step 3633 and are redirected in a backwards direction at >90° to the optical z-axis. An optional mirror 3650 that extends the recovery enclosure 3640 can turn most of these rays back into a forward direction (along the +z axis) as described below.

The mirror 3650 is arranged to extend the planar reflector 3645 that forms the recovery enclosure 3640. Moreover, the mirror 3650 is shaped to couple at one end with the edge of the scattering element 3620 and at the other end with the edge of the second exit surface of the extractor element 3636-2. As noted above, in the example illustrated in FIG. 36, the edge of the second exit surface of the extractor element 3636-2 extends below the plane formed by the planar reflector 3645, and such that the edge of the second exit surface of the extractor element 3636-2 has angular coordinate that is larger than 90° with respect to the optical z-axis. In this case, the mirror 3650 includes two planar portions forming an angle with each. In other implementations, the mirror 3650 can be formed as a single, planar or curved (concave or convex) portion. In some cases, the mirror 3650 extends laterally farther out than the second exit surface 3635-2, for example to a distance between R12 and R11, or to a distance of 1.2×, 1.5× or 2.0×R11.

In some implementations, the mirror at the step 3633 between the first 3635-1 and second 3635-2 exit surfaces of the extractor element 3630 can be extended and arranged to reflect light in the backwards direction (in the negative direction of the z-axis). The latter variations are of interest in a pendant design with a designated "down light" distribution in the forward direction (in the positive direction of the z-axis) and a defined "backward lobe" to illuminate the ceiling (in the negative direction of the z-axis.)

Figure 37:
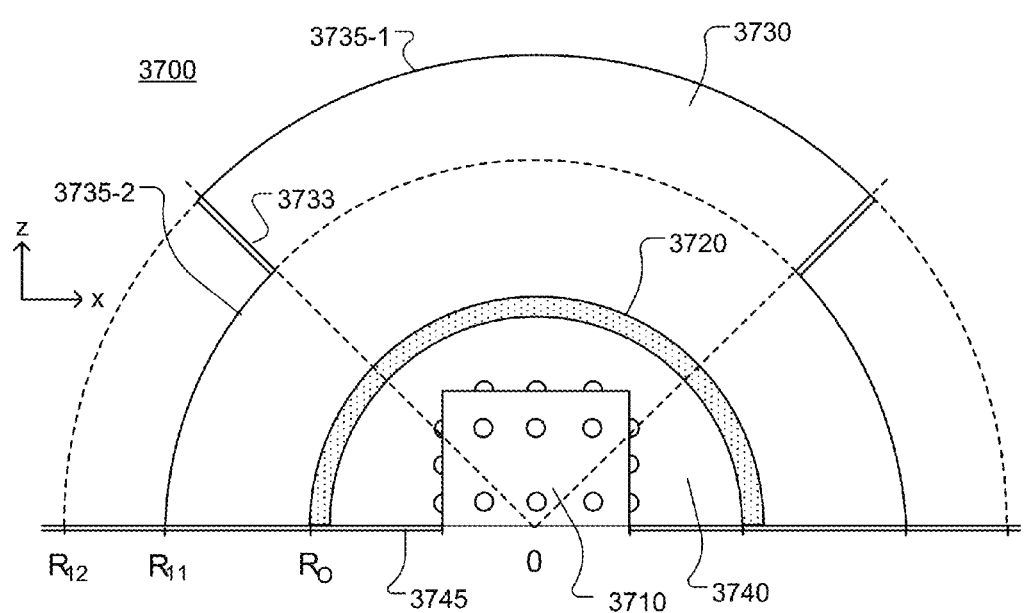
FIG. 37 shows an example of a light-emitting device having light-emitting devices of multiple chromaticities arranged on rectangular mount, and a step in an exit surface of an extractor element.

FIG. 37 shows an ASLV light-emitting device 3700 having a light-emitting element 3710 that includes multiple light-emitting devices of two or more chromaticities arranged on rectangular mount 3710. The ASLV light-emitting device 3700 also has a step 3733 arranged between a first exit surface 3735-1 and a second exit surface 3735-2 of an extractor element 3730. The size of the scattering element 3720 satisfies the Weierstrass condition. The multiple light-emitting devices of the light-emitting element 3710 can potentially be beneficial. For example, the light-emitting element 3710 can have multiple blue pumps to increase light output of the ASLV light-emitting device 3700. As another example, the light-emitting element 3710 can have multiple blue pumps and red LEDs to improve the efficacy of a warm white luminaire. In the latter example, multiple blue pumps and red LEDs can be independently addressed. For instance, the top LEDs dominating the phosphor illumination at the center can be independently addressed from the side LEDs dominating the side lobes in order to tune color and intensity output by the ASLV light-emitting device 3700 independently for the forward and side lobes. Since all sources are within the scattering element 3720, the far field intensity distribution can be color invariant.

Certain luminaire designs provide a bimodal distribution of light: a central down-cone of light in conjunction with a sheet of light directed sidewise and slightly backwards. The purpose of such a design is typically the dual function of down-light and ceiling illumination. As described below, ASLV devices that have a compound extractor can achieve such intensity distributions while keeping all the efficiency advantages presented by an ASLV light-emitting device.

As described above in this specification, certain ASLV designs maximize the forward light direction by using a Weierstrass geometry either as a truncated Weierstrass sphere (see, e.g., examples illustrated in FIGS. 4-6) or as a Weierstrass shell (see, e.g., examples illustrated in FIGS. 2 and 7). For maximum extraction of light from a light-emitting element that includes a blue pump and a phosphor element, rotational symmetry and Weierstrass geometry may represent the simplest design that exploits the contribution and value of the ASLV design.

Consider a semi-spherical scattering element illuminated by the Lambertian distribution of a light-emitting element described above in connection with FIG. 2A. It is believed that the central (top) region of the scattering element 220 will receive a higher level of radiation density than the outer perimeter. However, the light that is back-scattered from the scattering element 220 will be scattered again by the diffuse reflector 245 back into the scattering element 220. In this manner, the above-noted center-to-edge difference in illumination of the scattering element 220 will be reduced. While specific designs can be configured using optical design software, for example, one should end up with an intensity distribution radiating from the scattering element 220 that is (1) radially symmetric, (2) its brightness is decreasing from center to edge and (3) its angular distribution should be reproducible from device to device.

Figure 38:
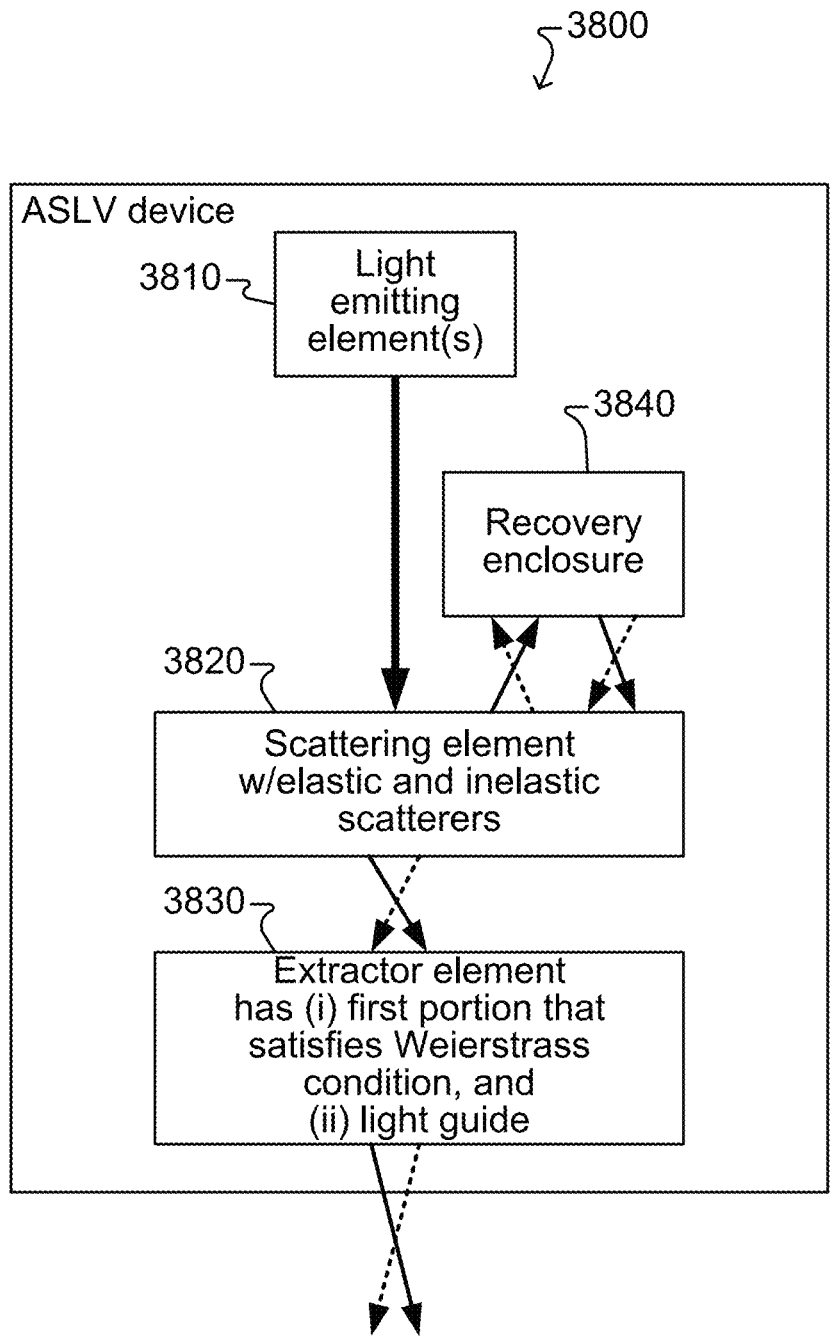
FIG. 38 is a schematic diagram of an example of an ASLV light-emitting device having an extractor element that includes a Weierstrass portion and a light guide.

FIG. 38 shows a schematic diagram of another example of an ASLV light-emitting device 3800 configured to meet the above requirements. The ASLV light-emitting device 3800 includes a light-emitting element 3810, a scattering element 3820 (also referred to as a first optical element), an extractor element 3830 (also referred to as a second optical element), and a recovery enclosure 3840.

The light-emitting element 3810 is configured to produce and emit light during operation. A spectral power distribution of light emitted by the light-emitting element 3810 (also referred to as pump light) can be blue, for instance. The spectral power distribution for visible light is referred to as chromaticity. The scattering element 3820 has a first surface (also referred to as a light-entry surface) spaced apart from the light-emitting element 3810 and positioned to receive the light from the light-emitting element 3810. The scattering element 3820 includes scattering centers arranged to substantially isotropically scatter the light from the light-emitting element 3810 and to provide scattered light. The scattered light includes elastically scattered pump light and inelastically scattered pump light. Spectral power distribution of the elastically scattered light is the same as the spectral power distribution of the pump light, and spectral power distribution of the inelastically scattered light can be yellow, for instance. A spectrum 111 of the elastically scattered pump light and a spectrum 113 of the inelastically scattered pump light are shown in FIG. 1B along with a spectrum 115 of the scattered light.

Referring again to FIG. 38, the extractor element 3830 is formed from a transparent and is in contact with the scattering element 3820, such that there is an optical interface between the scattering and extractor elements at the place of contact, and the optical interface is opposite the first surface of the scattering element. Moreover, the extractor element 3830 is arranged so that light scattered through the optical interface enters the extractor element 3830. In addition, the extractor element 3830 includes a first portion and a light guide. The first portion has an exit surface and is arranged to receive a first portion of the scattered light from the optical interface. In some implementations, the exit surface of the first portion is a transparent surface that is shaped such that an angle of incidence at the exit surface of the first portion of the scattered light that directly impinges on the exit surface of the first portion is less than the critical angle for total internal reflection. In this case, the first portion of the extractor element 3830 is said to satisfy the Weierstrass condition, as described above in connection with FIG. 1A. In some implementations, the exit surface of the first portion is shaped such that an angle of incidence at the exit surface of the first portion of the scattered light that directly impinges on the exit surface of the first portion is less than the Brewster angle. In this case, the first portion of the extractor element 3830 is said to satisfy the Brewster condition, as described above in connection with FIG. 1A.

The exit surface is generally a curved, transparent surface. In other words, changes in the scattered light passing through the exit surface can generally be described by Snell's law of refraction, as opposed to, for example, an opaque or diffuse surface where scattering of transmitted light occurs. The light guide is arranged to receive a second portion of the scattered light from the optical interface. Moreover the light guide has a guiding surface configured to guide the received second portion of the scattered light away from the optical interface by reflecting at least some of the received second portion of the scattered light.

Further, the ASLV light-emitting device 3800 includes a medium adjacent the first surface of the scattering element having a refractive index n0, and the scattering element 3820 includes a material having a first refractive index n1, where n0<n1. The transparent material has a refractive index n2, where n0<n2. Furthermore, the recovery enclosure 3840 encloses the medium adjacent the first surface of the scattering element. The recovery enclosure 3840 is arranged and configured to recover a portion of the scattered light that propagates through the first surface into the medium. The ASLV light-emitting device 3800 outputs scattered light through the exit surface into the ambient environment. As described above, the light output by the ASLV light-emitting device 3800 has a spectral power distribution corresponding to the spectrum 115 shown in FIG. 1B.

In some implementations, the first portion intersects an optical axis of the light-emitting element 3800. In some implementations, a reflective coating is disposed on the guiding surface. The reflective coating is configured to reflect the at least some of the received second portion of the scattered light. In some implementations, the light guide is configured to reflect the at least some of the received second light via total internal reflection. In some implementations, the light guide is configured to output predetermined amounts of light at predetermined distances from the light-emitting element 3810 through the guiding surface. For example, the guiding surface has a surface texture configured to extract the predetermined amounts of light. As another example, the light guide includes centers configured to scatter light such that the predetermined amounts of light are emitted at the predetermined distances from the light-emitting element 3810 through the guiding surface. In some implementations, the light guide has a distal surface configured to output at least a fraction of the at least some of the received second portion of the scattered light.

Figure 39:
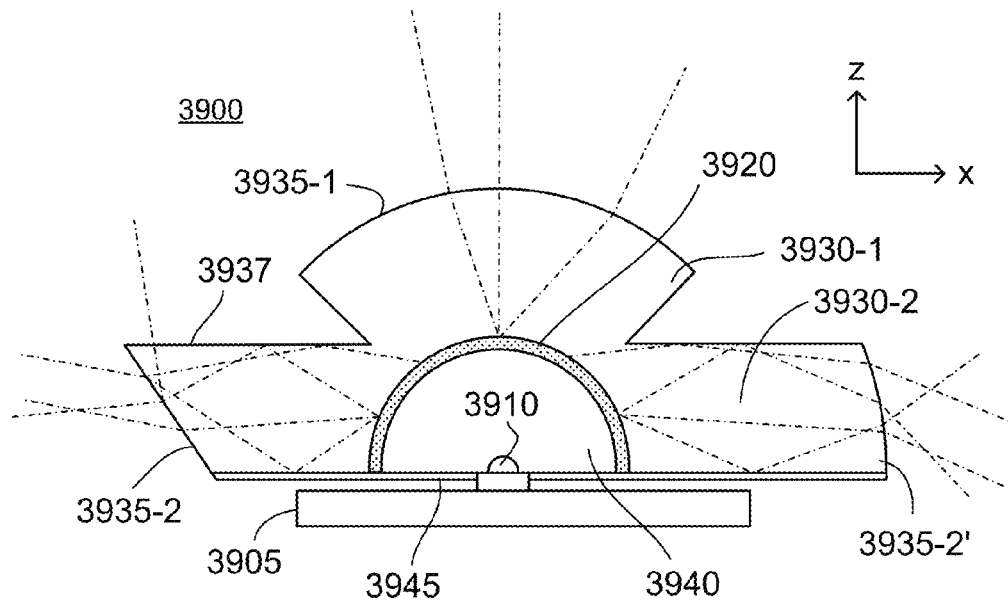
FIG. 39 shows an example of a light-emitting device having a compound extractor element.

FIG. 39 shows an ASLV light-emitting device 3900 having a compound extractor element. An intensity distribution output by the ASLV light-emitting device 3900 can be partitioned in two parts. Part 1 includes a central part of the intensity distribution that is extracted through a first portion of the compound extractor 3930-1 in the form of a truncated Weierstrass shell. In this example, the central part of the intensity distribution is shaped as a 90° cone. Part 2, the balance of the intensity distribution that is not in the central cone, is wave-guided sideways through a light guide of the compound extractor 3930-2 to an exit surface of the light guide 3935-2/3935-2'. In this example, a reflector 3945, which along with the scattering element 3920 forms a recovery enclosure 3940 of the ASLV light-emitting device 3900, extends to the exit surface of the light guide 3935-2/3935-2'. In this manner, the light scattered by the scattering element 3920 into the light guide 3930-2 is guided to the exit surface 3935-2/3935-2' via (i) TIR at a guiding surface 3937 and (ii) reflection at the extension of the reflector 3945.

A shape of the exit surface of the light guide 3935-2/3935-2' determines the Part 2 of the intensity distribution output by the ASLV light-emitting device 3900. In this manner, the exit surface of the compound extractor includes a central portion of the exit surface 3935-1 corresponding to the Weierstrass portion of the compound extractor 3930-1, and a side portion of the exit surface 3935-2, 3935-2' corresponding to the output surface of the light guide 3930-2. These two portions of the exit surface of the compound extractor 3935-1, 3935-2/3935-2' can yield a bi-modal intensity distribution of the light output by the ASLV light-emitting device 3900. For example, a particular configuration of the exit surface of the light guide 3935-2' can yield a slightly backwards directed cone of light exiting at 95-110 degrees relative to the optical axis in order to illuminate a large part of the ceiling.

In some embodiments, the light emitted from the scattering element 3920 is split into more than two parts with radial symmetry or into parts that result in an elliptical or other asymmetric intensity distribution in directions (x or y) perpendicular to the optical z-axis.

There are several degrees of freedom in shaping the light pattern output by the ASLV light-emitting device 3900. For example, as described above, the angle of the central portion of the compound extractor 3930-1 determines a ratio of central cone to side intensity distribution. Outer radius and thickness of the Weierstrass portion of the compound extractor 3930-1 can be varied to optimize axial collimation (along the z-axis.) Deviations from rotational symmetry of the light guide of the extractor element 3930-2 guiding the side-light may be used to provide a variety of distribution patterns of the side-light. The shape or surface structure of the exit surfaces 3935-2/3935-2' for the side light can be used to tailor the intensity distribution of the guided side-light. In the example illustrated in FIG. 39, a first portion of the exit surface of the light guide 3935-2 is arranged at a predetermined angle with respect to the optical z-axis of the ASLV light-emitting device 3900, and a second portion of the output surface of the light guide 3935-2' is arranged at a different angle from the predetermined angle and is configured with non-zero optical power.

Figure 40:
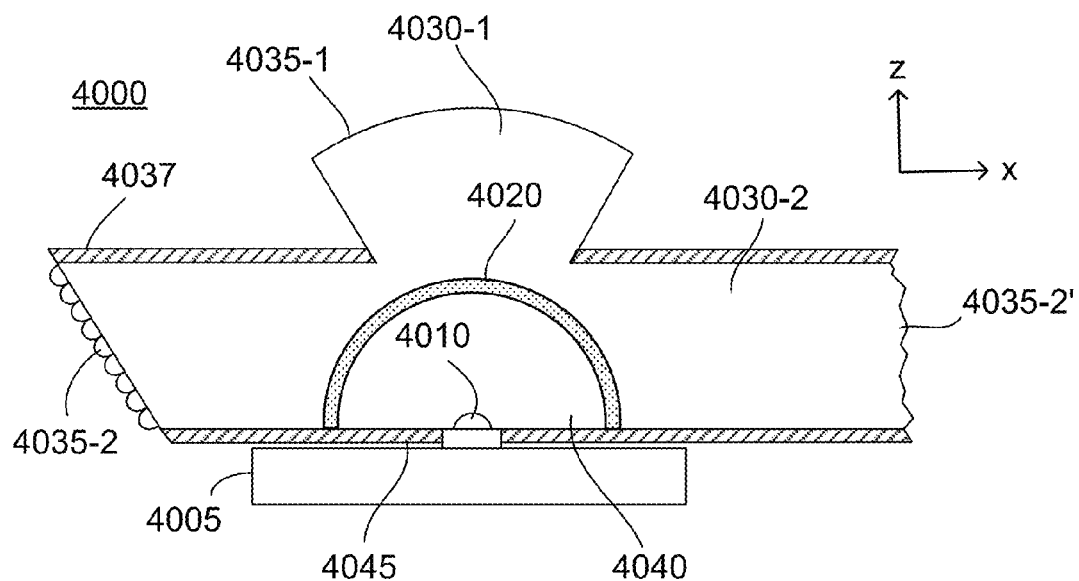
FIG. 40 shows another example of a light-emitting device having a compound extractor element.

FIG. 40 shows another ASLV light-emitting device 4000 having a compound extractor element that includes a central portion 4030-1 and a light guide 4030-2. In this example, the central portion of the compound extractor 4030-1 of the ASLV light-emitting device 4000 spans a cone angle of about 60°. Moreover, an exit surface of the central portion 4035-1 satisfies the Weierstrass condition. In this example, a reflector 4045, which along with the scattering element 4020 forms a recovery enclosure 4040 of the ASLV light-emitting device 4000, extends to the exit surface of the light guide 4035-2/4035-2'. In addition, a guiding surface of the light guide 4037 is coated with a reflective layer. In this manner, the light scattered by the scattering element 4020 into the light guide 4030-2 is guided to the exit surface 4035-2/4035-2' via reflections at the guiding surface 4037 and at the extension of the reflector 4045.

A first portion of the exit surface of the light guide 4035-2 includes a lens array, e.g., a fly-eye lens, and a second portion of the exit surface of the light guide 4035-2' is configured to diffuse the output light. For example, the second portion of the exit surface 4035-2' is configured to include indentations, scratches, pits, and the like.

Figure 41:
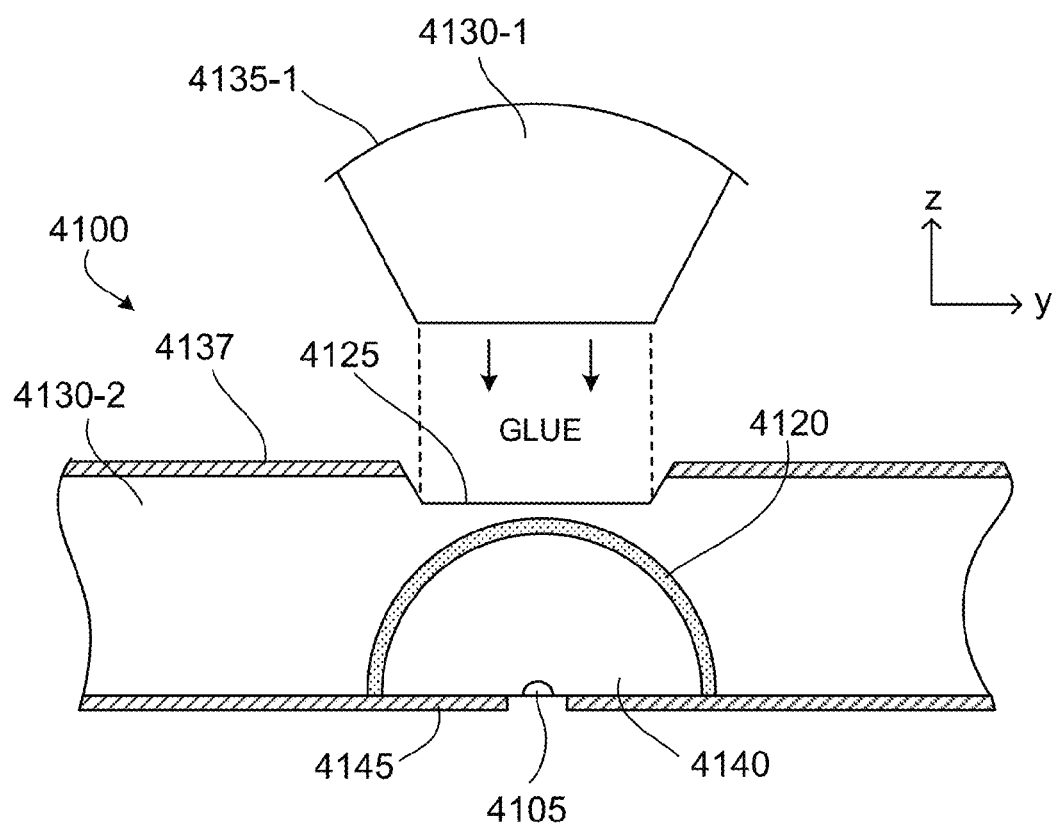
FIG. 41 shows aspects of a light-emitting device having compound extractor element.

FIG. 41 shows an example of a fabrication approach for the central section of the compound extractor 4130-1 of an ASLV light-emitting device 4100. The first step involves molding the side extractor 4130-2 and the center extractor 4130-1. The side extractor 4130-2 contains a semi-spherical enclosure 4140 where the scattering element 4120 will be deposited. Further, the side extractor 4130-2 contains an alignment indentation 4125 where the center extractor 4130-1 will mate with the side extractor 4130-2. Next, one can evaporate or glue a top reflector 4137 on the side extractor 4130-2. Next, one can deposit the scattering element 4120 in the enclosure 4140. Next, one can glue the bottom reflector 4145 with proper reference points to assure that a hole 4105 in the reflector is aligned with the optical z-axis. The final step of the assembly involves a void-free gluing of the center extractor 4130-a to the side extractor 4130-2 at the indentation 4125. The exit surfaces of the side extractor 4130-2 can either be molded or, if their structure is consistent with flexible tape, the exit surfaces can be glued onto the side walls using void-free index matching glue.

ASLV light-emitting devices using a compound extractor (as described above in connection with FIGS. 39-40) may be more efficient than light-emitting devices using conventional designs. ASLV designs may avoid scattering 50% or more of the light (e.g., blue and the other colors) back into the LED chips with its losses related to extraction efficiency. In the Weierstrass shell geometry of an ASLV light-emitting device (as described above in connection with FIG. 2A, for instance) practically all of the backscattered light is reflected back into the scattering element with one and only one reflection. Only a small fraction of around 10% (depending on geometry) of the back-scattered light hits the chip or other package related surfaces with a chance of getting absorbed.

Further, ASLV light-emitting devices using a compound extractor (as described above in connection with FIGS. 39-40) may be smaller than light-emitting devices using conventional designs. The radius of the ASLV recovery enclosure may be as small as 5 mm for a Rebel type lamp containing a 1×1 $mm^2$ chip or as small as 8 mm for a 3×3 $mm^2$ chip array. Depending on the design of the center extractor alignment mechanism, the thickness of the lateral light guide or side extractor could be as small as cavity radius plus 2 mm.

Furthermore, ASLV light-emitting devices using a compound extractor (as described above in connection with FIGS. 39-40) may be more modular than light-emitting devices using conventional designs. While a one chip 1×1 $mm^2$ can be used in 100-500 lm applications, depending on life expectancy, a 3×3 mm² array can serve 2-3 klm applications. In addition multiple ASLV devices can be used in one- or two-dimensional arrays to meet the design demands for a large variety of applications.

In addition, ASLV light-emitting devices using a compound extractor (as described above in connection with FIGS. 39-40) may have more design flexibility than light-emitting devices using conventional designs. With a cross sectional source area of 25-64 mm² and a well-behaved and predictable radiation pattern in the range of 3-6° sr, one has a lot of flexibility in designing an intensity distribution pattern for a variety of applications.

Moreover, ASLV light-emitting devices using a compound extractor (as described above in connection with FIGS. 39-40) may have lower cost than light-emitting devices using conventional designs. The cost of a lighting system (w/o installation) is determined, generally, by (a) source cost, (b) voltage converter or ballast, (c) precision required for components and their assembly and (d) by the size and weight of the final enclosure. The combination of LED sources with the ASLV-based spectrally independent intensity distribution, gives one a low cost solution for (a) and (c). The low power consumption of LEDs are expected to eventually result in the lowest cost for (b). The final enclosure (d) may still have to be as big as for conventional lighting for reasons of glare control, but the superior internal control of intensity distribution may make enclosure specifications less critical and, therefore, significantly cheaper and result in a better intensity distribution control.

Currently, linear fluorescent tubes are widely used for general illumination of indoor spaces. Any efficient SSL source that can imitate or improve the intensity distribution of these tubes is of great interest to the lighting industry.

While many of the foregoing embodiments are rotationally symmetric about an axis, e.g., the z-axis, other configurations are also possible. For example, ASLV light-emitting devices incorporating features of above-described embodiments may be ASLV light-emitting devices that are elongated along the y-axis. Hence, rather than an x-z cross-section of a device being rotationally-invariant, the x-z cross-section of an extended device can be translationally invariant in the direction of the extension, e.g., the direction of the y-axis.

Figure 42:
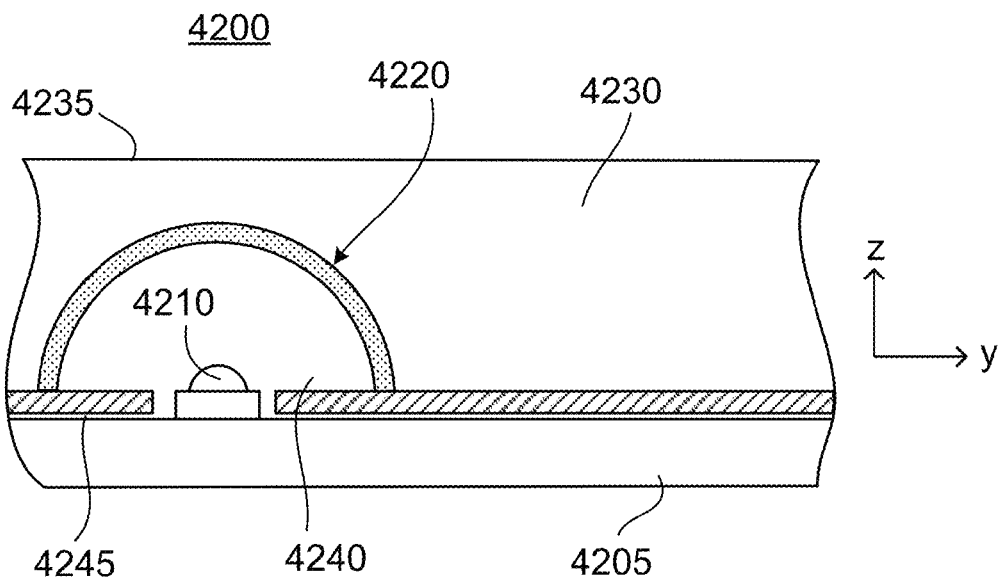
FIG. 42 shows an example of a light-emitting device having multiple rotationally symmetric scattering elements and a common, elongated extractor element.

As discussed previously, elongated embodiments of ASLV light-emitting devices are also contemplated. For example, ASLV light-emitting devices incorporating features of above-described embodiments having the form factor of a conventional fluorescent tube are possible. FIG. 42 shows an example of an elongated ASLV light-emitting device 4200 having multiple scattering elements 4220 with rotational symmetry around the z-axis and a common, elongated extractor element 4230. In this example, the extractor element 4230 is composed of a semi-cylindrical rod with indentations 4240 for each single or cluster of LEDs 4210. The semi-spherical indentations 4240 with the scattering element 4220 on the inside and air gap 4240 between phosphor and LED, represents a hybrid ASLV device. In the radial plane x-z, the hybrid ASLV device works just like the ASLV device described above in connection with FIG. 2A. In this manner, most light propagating through the hybrid ASLV device is transmitted on first pass in the x-z plane.

In the longitudinal direction (along the y-axis) a large fraction of the scattered light from the scattering element 4220 can be trapped in the extractor element 4230 as wave-guided modes. To convert these wave-guide modes into escape modes, a reflector 4245 on the backside of the semi-cylindrical rod is configured to have a significant degree of diffusivity, i.e. 10-50%. For example, commercially available reflectors can maintain a 97% reflectivity from 12-82% diffusivity. With the proper choice of diffusivity, one can find a design with not more than 3-5 reflections on the backside reflector 4205 of the semi-cylindrical extractor 4230. Such an ASLV light-emitting device 4200 with a forward biased angular distribution (in the z-direction) can be superior to the luminaire losses based on omnidirectional fluorescent tubes.

Figure 43:
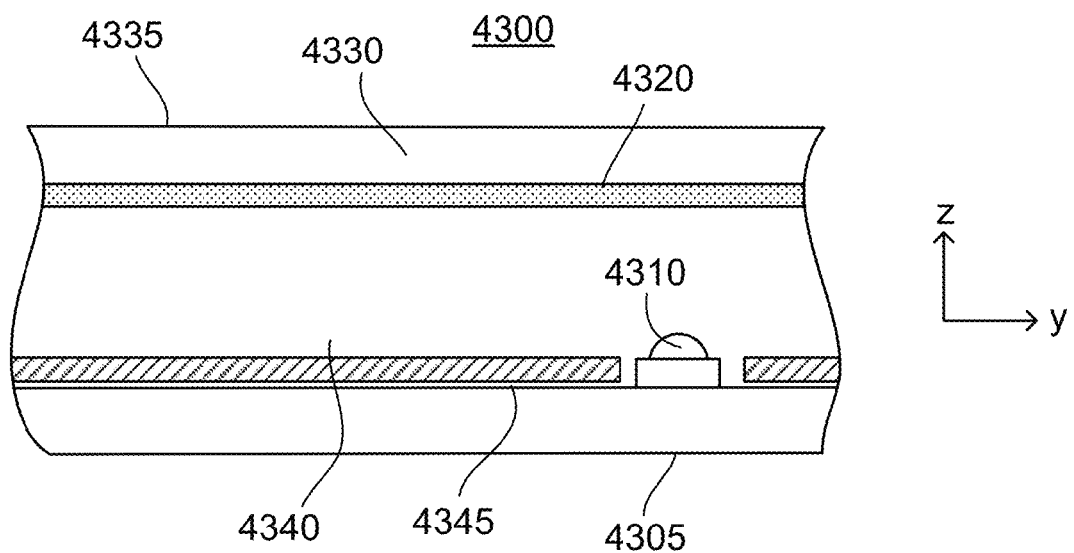
FIG. 43 shows an example of a light-emitting device having an elongated scattering element and an elongated extractor element.

FIG. 43 shows an ASLV light-emitting device 4300 having an elongated scattering element 4320 and an elongated extractor element 4330. In this example, the extractor element 4330 is composed of a semi-cylindrical shell with phosphor coverage (that forms the elongated scattering element 4320) on the inside over the entire length of the ASLV light-emitting device 4300. The same mode conversion issue in the longitudinal direction (along the y-axis) that is encountered in the ASLV light-emitting device 4200 also is present in the ASLV light-emitting device 4300. However, with a reflectivity of 97-98% and an available range of diffusivity from 5-82%, it is believed that superior performance to the omnidirectional linear tubes is achievable.

In order to avoid bending of the semi-cylindrical rod/shell both during extrusion/molding and over the temperature range seen during operation, the ASLV light-emitting device 4300 can be fabricated four 1 ft pieces, for instance, that are mounted onto a stiff extruded 4 ft heat sink (e.g., fabricated from Al) covering the entire length of the light-emitting device 4300.

The phosphor consumption of for the ASLV light-emitting device 4200 relative to the ASLV light-emitting device 4300 is lower by the ratio of s/2R, where s denotes the distance between LEDs or LED clusters, and R denotes the inside radius of indentation/grove (4240/4340).

Linear light uniformity of a 3600 lm tube can be achieved with 4-6 elements per linear foot, such that the LED spacing is between 3 and 4 inches. In this manner, 150-225 lm per LEDs or LED cluster is needed. At today's performance, the above spec can be achieved with 2W commercially available LED pumps.

In some embodiments, it may be beneficial to reduce (e.g., minimize) the re-entry of photons from the extractor 4330 back into the scattering element 4320. In the ASLV light-emitting device 4300, for example, a photon propagating in the longitudinal direction (along the y-axis) within the extractor element 4330 has a very high probability to be TIR back into the scattering element 4320 if this scattering element 4320 covers a cylindrical surface along the entire length of the tube 4330. In the ASLV light-emitting device 4200, the scattering element 4220' at the next LED position is relatively far away relative to a scattering element 4220 of a given LED position, and hence, a longitudinal photon originating at the scattering element 4220 of the given LED has a good chance to be kicked out of the tube 4230 before reaching the next LED position. Therefore, the ASLV light-emitting device 4200 may have lower phosphor related losses than the ASLV light-emitting device 4300.

If light originated at the scattering element 4320 in the ASLV light-emitting device 4300 undergoes several TIR reflections back into the phosphor element 4330, then it will be depleted of blue photons and the spectral composition of the light will change towards a lower CCT with distance from the blue pump in the longitudinal direction (along the y-axis). This CCT change may not amount to much when the LED spacing is short, i.e. 1-2 times the outer diameter of the cylindrical extractor element 4330. But it could become an issue when a small number of power-LEDs are used with 6 or more inch separation. Accordingly, in embodiments that feature LED separation of about 6 inches or more, it may be beneficial to compensate for spectral variation along the length of the ASLV light-emitting device 4300 (e.g., by varying the composition of the extractor element 4330 along its length and/or by introducing additional sources of diffusion into the ASLV light-emitting device 4300).

Other embodiments are in the following claims.

What is claimed is:

1. A light-emitting device, comprising:
    multiple light-emitting elements including
        a first light-emitting element configured to provide light having a first spectral power distribution during operation, and
        a second light-emitting element configured to provide light having a second spectral power distribution different from the first spectral power distribution during operation;
    a first optical element having a first surface spaced apart from the first and second light-emitting elements and positioned to receive light from the first and second light-emitting elements, the first optical element comprising
        a plurality of inelastic scattering centers arranged to convert the light from the first light-emitting element into converted light that is substantially isotropically scattered, and
        a plurality of elastic scattering centers arranged to substantially isotropically scatter the light from the second light-emitting element, and provide mixed light comprising the scattered light from the second light-emitting element and the converted light, the mixed light having a mixed spectral power distribution; and
    a second optical element formed from a transparent material having an exit surface, the second optical element being in contact with the first optical element, there being an optical interface between the first and second optical elements at a place of contact, the optical interface being opposite the first surface of the first optical element, the second optical element being arranged to receive a portion of the mixed light through the optical interface; wherein:
    the light-emitting device comprises a medium adjacent the first surface of the first optical element having a refractive index no, and the first optical element comprises a material having a first refractive index $n_1$, where $n_0 < n_1$;
    the transparent material has a refractive index, $n_2$, where $n_0 < n_2$;
    the exit surface being a transparent surface that is shaped such that an angle of incidence on the exit surface of the mixed light provided by the first optical element that directly impinges on the exit surface is less than a critical angle for total internal reflection; and
    the light-emitting device outputs a predetermined portion of the mixed light through the exit surface.

2. The light-emitting device of claim 1, wherein the first optical element is a shell that defines an enclosure into which light from the light-emitting elements is emitted, wherein the shell is shaped such that at least some light from the first surface directly propagates through the enclosure to the first surface.

3. The light-emitting device of claim 2, wherein the shell has a concave shape with respect to the enclosure.

4. The light-emitting device of claim 3, wherein the shell has an ellipsoidal shape.

5. The light-emitting device of claim 4, wherein the ellipsoidal shape is prolate or oblate.

6. The light-emitting device of claim 5, wherein the ellipsoidal shape is triaxial.

7. The light-emitting device of claim 1 further comprising a reflector having a reflective surface, the reflective surface and the first surface together defining an enclosure into which all light from the light-emitting elements is emitted.

8. The light-emitting device of claim 7, wherein the reflective surface is planar.

9. The light-emitting device of claim 7, wherein the first surface is planar.

10. The light-emitting device of claim 7, wherein the first surface is convex with respect to the enclosure.

11. The light-emitting device of claim 7, wherein the reflective surface comprises specular reflective portions.

12. The light-emitting device of claim 7, wherein the reflective surface comprises diffuse reflective portions.

13. The light-emitting device of claim 7, wherein the reflective surface is configured to direct light from the light-emitting elements towards the first surface.

14. The light-emitting device of claim 1 further comprising a third element formed from a transparent material positioned between the light-emitting elements and the first surface to receive light from the light-emitting elements and provide light to the first surface.

15. The light-emitting device of claim 1, further comprising a sensor arranged to receive a fraction of the portion of the mixed light prior to being output through the exit surface, the sensor configured to provide a sensor signal based on the fraction of the portion of the mixed light; and
    a control circuit in communication with the sensor configured to control power provided to the light-emitting elements in response to the sensor signal.

16. The light-emitting device of claim 1, wherein the second optical element comprises a first portion and a light guide, the first portion having the exit surface and being arranged to receive a first portion of the mixed light from the optical interface, and the light guide being arranged to receive a second portion of the mixed light from the optical interface and having a guiding surface configured to guide the received second portion of the mixed light away from the optical interface by reflecting at least some of the received second portion of the mixed light.

17. The light-emitting device of claim 1, wherein the exit surface comprises a first exit surface and a second exit surface, the first and second exit surfaces being at least partially transparent, and a step arranged between the first and second exit surfaces.

18. The light-emitting device of claim 1, wherein the exit surface is shaped such that an angle of incidence on the exit surface of the mixed light that directly impinges on the exit surface is less than the Brewster angle.

19. The light-emitting device of claim 1, wherein, for a cross-section, each point, p, on the exit surface has a corresponding radius of curvature, R(p), and the first and second optical elements are arranged so that each point on the optical interface is at least a corresponding distance, d(p), from the exit surface, where $$d(p) = R(p) * (1 - k/n_2),$$

and k is a positive real number such that $k < n_2$.

20. The light-emitting device of claim 19, wherein $k/n_2 < 0.8$.

21. The light-emitting device of claim 19, wherein k<1.

22. The light-emitting device of claim 19, wherein each point on the optical interface is the distance d(p) from the corresponding nearest point on the exit surface.

23. The light-emitting device of claim 1, wherein an axis of symmetry of the first optical element and an axis of symmetry of the second optical element are collinear.

24. The light-emitting device of claim 23, wherein the first and second light-emitting elements are positioned symmetrically about the axis of symmetry of the first optical element.

25. The light-emitting device of claim 1, wherein the inelastic scattering centers comprise a light-conversion material.

* * * * *